United States Patent
Kamiyama et al.

(10) Patent No.: US 7,982,380 B2
(45) Date of Patent: Jul. 19, 2011

(54) FRONT FILTER FOR PLASMA DISPLAY AND PLASMA DISPLAY

(75) Inventors: Hironori Kamiyama, Tokyo-to (JP); Nobuo Naitou, Tokyo-to (JP); Yukimitsu Iwata, Tokyo-to (JP); Yoshihiro Nishimura, Tokyo-to (JP); Shinnichi Katou, Tokyo-to (JP); Akiko Gotou, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 127 days.

(21) Appl. No.: 12/377,153

(22) PCT Filed: Aug. 10, 2007

(86) PCT No.: PCT/JP2007/065762
§ 371 (c)(1),
(2), (4) Date: Feb. 11, 2009

(87) PCT Pub. No.: WO2008/020578
PCT Pub. Date: Feb. 21, 2008

(65) Prior Publication Data
US 2010/0177397 A1    Jul. 15, 2010

(30) Foreign Application Priority Data

Aug. 18, 2006   (JP) ................... 2006-223308
Aug. 18, 2006   (JP) ................... 2006-223309
Jun. 7, 2007    (JP) ................... 2007-151845
Jun. 29, 2007   (JP) ................... 2007-172071

(51) Int. Cl.
*B32B 27/36* (2006.01)
*B32B 33/00* (2006.01)

(52) U.S. Cl. ............ 313/111; 313/116; 359/601
(58) Field of Classification Search .......... 359/601; 313/112, 113, 111, 116
See application file for complete search history.

(56) References Cited

U.S. PATENT DOCUMENTS

| | | | |
|---|---|---|---|
| 6,696,140 B2* | 2/2004 | Suzuki | 428/212 |
| 7,122,958 B2* | 10/2006 | Utsumi et al. | 313/506 |
| 2005/0017620 A1* | 1/2005 | Kim et al. | 313/112 |
| 2006/0134426 A1* | 6/2006 | Horio et al. | 428/411.1 |
| 2007/0247710 A1* | 10/2007 | Nakashima et al. | 359/485 |
| 2010/0091374 A1* | 4/2010 | Iwata et al. | 359/599 |

FOREIGN PATENT DOCUMENTS

JP   09-193333 A   7/1997

(Continued)

OTHER PUBLICATIONS

International Search Report: PCT/JP2007/065762.

*Primary Examiner* — Mark Consilvio
(74) *Attorney, Agent, or Firm* — Ladas & Parry LLP

(57) ABSTRACT

A front filter for a plasma display that is mainly used as a TV display. The front filter has an anti-glare function which is capable of effectively preventing reflection concurrently with achieving black color reproduction, and a functional layer for imparting a function required of an image display device such as a light absorbing function and/or an adhesion function. This front filter has an anti-glare layer having a concavo-convex shape on an outermost surface thereof, a polyester film and a functional layer. The anti-glare layer is disposed on the observer-side surface of the front filter; at least one functional layer is disposed on the display device side.

12 Claims, 10 Drawing Sheets

FOREIGN PATENT DOCUMENTS

| | | | | |
|---|---|---|---|---|
| JP | 2002271086 A | * | 9/2002 | |
| JP | 2002-311843 A | | 10/2002 | |
| JP | 2002-323861 A | | 11/2002 | |
| JP | 2003-248101 A | | 9/2003 | |
| JP | 2003-248110 A | | 9/2003 | |
| JP | 2004157542 A | * | 6/2004 | |
| JP | 2004-341070 A | | 12/2004 | |
| JP | 2004-361525 A | | 12/2004 | |
| JP | 2005-316415 A | | 11/2005 | |
| WO | WO 2004066342 A1 | * | 8/2004 | |

* cited by examiner

[FIG. 1]
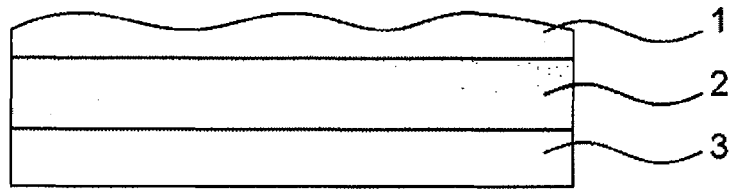
[FIG. 2]
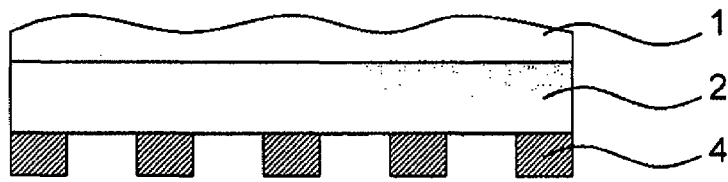
[FIG. 3]
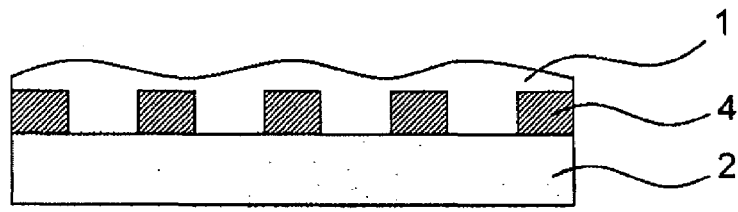
[FIG. 4]
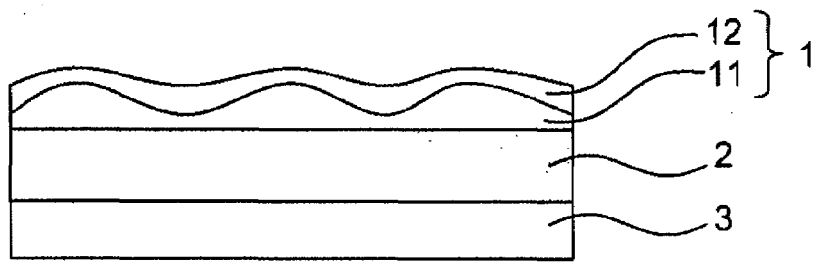
[FIG. 5]
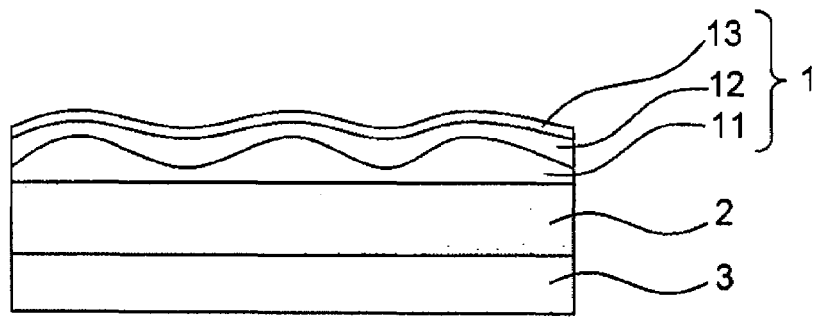

[FIG. 6]
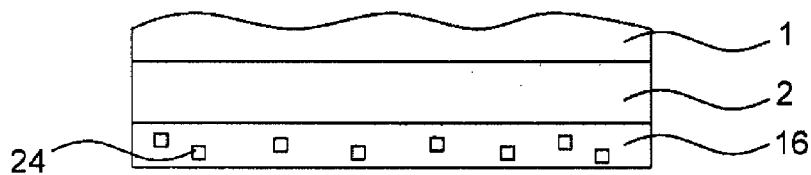
[FIG. 7]
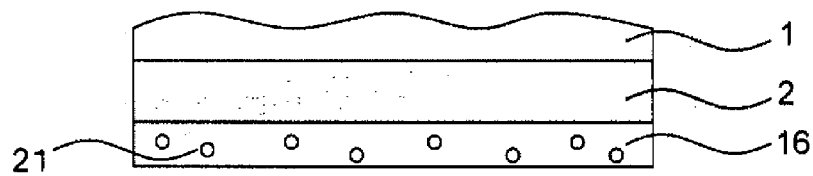
[FIG. 8]
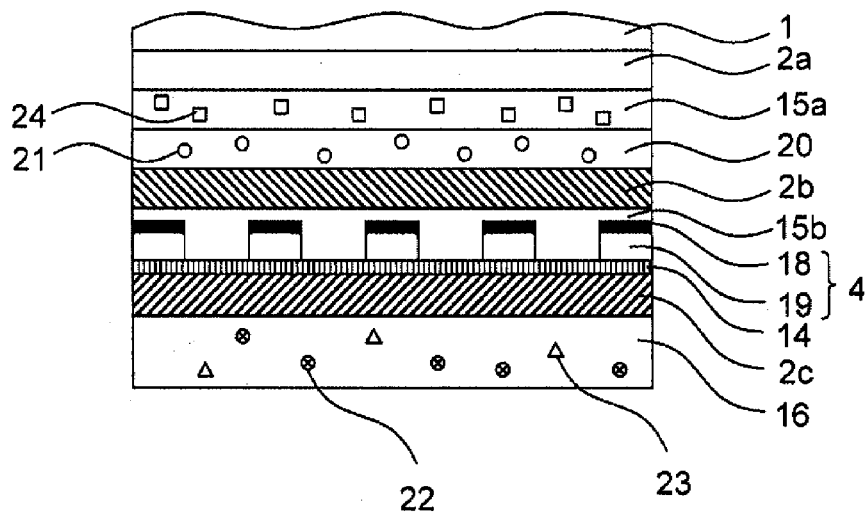
[FIG. 9]
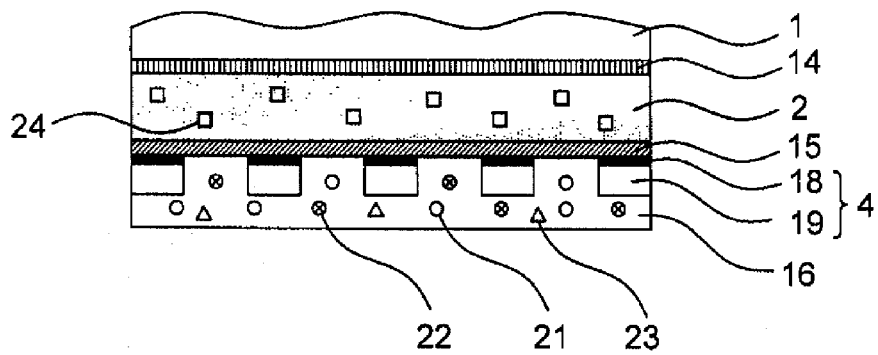

[FIG. 10]
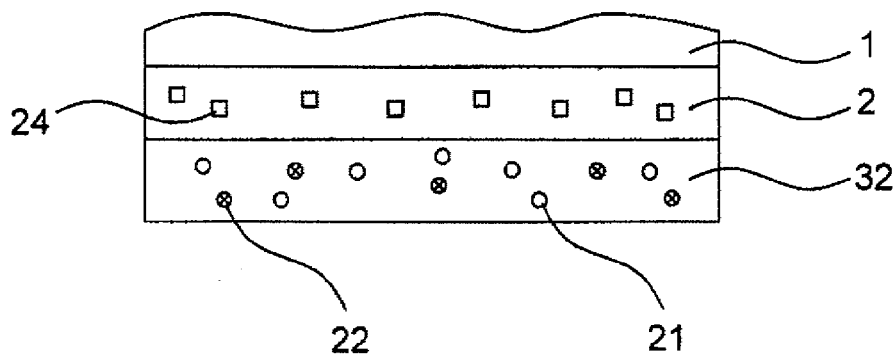
[FIG. 11]
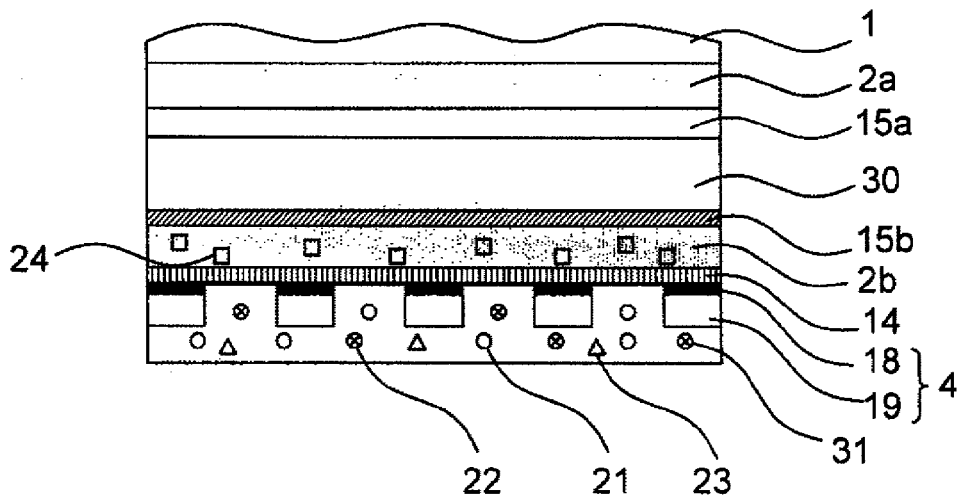
[FIG. 12]
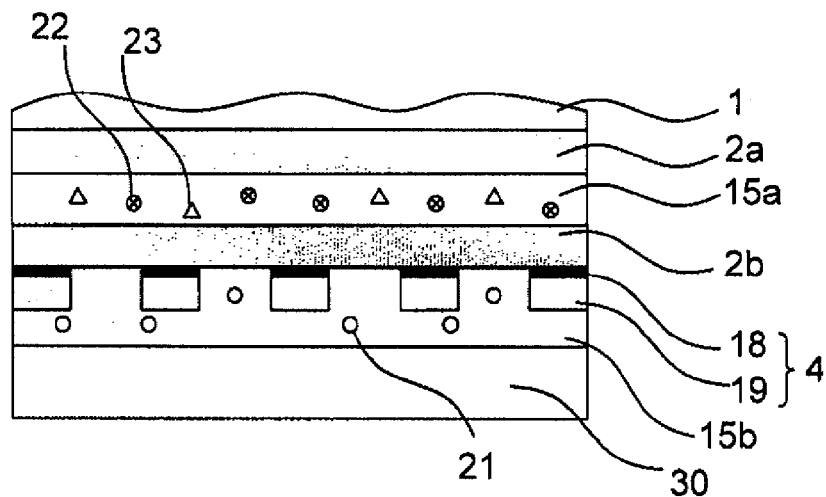

[FIG. 13]
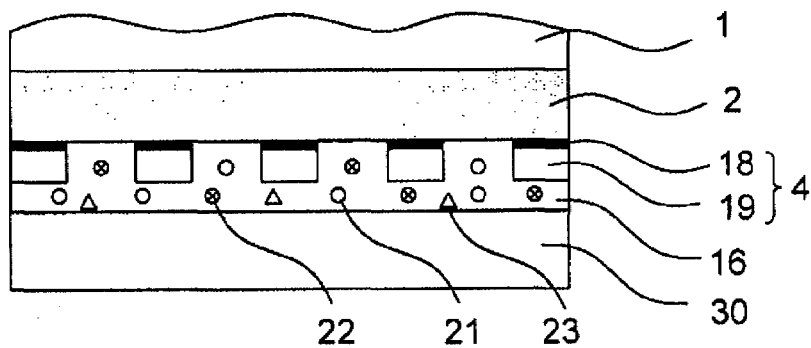
[FIG. 14]
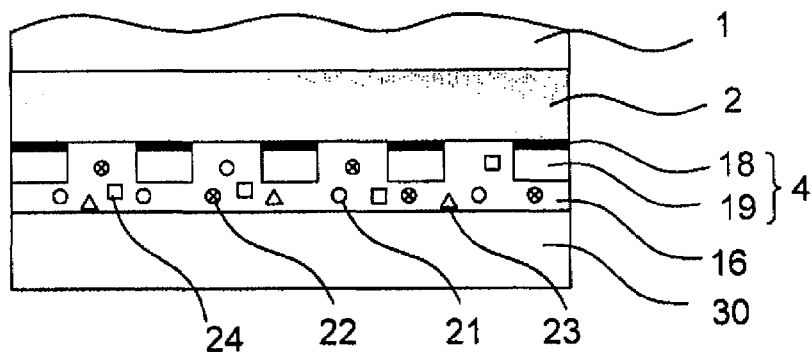
[FIG. 15]
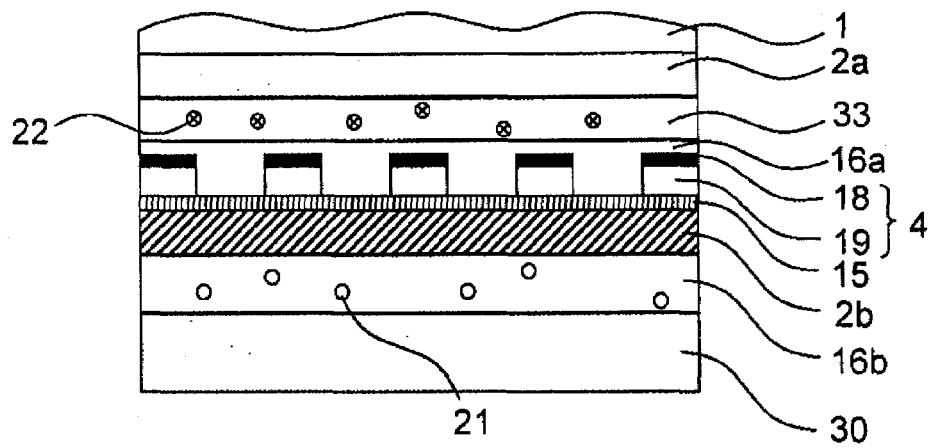

[FIG. 16]
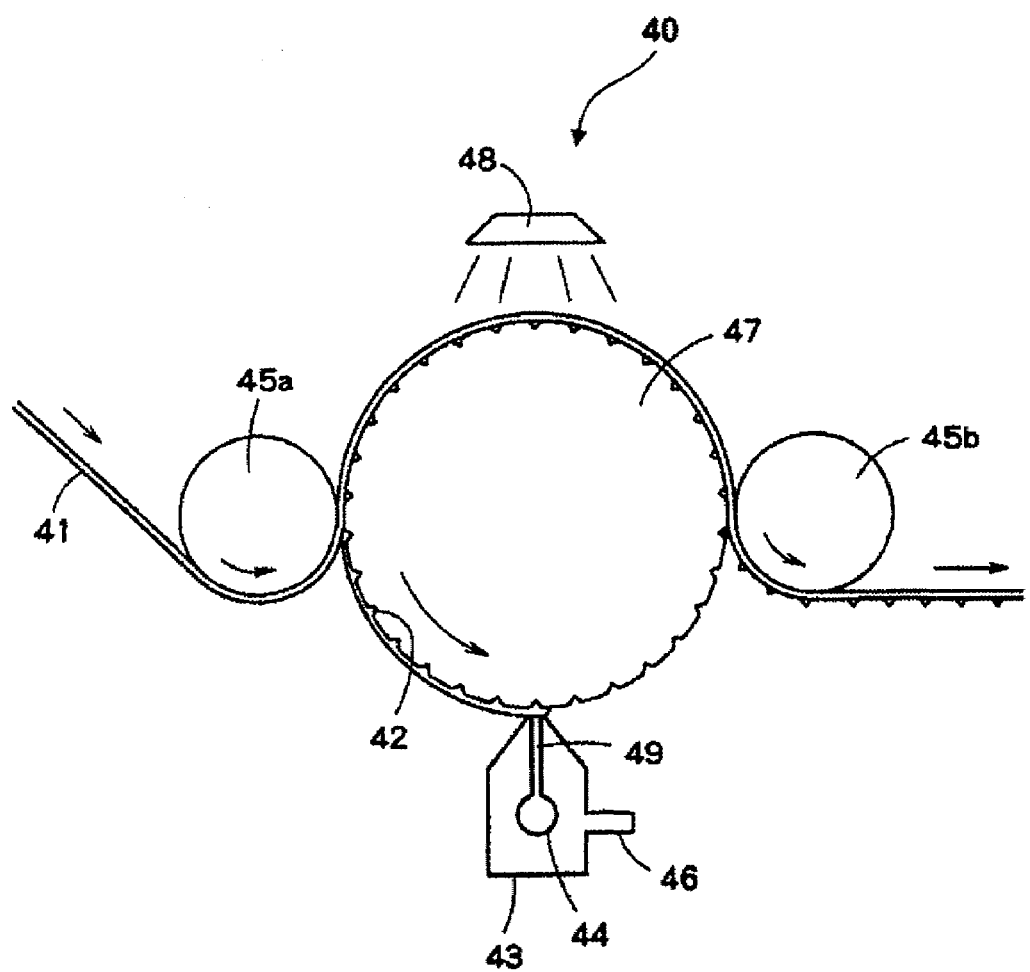

[FIG. 17]
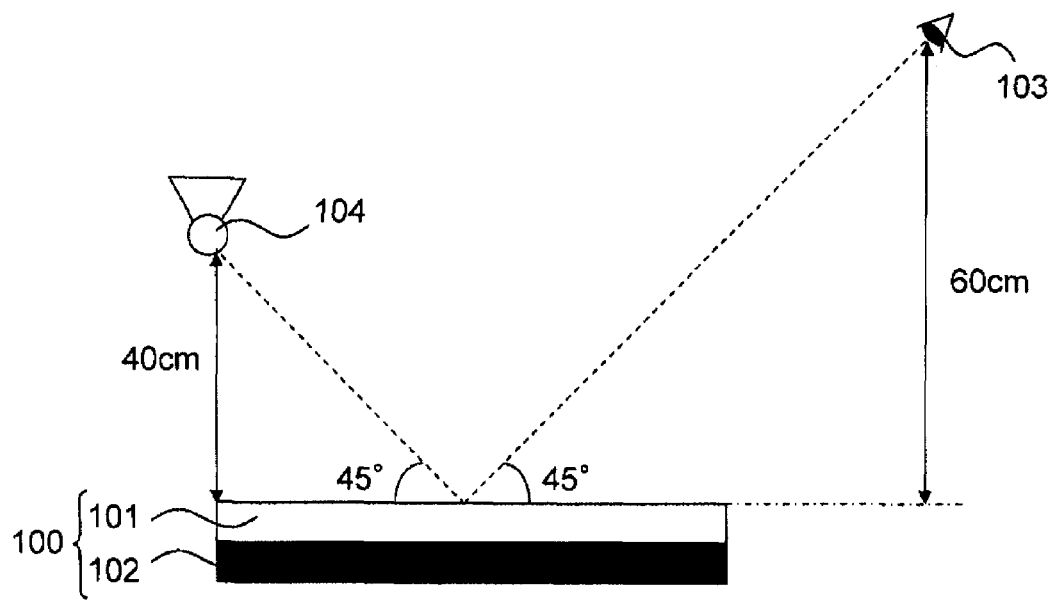
[FIG. 18]
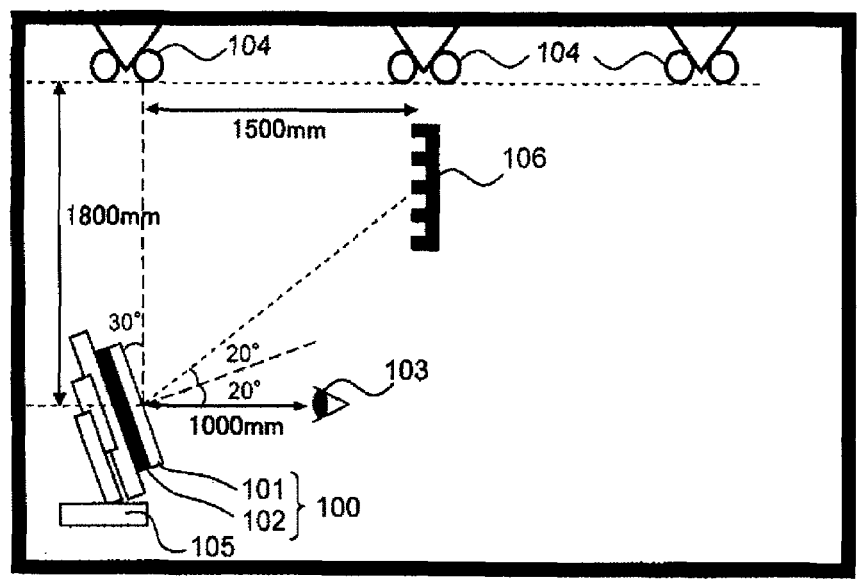

[FIG. 19]
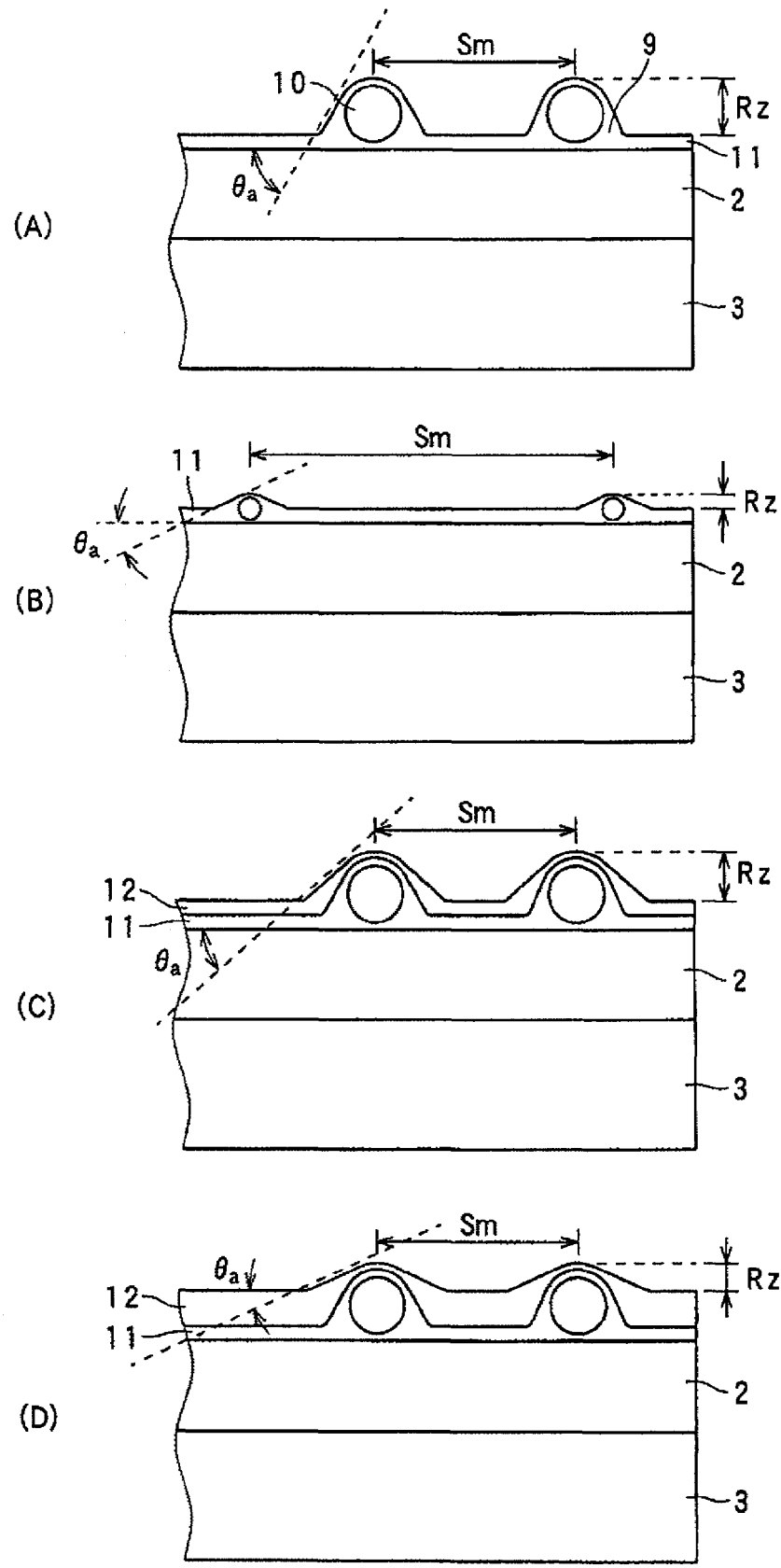

[FIG. 20]
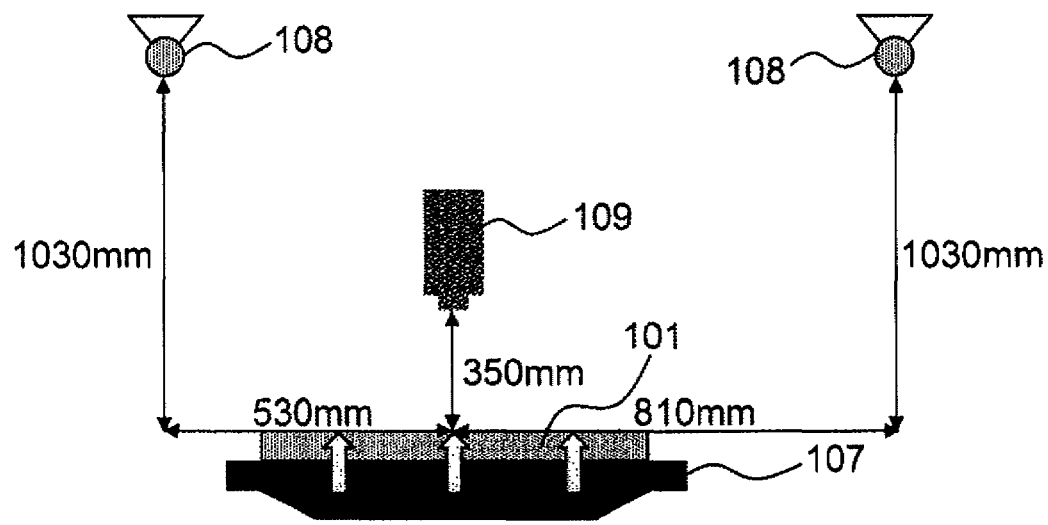
[FIG. 21]
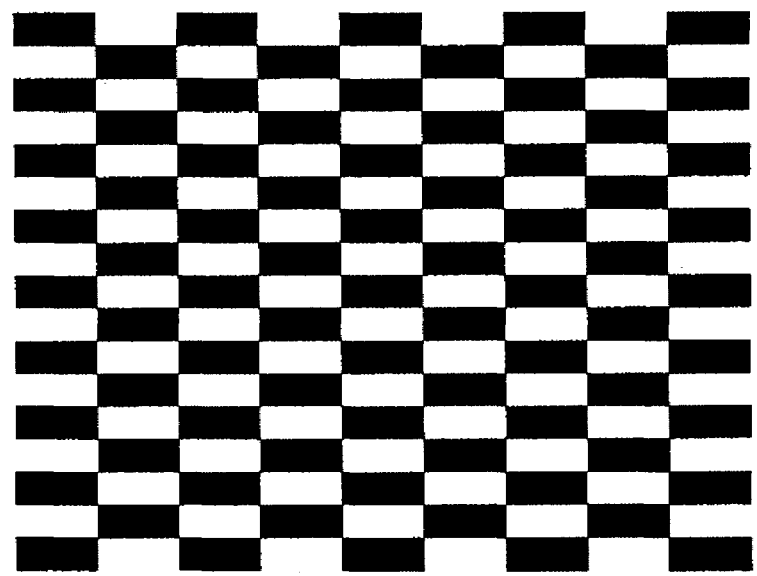

[FIG. 22]
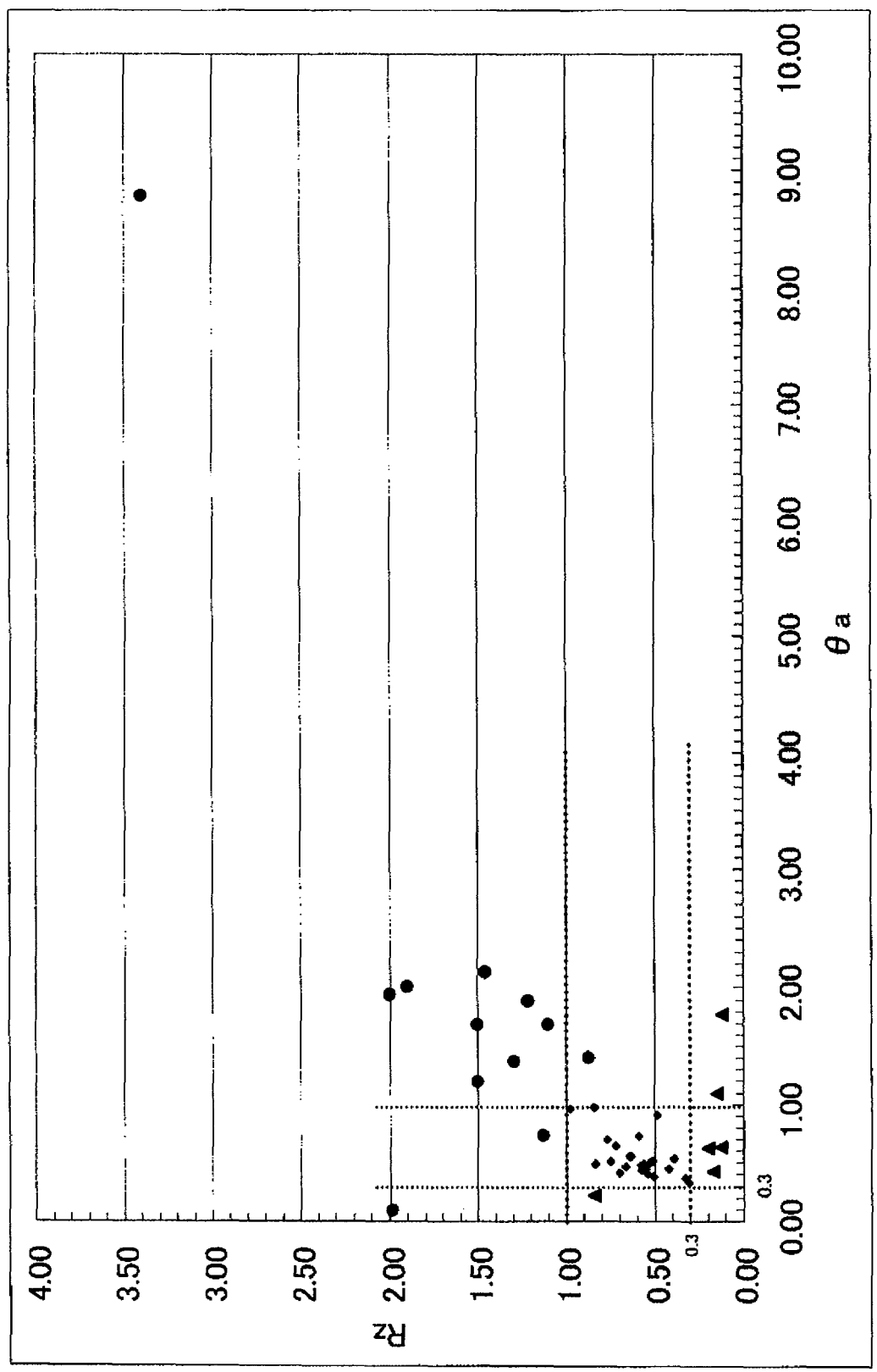

[FIG. 23]
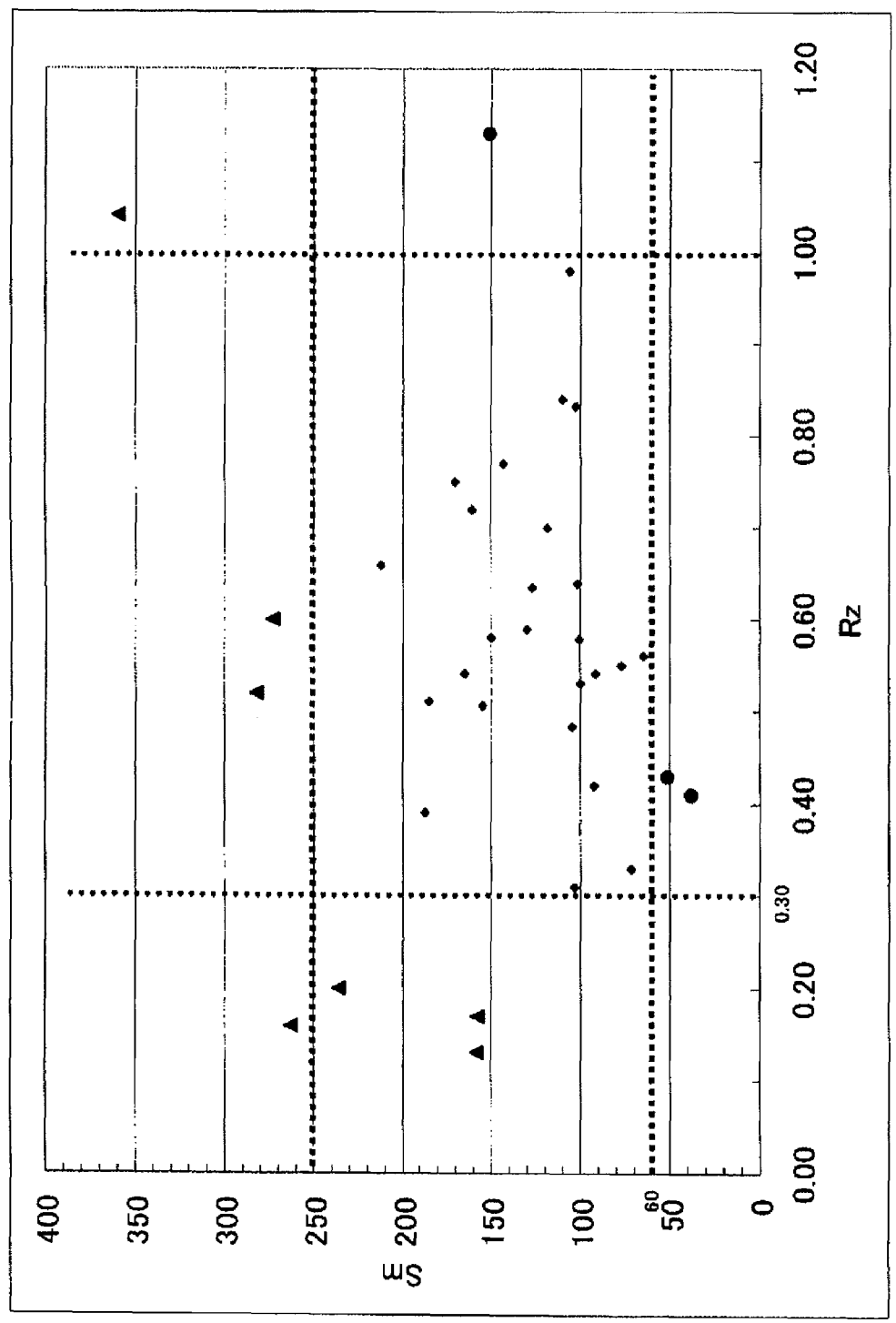

FRONT FILTER FOR PLASMA DISPLAY AND PLASMA DISPLAY

TECHNICAL FIELD

The present invention relates to a front filter for a plasma display comprising an anti-glare laminate and an optical filter, which laminate has high production efficiency and can provide anti-glare performance, high image contrast in a bright room (bright room contrast) and prevention of whitening of a black image, which have been almost incompatible with each other. The present invention also relates to a plasma display using the same.

BACKGROUND ART

The prevention of lowered image contrast and lowered visibility, that are caused by the reflection of external light from the sun or lighting equipment falling on a screen or by image reflection, is required of image display devices such as cathode-ray tube display devices (CRTs), plasma displays (PDPs), electroluminescent displays (ELDs) and liquid crystal displays (LCDs). Accordingly, it is common practice to provide an anti-specular reflection laminate on the outermost surface of an image display device from the viewpoint of reducing image reflection or reflectance using the principle of light scattering or the principle of optical interference.

As one of anti-specular reflection laminates, providing an anti-glare laminate on the surface of image display devices has hitherto been known as a method for regulating optical properties to realize excellent image displays. This method utilizes diffuse reflection of external light to decrease a specular reflection component, and has been mainly used for liquid crystal displays for personal computers. The anti-glare laminate is utilized for preventing a lowering in visibility as a result of specular reflection of external light or image reflection within image display devices. The anti-glare laminate is produced as having an anti-glare layer provided with various particles on a surface thereof, or as having an anti-glare layer having a concavo-convex shape formed by embossing (Patent Document 1).

On the other hand, display devices for TV sets (such as large screen liquid crystal displays and PDPs that are also used as TV sets, and especially large screen display devices for TV sets) are required to eliminate adverse affects caused by the reflection of external light or image reflection for improving visibility. Simultaneously, such devices are required to have excellent visibility in displaying highly entertaining images (e.g. movies and full-color images), such as high contrast and black color reproduction, especially wet glossy black color (glossy black feeling). Moreover, as for expression of black gradations in a bright room, especially in the low gradation region, it is required that the difference in black gradations is easily discernible and sensitivity is high. TV displays are often larger than personal computer displays and the installation position is commonly fixed to use, so that they are required to satisfy these properties regardless of the positions where they are fixed.

The purpose of conventional anti-glare laminates for personal computers is focused on providing appropriate visibility for office use, and such anti-glare laminates are excellent in the effect of reducing external light reflection or image reflection. However, when such anti-glare laminates are used on TV displays, black color reproduction including glossy black feeling in on-screen display, contrast and the like have sometimes been poor. Specifically, in the recognition of black and gray colors, such colors are sometimes recognized as a blurred, single-tone black color.

On the other hand, there is a growing demand for a higher level definition of panel resolution. The demand for a higher level definition of panel resolution can be satisfied by increasing the fineness of the concavo-convex shape of the anti-glare layer. However, when increasing the fineness of the concavo-convex shape of the anti-glare layer, it has often been pointed out that external light is reflected from the display surface resulting in such a phenomenon that, for example, the image display surface is seen white (whitening), or lowered contrast. Whitening of the image display surface leads to a decrease in color reproduction (particularly black color reproduction) or a decrease in contrast, both of which are problematic for TV displays that are required to show beautiful still images and movies.

In the case of using the anti-glare laminate on the liquid crystal image display surface of laptop computers and the like, when the light transmitted through the backside of backlight within a display is transmitted through the concavo-convex shaped surface of the anti-glare laminate formed on the outermost surface of the panel, the concavo-convex shape functions as fine lenses which disturb the displayed pixels and the like, that is, "glare" is likely to occur. This unfavorable phenomenon makes it difficult to attain the effect of the anti-glare laminate per se. In particular, the occurrence of the "glare" increases with increasing the definition of panel resolution, and it has thus been desired to effectively prevent this unfavorable phenomenon.

In order to eliminate this "glare", for example, a method has been adopted in which surface concavoconvexes are densely and finely provided and, at the same time, scattering particles different in refractive index from the resin for forming the anti-glare layer are added to impart an internal scattering effect to the anti-glare laminate. Such methods could satisfactorily solve the problem of the "glare", but on the other hand, they sometimes brought about surface whitening resulted from the increase in fineness of the concavoconvexes, or clouding caused by internal scattering effect or the like, resulting in a deterioration in black color reproduction and image contrast, and thus in lowered image visibility.

To the contrary, when an anti-glare layer is excluded to provide a smooth surface to an anti-specular reflection laminate, glossy black feeling can be reproduced; however, no reflection prevention can be achieved.

Accordingly, there is a high demand for developing an anti-specular reflection laminate that is capable of not only preventing the reflection of external light or images effectively but also achieving black color reproduction (especially glossy black feeling) and is particularly suitable for TV applications, in which displaying highly entertaining images is required and a constraint is imposed that the place to put a TV set is fixed and thus the degree of freedom in selecting the place is limited.

Further, a near-infrared ray (hereinafter abbreviated as NIR) emitted from the front surface of a plasma display at a wavelength from 800 to 1,100 nm can cause other devices such as a VTR to malfunction. Thus, to shield near-infrared rays, front filters are required to be imparted with an NIR absorbing function. Also, front filters may be required to have a function for shielding neon light, which is emitted from the front surface of a plasma display at a wavelength from 550 to 640 nm, or a function for shielding unnecessary various kinds of light, which are emitted from various kinds of displays at specific wavelengths.

Plasma display panels (hereinafter abbreviated as PDPs) use plasma discharge and produce unwanted electromagnetic waves in the frequency range from 30 MHz to 1 GHz. Thus, to prevent other devices (such as information-processing devices) from damage, a transparent electrical conductor sheet such as a conductive mesh sheet is normally provided on the front surface of a display as a front panel, in addition to the above functions, so as not to emit unwanted electromagnetic waves to the outside as much as possible.

In order to achieve the above-mentioned functions with as few layers as possible, it has been studied to use a plate-shaped composite filter as a front panel of a plasma display panel, in which an electromagnetic shielding sheet and optically functional layers such as a near-infrared absorbing layer, anti-specular reflection layer and anti-glare layer are stacked to shield unwanted electromagnetic waves emitted from an image display device and light at a specific wavelength and to impart various functions required of an image display device (Patent Document 2).

Patent Document 1: Japanese Patent Application Laid-Open (JP-A) No. 2004-341070
Patent Document 2: JP-A No. 2002-311843

DISCLOSURE OF THE INVENTION

Problems to be Solved by the Invention

When an anti-glare layer having a concavo-convex shape, which has been used in a personal computer display comprising a LCD, is applied as it is to a front filter for a plasma display, the fine concavo-convex shape on the surface of the anti-glare layer reflects incident external light in all directions (diffuse reflection) and the light reaches the eyes of an observer, thereby posing problems of whitened and poorly reproduced black image and insufficient image contrast in a bright environment. This is because, in the case of a LCD, an anti-glare layer is designed to impart light diffusivity to transmitted light emitted from an image, and is not designed in consideration of light diffusivity of reflected light from external light. More specifically, in a LCD, a percentage of incident external light is absorbed by a polarizer, reflection by pixels is small, and whitening of a black image is basically unlikely to occur. Therefore, it is rather necessary to impart light diffusivity of transmitted light from an image for reducing image glare, which is characteristic of an image on liquid crystal display. On the other hand, in a plasma display, there is no external light absorbing effect by a polarizer. In addition, due to external light reflectivity on the surface of a fluorescent substance, a plasma display has lower contrast in a bright environment than a liquid crystal display, and a black image is likely to be whitened. Further, a conventional anti-glare layer diffuses both transmitted light and reflected light together. Anti-glare properties are still good even when such an anti-glare layer for a LCD is used with a PDP; however, whitening of a black image and a decrease in bright room contrast are also caused. If light diffusivity is decreased, whitening of a black image and a decrease in bright room contrast are improved; however, specular reflection of external light is increased and thus anti-glare properties are lowered.

An object of the present invention is to provide a front filter for a plasma display, having an anti-glare function which is capable of effectively preventing reflection concurrently with achieving black color reproduction (especially glossy black feeling without whitening) and improving image contrast in a bright environment, and a function for imparting a function or functions required of a plasma display, such as a light absorbing function, an electromagnetic shielding function and/or an adhesion function.

Means for Solving the Problem

As the result of diligent studies made to attain the above object, the inventors of the present invention found out a knowledge that an anti-glare layer having a specific concavo-convex shape can effectively prevent refection and exhibit sufficient anti-glare properties concurrently with achieving glossy black feeling and high image contrast in a bright environment, which have been hardly compatible with each other. Based on this knowledge, the inventors of the present invention completed the present invention.

That is, the front filter for a plasma display according to the present invention is a front filter for a plasma display comprising an anti-glare layer having a concavo-convex shape on an outermost surface thereof, a polyester film and a functional layer, wherein the anti-glare layer is disposed on an observer-side surface of the front filter;

wherein the concavo-convex shape satisfies the following requirements:

"Sm" is from 60 μm or more and 250 μm or less;
"θa" is from 0.3 degree or more and 1.0 degree or less; and
"Rz" is from 0.3 μm or more and 1.0 μm or less, wherein "Sm" represents an average distance between concavoconvexes in the anti-glare layer; "θa" represents an average inclination angle of the concavoconvexes; and "Rz" represents a ten-point average roughness of the concavoconvexes.

When the shape of the outermost surface of an anti-glare layer satisfies these conditions, the concavo-convex shape of the surface is smoother and gentler than that of a conventionally used anti-glare layer. The specular reflection component of external light incident on a front filter having such a concavo-convex shape is appropriately and diffusely reflected at angles near the angle of specular reflection, so that the front filter having such a concavo-convex shape can maintain necessary anti-glare properties and, at the same time, minimize the diffusivity of image light transmitted through the anti-glare layer nearly in its normal direction. Therefore, such a front filter for a plasma display can remarkably improve black color reproduction which has been difficult to realize with conventional front filters, especially glossy black feeling, and can increase image contrast in a bright environment and anti-glare properties.

The front filter for a plasma display of the present invention uses a polyester film as a substrate thereof. A polyester film has higher heat resistance and mechanical strength compared to a cellulose triacetate (TAC) film generally used for LCDs, and is thus excellent in processability. Therefore, the front filter according to the present invention can be suitably used as a front filter for PDPs. Also, a polyester film has higher rigidity and smoothness than a TAC film; therefore, an anti-glare layer formed with a polyester film is imparted with higher pencil hardness than that of an anti-glare layer formed with a TAC film, and it is easy to obtain a front filter for a plasma display having a surface with high scratch resistance. Moreover, unlike LCDs, PDP substrates are not required to have optical isotropy; thus, biaxially oriented polyester films are usable as PDP substrates.

In the front filter for a plasma display of the present invention, the anti-glare layer preferably comprises a concavo-convex layer comprising a resin mixed with light transparent fine particles. This is because it is easy to regulate the "Sm", "θa" and "Rz" of concavoconvexes and it is thus easy to achieve the shape of concavoconvexes in an anti-glare layer which was specified in the present invention.

The front filter for a plasma display of the present invention may comprise a single layer of concavo-convex layer. Preferably, however, it has a laminated structure comprising two or more layers including a concavo-convex layer and a surface shape modifying layer disposed on the observer's side of the concavo-convex layer. When a surface shape modifying layer is present on the observer's side, the observer-side surface of the anti-glare layer can be imparted with a smooth, gentle and desired concavo-convex shape and various functions, even when the concavo-convex layer has a different concavo-convex shape from that of the anti-glare layer of the present invention, such as a concavo-convex shape with increased fineness or a concavo-convex shape with concavoconvexes having a large height difference.

In the front filter for a plasma display of the present invention, the anti-glare layer preferably has a laminated structure comprising two or more layers including a concavo-convex layer which comprises a resin mixed with light transparent fine particles and a surface shape modifying layer disposed on the observer's side of the concavo-convex layer, and the surface shape modifying layer preferably decreases "θa" and/or "Rz" of concavoconvexes on the surface of the concavo-convex layer, without changing "Sm" of the concavoconvexes.

It is preferable that a concavo-convex layer which comprises a resin mixed with light transparent fine particles is combined with a surface shape modifying layer disposed on the observer's side of the concavo-convex layer, and the surface shape modifying layer decreases "θa" and/or "Rz" of concavoconvexes on the surface of the concavo-convex layer, without changing "Sm" of the concavoconvexes. This is because it is easy to regulate "θa" and "Rz", which are difficult to be optimized concurrently with "Sm" within the specific range of the present invention, and especially it is easy to achieve the shape of concavoconvexes in an anti-glare layer which was specified in the present invention.

In the front filter for a plasma display of the present invention, the anti-glare layer may have a laminated structure comprising two or more layers including a concavo-convex layer and a low refractive index layer disposed on an observer-side outermost surface of the concavo-convex layer.

A surface shape modifying layer may also function as a low refractive index layer to impart anti-reflection performance to an anti-glare layer. Alternatively, a laminated structure comprising two or more layers including a low refractive index layer may be disposed on the surface shape modifying layer. In addition to the anti-layer properties, such a laminated structure is effective in decreasing the reflectivity of light reflected at all angles, due to the light interference effect in the multiple layers of the laminated structure. This low refractive index layer has a shape corresponding to the concavo-convex shape on the surface of the concavo-convex layer or surface shape modifying layer, which is a substrate of the low refractive index layer, and the concavo-convex shape on the surface of the low refractive index layer becomes equivalent to that on the surface of either of said two layers, which is the substrate, so as to have the concavo-convex surface shape specified in the present invention.

The surface shape modifying layer may comprise one or more kinds of function additional components selected from the group consisting of an anti-static agent, a refractive index modifier, an anti-fouling agent and a hardness modifier.

A thickness of the anti-glare layer is preferably from 5 μm or more and 25 μm or less. This is because physical properties such as hardness and scratch resistance can be excellent, as well as productivity.

A thickness of the polyester film is preferably from 20 to 250 μm in terms of ease of winding and processing.

The front filter for a plasma display of the present invention preferably comprises at least a transparent electrical conductor layer as the functional layer, so that, for example, electromagnetic leakage from the front surface of a plasma display can be effectively prevented.

In the front filter for a plasma display of the present invention, the transparent electrical conductor layer preferably comprises a mesh-shaped metal electrical conductor layer and a blackened layer formed on the observer's side thereof, or the transparent electrical conductor layer preferably comprises a mesh-shaped electrical conductor layer formed with an conductive black ink comprising a resin binder having dispersed therein electrical conductor particles and a black pigment, since the transparent electrical conductor layer can further provide a synergistic effect of improving image contrast in a bright environment when it is combined with the anti-glare layer.

The plasma display of the present invention has the front filter for a plasma display disposed on a display surface of the plasma display panel.

The plasma display of the present invention is capable of effectively preventing reflection concurrently with achieving glossy black feeling and improving the contrast in a bright environment. In addition, by virtue of the functions of the front filter, the plasma display of the present invention can effectively prevent electromagnetic leakage from the front surface of a plasma display, etc.

Effect of the Invention

According to the present invention, by imparting a shape satisfying specific requirements to the outermost surface of an anti-glare layer of a front filter for a plasma display, it is possible to provide a front filter for a plasma display, which is capable of effectively preventing reflection, concurrently with achieving glossy black feeling and improving image contrast in a bright environment, and which has functional layers for imparting various functions required of a plasma display.

The front filter for a plasma display of the present invention can provide excellent visibility when displaying a highly entertaining image. Moreover, it can achieve deep, glossy black feeling without whitening and high image contrast even under bright daylight, and it does not limit the installation position of image display devices. Therefore, the front filter of the present invention is particularly suitable as a front filter for a plasma display which is also usable as that for TV, which is used to display highly entertaining images such as particularly movies and full-color images and is liable to fix its installation location, or as a front filter for a plasma display which is also usable as that for both of TV and office work.

BRIEF DESCRIPTION OF THE DRAWINGS

FIG. 1 is a sectional view of an embodiment of a basic layer structure of a front filter for a plasma display according to the present invention;

FIG. 2 is a sectional view of another embodiment of a basic layer structure of the front filter for a plasma display according to the present invention;

FIG. 3 is a sectional view of another embodiment of a basic layer structure of the front filter for a plasma display according to the present invention;

FIG. 4 is a sectional view of one embodiment of the front filter for a plasma display according to the present invention;

FIG. 5 is a sectional view of one embodiment of the front filter for a plasma display according to the present invention;

FIG. 6 schematically shows a cross-section of one embodiment of the front filter for a plasma display according to the present invention;

FIG. 7 schematically shows a cross-section of one embodiment of the front filter for a plasma display according to the present invention;

FIG. 8 schematically shows a cross-section of one embodiment of the front filter for a plasma display according to the present invention;

FIG. 9 schematically shows a cross-section of one embodiment of the front filter for a plasma display according to the present invention;

FIG. 10 schematically shows a cross-section of one embodiment of the front filter for a plasma display according to the present invention;

FIG. 11 schematically shows a cross-section of one embodiment of the front filter for a plasma display according to the present invention;

FIG. 12 schematically shows a cross-section of one embodiment of the front filter for a plasma display according to the present invention;

FIG. 13 schematically shows a cross-section of one embodiment of the front filter for a plasma display according to the present invention;

FIG. 14 schematically shows a cross-section of one embodiment of the front filter for a plasma display according to the present invention;

FIG. 15 schematically shows a cross-section of one embodiment of the front filter for a plasma display according to the present invention;

FIG. 16 schematically shows an embossed film manufacturing apparatus for manufacturing a concavo-convex layer for the front filter for a plasma display according to the present invention;

FIG. 17 schematically shows a method for measuring glossy black feeling of the front filter for a plasma display according to the present invention in a bright room environment;

FIG. 18 schematically shows a method for measuring an anti-reflection performance of the front filter for a plasma display according to the present invention;

FIG. 19 schematically shows a cross-section of one embodiment of the front filter for a plasma display according to the present invention;

FIG. 20 schematically shows a method for measuring the contrast of the front filter for a plasma display according to the present invention in a bright room environment;

FIG. 21 shows an image data for sensory evaluation of the contrast of the front filter for a plasma display according to the present invention in a bright room environment;

FIG. 22 shows a graph of the relationship between "θa and Rz", and "glossy black feeling and anti-reflection performance"; and FIG. 23 shows a graph of the relationship between "Rz and Sm", and "glossy black feeling and anti-reflection performance".

EXPLANATION OF SYMBOLS

1. Anti-glare layer
2 (2a-2c). Polyester film
3. Functional layer
4. Transparent electrical conductor layer
9. Resin
10. Light transparent fine particles
11. Concavo-convex layer
12. Surface shape modifying layer
13. Low refractive index layer
14. Primer layer
15 (15a-15b). Adhesive layer
16. Impact resistant layer (adhesive layer
17. Near-infrared absorbing layer
18. Blackened layer
19. Copper mesh layer
20. Near-infrared absorbing layer
21. Near-infrared absorbing dye
22. Neon light absorbing dye
23. Color adjusting dye
24. UV absorbing agent
30. Glass plate
31. Neon light absorbing, near-infrared absorbing, color adjusting filter layer
32. Near-infrared absorbing, neon light absorbing filter layer
33. Neon light absorbing filter layer
40. Embossed film manufacturing apparatus
41. Resin film
42. Embossed pattern
43. Coating head
44. Liquid reservoir
45. Rubber roller
46. Inlet for supplying a composition for forming a concavo-convex layer
47. Embossing roller
48. Ultraviolet source
49. Slot
100. Measurement sample
100. Evaluation sample
101. Front filter
102. Black acrylic plate
103. Evaluator
104. Three-wavelength tube(s)
105. Jig
106. Black and white striped plate
107. PDP
108. White fluorescent lamp
109. Luminance meter

BEST MODE FOR CARRYING OUT THE INVENTION

The front filter for a plasma display of the present invention (hereinafter, it may be simply referred to as "front filter") is a front filter for a plasma display comprising:
an anti-glare layer having a concavo-convex shape on an outermost surface thereof;
a polyester film; and
a functional layer,
wherein the anti-glare layer is disposed on an observer-side surface of the front filter;
wherein the concavo-convex shape satisfies the following requirements:
"Sm" is from 60 µm or more and 250 µm or less;
"θa" is from 0.3 degree or more and 1.0 degree or less; and
"Rz" is from 0.3 µm or more and 1.0 µm or less
wherein "Sm" represents an average distance between concavoconvexes in the anti-glare layer; "θa" represents an average inclination angle of the concavoconvexes; and "Rz" represents a ten-point average roughness of the concavoconvexes.

In the concavo-convex shape of the anti-glare layer of the present invention, the "Sm", "θa" and "Rz" may be appropriately combined and set within the above ranges from the viewpoint of demanded glossy black feeling, image contrast in a bright environment and reflection prevention. Considering the balance of these points, "Sm" is preferably from 110 μm or more and 200 μm or less, "θa" is preferably from 0.5 degree or more and 0.8 degree or less, and "Rz" is preferably from 0.5 μm or more and 0.8 μm or less.

In a front filter having an anti-glare layer that has been provided on the front surface of an image display device for a PC (personal computer), a fine concavo-convex shape present on the surface of the anti-glare layer prevents strong reflection of light, which is caused by mirror reflection (also known as specular reflection; hereinafter both terms will be appropriately used) of external light incident on the front filter, and weakly reflects external light in all directions (diffuse reflection). Consequently, the front filter is imparted with sufficient anti-glare properties; however, it is disadvantageous in that diffusely reflected light incident on an observer's eye deteriorates the reproducibility of display light generated from an image display device and, particularly, original wet look black color (glossy back feeling) is poorly reproduced.

When the shape of the outermost surface of an anti-glare layer satisfies the above conditions, the surface has a smoother and gentler concavo-convex shape than conventional anti-glare layers. External light incident on a front filter having such a concavo-convex shape is appropriately and diffusely reflected at angles near the angle of specular reflection, and the diffusivity of image light transmitted through the anti-glare layer in its nearly normal direction is minimized. Therefore, the front filter can maintain necessary anti-glare properties and, at the same time, remarkably improve black color reproduction which has been difficult to realize with conventional front filters, especially glossy black feeling.

The front filter for a plasma display of the present invention uses a polyester film as a substrate thereof. A polyester film has higher heat resistance and mechanical strength compared to a cellulose triacetate (TAC) film generally used for LCDs, and is thus excellent in processability. Therefore, the front filter for a plasma display of the present invention can be suitably used as a front filter for PDPs. Also, a polyester film has higher rigidity and smoothness than a TAC film; therefore, an anti-glare layer formed with a polyester film is imparted with higher pencil hardness than that of an anti-glare layer formed with a TAC film, and it is easy to obtain a front filter for a plasma display having a surface with high scratch resistance. Moreover, unlike LCDs, PDP substrates are not required to have optical isotropy; thus, biaxially oriented polyester films are usable as PDP substrates.

In the present invention, the term "original wet look black color" refers to wet glossy black color which appears when an image display device displays black color in a bright room environment (that is, among various bright environments, this terms refers especially to the inside of a room) in the state that specularly reflected external light and diffusely reflected external light are not allowed to reach an observer's eye. Such black color is referred to as "glossy black feeling" herein.

Evaluation of glossy black feeling is conducted by adhering the present invention to the surface of a black acrylic plate, which corresponds to a panel displaying black color in a bright room environment, and visually observing the surface. In particular, a measurement sample 100 is placed on a horizontal plane, in which a front filter 101 of the present invention is adhered to a black acrylic plate 102 with the aid of a clear adhesive such as an acrylic adhesive for optical films (for example, "DA-1000" manufactured by Hitachi Chemical Co., Ltd.) The measurement sample 100, an evaluator 103 and a three-wavelength tube (30 W) 104 are arranged in the positional relationship as shown in FIG. 17. Visual sensory evaluation is carried out while turning on the three-wavelength tube 104 to determine whether or not glossy black color can be reproduced.

In the present invention, anti-reflection performance (anti-glare properties) is evaluated by the following method. FIG. 18 schematically shows the method for measuring the anti-reflection performance of the front filter for a plasma display according to the present invention. A jig 105 is equipped with an evaluation sample 100 in which a black acrylic plate 102 is adhered to the display device side of a front filter 101 with the aid of an acrylic adhesive for optical films (product name: DA-1000; manufactured by: Hitachi Chemical Co., Ltd.) A black and white striped plate 106 of 20 mm in width is also prepared. The evaluation sample 100, an evaluator 103 and the black and white striped plate 106 are arranged in the positional relationship as shown in FIG. 18. Moreover, adjustment of the positional relationship with a desired number of three-wavelength tubes 104 installed on a desired position(s) of the ceiling of a room was conducted so as to provide the sample surface with an illuminance of 250 lx and a luminance of the stripe (white) of 65 cd/m². Evaluation is carried out in such a manner that an observer looks at the sample under this condition to determine whether or not the stripe reflected on the sample is discernible.

The terms "Rz", "Sm", "θa" and "Y" as used in the specification and Examples of the present invention will be defined as follows.

<<Average Distance "Sm" (μm), Average Inclination Angle "θa" and Ten-Point Average Roughness "Rz" of Concavoconvexes>>

The anti-glare layer constituting the optical laminate according to the present invention has a concavo-convex shape. Sm (μm) represents the average distance between concavoconvexes (profile irregularities) of the anti-glare layer, and θa (degree) represents the average inclination angle of the concavo-convex part. "Rz" represents a ten-point average roughness and nearly corresponds to an average height difference between peaks and valleys of the concavoconvexes. The definitions of these terms conform to JIS B0601 (1994) and are also disclosed in the instruction manual (revised on Jul. 20, 1995) of a surface roughness measuring device (model: SE-3400, manufactured by Kosaka Laboratory Ltd.) "θa" (degree) represents the angle mode, and when the inclination is "Δa" in terms of aspect ratio, "θa" (degree) is determined by Δa (degree)=tan θa=(sum of values of difference between the lowest and highest parts in each concavo-convex (corresponding to the height of each convex part)/reference length). The "reference length" is the same as in the following measuring conditions, and represents a length to be subject to stylus measurement with SE-3400 (cutoff value: λc) and the length used in the present invention is 0.8 mm.

In the present invention, measurement was conducted by means of SE-3400 (product name; manufactured by: Kosaka Laboratory Ltd.) under the following conditions.
1) Stylus of Surface Roughness Pick-Up
  Model No. SE2555N (standard: 2 μm) manufactured by Kosaka Laboratory Ltd.
  (Radius of curvature in tip: 2 μm/apex angle: 90°/material: diamond)
2) Measuring Conditions for Surface Roughness Measuring Device
  Reference length (cut-off value of roughness curve "λc"): 0.8 mm
  Evaluation length: (reference length (Cut-off value "λc")× 5): 4.0 mm
  Feed speed of stylus: 0.1 mm/sec
<<Reflectance Y Value>>

In the present invention, a reflectance Y value is as defined in JIS 28722, and it is a value of luminous reflectance and determined by measuring five-degree regular reflectance in a wavelength range from 380 to 780 nm with a spectrophotometer (product name: MPC3100; manufactured by: Shimadzu Corporation) and then converting the reflectance value to lightness which can be perceived by the human eye with a software (incorporated in MPC3100). The five-degree regular reflectance is measured in such a state that, in order to prevent the backside reflection of the film as the optical laminate, a black tape (manufactured by: Teraoka Seisakusho Co., Ltd.) is applied to the side opposite to the film surface to be measured.

(Layer Structure)

Hereinafter, the layer structure of the front filter for a plasma display according to the present invention will be described.

FIG. 1 shows a sectional view of an embodiment of a basic layer structure of a front filter for a plasma display according to the present invention. An anti-glare layer 1 is disposed on the observer-side surface of a polyester film 2, and a functional layer 3 is disposed on the display device side of the polyester film 2.

The term "observer's side (observer-side)" as used in the present invention refers to a surface to be directed to an observer when the front filter according to the present invention is provided on a plasma display. Also, the term "display device side (display device-side)" as used in the present invention refers to a surface to be directed to a plasma display when the front filter according to the present invention is provided on a plasma display.

Each of FIGS. 2 and 3 is a sectional view of another embodiment of the layer structure of the front filter for a plasma display according to the present invention. An anti-glare layer 1 and, as a functional layer, a transparent electrical conductor layer 4 are disposed on either surface of a polyester film 2. The anti-glare layer 1 is always disposed on the observer-side surface. The transparent electrical conductor layer 4 may be disposed onto the plasma display-side surface of the polyester film 2 as shown in FIG. 2 or may be disposed between the anti-glare layer 1 and the polyester film 2 as shown in FIG. 3, which is simultaneously on the observer's side.

Specific examples of the structure of the transparent electrical conductor layer 4 shown in FIGS. 2 and 3 include a metal foil adhered to a polyester film and etched in a mesh pattern, a conductive ink printed in a mesh pattern on a polyester film, and so on. The transparent electrical conductor layer 4 may be those formed from various materials and by various production methods.

The anti-glare layer 1 comprises at least a concavo-convex layer. In the present invention, the "concavo-convex layer" is a layer having a concavo-convex shape, which is aimed to form a specific concavo-convex shape on the outermost surface of the anti-glare layer. When the anti-glare layer comprises a single layer, the anti-glare layer is a concavo-convex layer per se and imparted with the above-mentioned specific concavo-convex shape on the outermost surface. When the anti-glare layer comprises two or more layers, the concavo-convex layer may not necessarily have the above-mentioned specific concavo-convex shape as long as the concavo-convex shape on the outermost surface of the anti-glare layer is within the ranges of the above-mentioned specific concavo-convex shape.

The front filter for a plasma display of the present invention can impart various functions required of image display devices. Consequently, it may have a laminated structure as shown in FIG. 4, in which the anti-glare layer comprises two or more layers and has a surface shape modifying layer 12 on the observer's side of a concavo-convex layer 11. Even when the concavo-convex layer has a different concavo-convex shape from that of the anti-glare layer of the present invention, such as a concavo-convex shape with increased fineness or a concavo-convex shape with concavoconvexes having has an excessively large height difference, the observer-side surface of the anti-glare layer can be imparted with a smooth, gentle and desired concavo-convex shape and various functions by forming a surface shape modifying layer on the concavo-convex layer.

The surface shape modifying layer may comprise one or more kinds selected from the group consisting of an antistatic agent, a refractive index modifier, an anti-fouling agent, a water repellent, an oil repellent, a fingerprint adhesion preventive agent, a curability enhancing agent and a hardness modifier.

In order to enhance the effect of improving reflection prevention, glossy black feeling and bright room contrast, it is preferable to incorporate a color adjusting dye, which will be described below, in the anti-glare layer so that the foremost surface of the front filter absorbs external light, which interferes with observation of image light. In this case, a color adjusting dye is preferably incorporated in a layer closer to the surface, for example, a surface shape modifying layer.

The surface shape modifying layer may also function as a low refractive index layer to impart anti-reflection performance to the anti-glare layer. As shown in FIG. 5, the anti-glare layer may comprise three or more layers and may have a low refractive index layer 13 further on the observer's side, in addition to a surface shape modifying layer 12. This low refractive index layer has a shape corresponding to the concavo-convex shape on the surface of the surface shape modifying layer, which is a substrate of the low refractive index layer, and the concavo-convex shape on the surface of the low refractive index layer becomes equivalent to that on the surface of the layer which is the substrate. In addition to the low refractive index layer, an optional layer may be further present on the observer's side. However, the outermost layer of layers constituting the anti-glare layer has to have the concavo-convex shape specified in the present invention. The low refractive index layer has a lower refractive index than that of the display device-side layer having the low refractive index layer stacked thereon.

The functional layer is a layer including any one or more of functions which includes optical functions such as a near-infrared absorbing function, a neon light absorbing function, a color adjusting function and ultraviolet absorbing function, especially an optical filtering function, and other functions such as an electromagnetic shielding function, an adhesive function and an impact-resistant function. The functional layer comprises a single layer or two or more layers, and a functional layer composed of a single layer may have two or more functions.

In the front filter of the present invention, the polyester film 2, which is an essential component of the front filter, functions at least as a supporting substrate of the anti-glare layer 1. The front filter of the present invention may have an optional light transparent substrate as a supporting substrate on the observer's side of the polyester film in addition to the polyester film, when two or more functional layers are disposed or when an electromagnetic wave shielding sheet is stacked.

The light transparent substrate is preferably a substrate which has smoothness and heat resistance, and is superior in mechanical strength. The light transparent substrates may be a resin substrate or an inorganic substrate. Specific examples of resin substrates include thermoplastic resins such as polyester (for example, polyethylene terephthalate or polyethylene naphthalate), cellulose triacetate, cellulose diacetate, cellulose acetate butyrate, polyamide, polyimide, polyethersulfone, polysulfone, polypropylene, polymethylpentene, polyvinyl chloride, polyvinyl acetal, polyether ketone, polymethyl methacrylate, polycarbonate and polyurethane. Also, a film of amorphous olefin polymer (cyclo olefin polymer: COP) having an alicyclic structure can be used. This is a substrate in which for example norbornene polymers, monocyclic olefin polymers, cyclic conjugated diene polymers and vinyl alicyclic hydrocarbon polymer resins are used.

Examples of the inorganic substrate include glass substrates of soda glass, potassium glass, borosilicate glass, quartz glass and the like, and substrates formed by using ceramics such as PLZT.

The thickness of such substrates is, in the case of resin substrates, from about 20 μm to 5,000 μm. In the case of inorganic substrates, the thickness is from about 500 μm to 5,000 μm. Substrates in the form of so-called films, sheets or plates may be appropriately selected.

Among these, polyester resins, especially polyethylene terephthalate, are preferred as the substrate for the front filter for a plasma display from the viewpoint of processing properties such as transparency, mechanical strength, heat resistance, dimensional stability, coating, laminating and cutting, flexibility when formed into a thin layer, price, etc. When formed into a long continuous belt-like thin layer (film or sheet), polyester resins in the form of a biaxially oriented film are preferably used.

In the front filter of the present invention, an adhesive layer may be disposed at any desired position between said layers and/or on the display device-side surface (backmost surface). Moreover, the adhesive layer may be imparted with any one or more of functions including the near-infrared absorbing function, the neon light absorbing function, the color adjusting function and the ultraviolet absorbing function.

In the front filter of the present invention, an impact resistant layer for protecting an image display device from physical impacts may be disposed on the display device-side surface (backmost surface) as needed. The impact resistant layer is necessary in an embodiment in which the front filter is directly attached and disposed onto an image display device. When an adhesive material is used in the impact resistant layer, the impact resistant layer also works as an adhesive layer to attach the front filter to the front surface of an image display device. Moreover, the impact resistant layer may be imparted with any one or more of functions including the near-infrared absorbing function, the neon light absorbing function, the color adjusting function and the ultraviolet absorbing function.

On the other hand, the impact resistant layer is unnecessary when the front filter is fixed and disposed to the front surface of an image display device having a gap therebetween.

FIGS. 6 to 15 are figures schematically showing a cross-section of a typical embodiment of the front filter of the present invention. In these figures, for the sake of simplicity, the scale of each object is appropriately modified or larger than the actual size. Dye molecules are visualized with symbols although they are normally invisible. Front filters shown in FIGS. 6 to 9 are used in such a manner that they are each directly attached to an image display device, or in such a manner that they are each attached to a different optical laminate having a different function to form a laminate, which is disposed on the front surface of an image display. The front filter shown in FIG. 6 comprises, in the following order starting from the observer's side, an anti-glare layer 1, a polyethylene terephthalate (also abbreviated as PET) film 2 and an impact resistant layer (adhesive layer) 16 containing a UV absorbing agent 24. The front filter shown in FIG. 7 comprises, in the following order starting from the observer's side, an anti-glare layer 1, a polyethylene terephthalate (PET) film 2 and an adhesive layer (impact resistant layer) 16 containing a near-infrared absorbing agent 21. The front filter shown in FIG. 8 comprises, in the following order starting from the observer's side, an anti-glare layer 1, a PET film 2a, an adhesive layer 15a containing a UV absorbing agent 24, a near-infrared absorbing layer 20 containing a near-infrared absorbing dye 21, a PET film 2b, an adhesive layer 15b, a transparent electrical conductor layer 4 (a blackened layer 18, a copper mesh layer 19), a primer layer 14, a PET film 2c and an impact resistant layer (adhesive layer) 16 containing a neon light absorbing dye 22 and a color adjusting dye 23.

The front filter shown in FIG. 9 comprises, in the following order starting from the observer's side, an anti-glare layer 1, a polyester-based primer layer 14, a PET film 2 containing a UV absorbing agent 24, an adhesive layer 15, a transparent electrical conductor layer 4 (a blackened layer 18, a copper mesh layer 19) and an impact resistant layer (adhesive layer) 16 containing a near-infrared absorbing dye 21, a neon light absorbing dye 22 and a color adjusting dye 23.

The front filters shown in FIGS. 6 to 9 are preferred since, due to imparting multiple functions to an adhesive layer, the number of layers in the front filter is decreased, resulting in a decrease in the number of steps in the production process and a decrease in the number of materials used; therefore, the front filter can be produced at a lower production cost.

Front filters shown in FIGS. 10 and 11 are used in such a manner that they are each attached to a different optical laminate to form a laminate, which is disposed on the front surface of an image display, or in such a manner that the they are each fixed and disposed onto the front surface of an image display device having a gap therebetween.

The front filter shown in FIG. 10 comprises, in the following order starting from the observer's side, an anti-glare layer 1, a PET film 2 containing a UV absorbing agent 24 and a filter layer 32 containing a near-infrared absorbing dye 21 and a neon light absorbing dye 22.

The front filter shown in FIG. 11 comprises, in the following order starting from the observer's side, an anti-glare layer 1, a PET film 2a, an adhesive layer 15a, a glass plate 30, an adhesive layer 15b, a PET film 2b containing a UV absorbing agent 24, an adhesive layer 14, a transparent electrical conductor layer 4 (a blackened layer 18, a copper mesh layer 19) and a filter layer 31 containing a near-infrared absorbing dye 21, a neon light absorbing dye 22 and a color adjusting dye 23.

The front filters of said structures are preferred since, due to imparting multiple functions to one layer, the number of layers in the front filter is decreased, resulting in a decrease in the number of steps in the production process and a decrease in the number of materials used; therefore, the front filter can be produced at a lower production cost.

Front filters shown in FIGS. 12 to 15 show respectively a front filter used in such a manner that the front filter is fixed and disposed onto the front surface of an image display device having a gap therebetween, or an embodiment in which the front filter is directly attached to the front glass substrate of an image display device. That is, in FIGS. 12 to 15, a glass plate 30 may be the substrate of the front filter itself, or the front glass substrate of an image display device.

The front filter shown in FIG. 12 comprises, in the following order starting from the observer's side, an anti-glare layer 1, a PET film 2a, an adhesive layer 15a containing a neon light absorbing dye 22 and a color adjusting dye 23, a PET film 2b, a transparent electrical conductor layer 4 (a blackened layer 18, a copper mesh layer 19), an adhesive layer 15b containing a near-infrared absorbing dye 21 and a glass plate 30.

The front filter shown in FIG. 13 comprises, in the following order starting from the observer's side, an anti-glare layer 1, a PET film 2, a transparent electrical conductor layer 4 (a blackened layer 18, a copper mesh layer 19), an adhesive layer 16 containing a near-infrared absorbing dye 21, a neon light absorbing dye 22 and a color adjusting dye 23, and a glass plate 30.

The front filter shown in FIG. 14 comprises, in the following order starting from the observer's side, an anti-glare layer 1, a PET film 2, a transparent electrical conductor layer 4 (a blackened layer 18, a copper mesh layer 19), an adhesive layer 16 containing a near-infrared absorbing dye 21, a neon light absorbing dye 22, a color adjusting dye 23 and a UV absorbing agent 24, and a glass plate 30.

The front filter shown in FIG. 15 comprises, in the following order starting from the observer's side, an anti-glare layer 1, a PET film 2a, a filter layer 33 containing a neon light absorbing dye 22, an adhesive layer 16a, a transparent electrical conductor layer 4 (a blackened layer 18, a copper mesh layer 19), an adhesive layer 15 (this layer may be excluded), a PET film 2b, an adhesive layer 16b containing a near-infrared absorbing dye 21 and a glass plate 30.

The present invention is not limited by the aforementioned embodiments. The embodiments are examples, and any that has the substantially same essential features as the technical ideas described in claims of the present invention and exerts the same effects and advantages is included in the technical scope of the present invention.

Hereinafter, the aforementioned layers will be respectively described in detail.

<Polyester Film>

The polyester film is essential for the front filter of the present invention and used as a supporting substrate of the front filter. Specific examples include polyethylene terephthalate (PET) films, polyethylene naphthalate (PEN) films, and films comprising polyesters such as ethylene glycol-terephthalic acid-isophthalic acid copolymers, terephthalic acid-ethylene glycol-1,4 cyclohexanedimethanol copolymers, polyester-based thermoplastic elastomers and polyarylates.

The polyester film has light transparency, smoothness and higher heat resistance than cellulose triacetate, which is generally used as the substrate of liquid crystal displays. In addition, the polyester film has high mechanical strength and dimensional stability; thus, it is excellent in processability. Moreover, unlike LCDs, PDP substrates are not required to have optical isotropy; thus, biaxially oriented polyester films are usable as PDP substrates.

In terms of ease of winding and processing, a thickness of the polyester film is from 20 µm or more and 1,000 µm or less, preferably from 20 µm or more and 250 µm or less, more preferably from 30 or more and 200 µm or less.

In general, the polyester film is preferably used in the form of a thin film, which is rich in flexibility as mentioned above. However, in the embodiment where rigidity is required in use, such as the embodiment in which the front filter of the present invention is disposed to the front filter of a PDP having a gap therebetween, the polyester film can be also used in the form of a plate-like body which is imparted with rigidity. When the polyester film is in the form of such a plate-like body, the thickness may exceed the above-mentioned range; thus, polyester films in the form of a plate-like body having a thickness from about 1 to 5 mm are usable.

When formed into a long continuous belt-like thin layer (film or sheet), polyester films in the form of a biaxially oriented film are preferably used.

In addition to a physical treatment such as a corona discharge treatment and an oxidation treatment, application of a coating material referred to as an anchoring agent or primer may be performed on a polyester film to increase the adhesion of the polyester film, before an anti-glare layer is formed thereon.

When the front filter of the present invention has a near-infrared absorbing layer on the display device side thereof, or when the front filter of the present invention is adhered to a laminate including a near-infrared absorbing layer and used as a front plate, an ultraviolet absorbing agent may be contained in the polyester film to protect a near-infrared absorbing dye contained in the near-infrared absorbing layer. Usable ultraviolet absorbing agents may be those that will be described below in connection with the ultraviolet absorbing layer.

<Anti-Glare Layer>

The anti-glare layer is a layer essential to the front filter of the present invention and disposed on the observer-side surface of the front filter. The anti-glare layer comprises one or more layers, and it has at least a concavo-convex layer. The outermost surface of the anti-glare layer has the above-specified concavo-convex shape.

[Concavo-Convex Layer]

The concavo-convex layer is formed on a polyester film or on a desired layer that is stacked on the substrate. Examples of methods for forming the concavo-convex layer on the surface of the substrate or the like include (1) a method for forming a concavo-convex layer using a composition for a concavo-convex layer comprising a resin mixed with light transparent fine particles, (2) a method for forming a concavo-convex layer using a composition for a concavo-convex layer containing only a resin and the like but not containing light transparent fine particles, and (3) a method in which a concavo-convex layer is formed by embossing a coating film with a concavo-convex shape, and so on.

In the present invention, a preliminarily prepared concavo-convex layer may be stacked on the surface of the substrate or the like. In this case, concavo-convex layers prepared by the above methods (1) to (3) are usable.

In the case of forming a concavo-convex layer by applying a composition for a concavo-convex layer, it is preferable to cure the composition for a concavo-convex layer under the irradiation condition for obtaining a gel fraction from 30% or more and 80% or less, in terms of good adhesion between the concavo-convex layer and the surface shape modifying layer, and good scratch resistance. The lower limit of the gel fraction is preferably 35% or more, more preferably 40% or more. The upper limit of the gel fraction is preferably 70% or less, more preferably 60% or less.

When the composition is, for example, an ultraviolet curable resin, the gel fraction can be obtained by the following method. First, an ink comprising, among the components of the composition for a concavo-convex layer, those other than light transparent fine particle, such as a monomer, an oligomer, a polymer and an additive, is prepared as a sample. The ink is applied on 50 µm-thick PET substrates to a thickness of 5 µm. UV light is applied to the coated substrates in different irradiation conditions in which UV irradiation is changed in the range from 10 to 100 mJ at 10 mJ intervals, thereby forming samples. Each of the samples is cut into 10-cm squares. Three 10-cm squares are used, and weight "A" is measured for each square. Then, these square samples are immersed in a solvent considered to dissolve a monomer (such as acetone, methyl ethyl ketone, methyl acetate, toluene and a mixture thereof; in the case of acrylate-based compositions, typical examples thereof include acetone and methyl ethyl ketone) for 12 hours or more. Then, these samples are taken out from the solvent and dried in an oven sufficiently (at 60° C. for two minutes). The weight "B" of a dried sample is measured for each dried square sample. Next, a difference between the weight "A" of a square sample before immersion and weight "B" is obtained for each square samples and referred to as weight "C". Finally, the gel fraction (%) at each irradiance level is calculated by the following formula:

"Gel fraction (%)"=100−C/A (1) Method for Forming a Concavo-Convex Layer Using a composition for a concavo-convex layer, Comprising Resin Mixed with Light Transparent Fine Particles As an embodiment of the front filter of the present invention, there may be mentioned a front filter having a concavo-convex layer formed by the method for forming a concavo-convex layer by applying a composition for a concavo-convex layer, which comprises a resin mixed with light transparent fine particles, on the observer-side surface of the light transparent substrate or transparent electrical conductor layer. It is preferable that the concavo-convex layer comprising a resin mixed with light transparent fine particles is included in the anti-glare layer since it is easy to regulate the above-mentioned "Sm", "θa" and "Rz" of concavoconvexes and to achieve the concavo-convex shape of the anti-glare layer specified in the present invention.

(Light Transparent Fine Particles)

In the present invention, depending on the intended use, not only one kind of light transparent fine particles but also two or more kinds of light transparent fine particles different in component, shape, particle size distribution, etc. may be used and mixed. Preferably, one to three kinds of light transparent fine particles are used. However, still more various kinds of particles may be used for purposes other than forming concavoconvexes.

One or more kinds of light transparent fine particles used in the present invention may be fine particles having a spherical shape such as a perfect spherical shape and a spheroidal shape, and a perfect spherical shape is preferred. The average particle size (μm) of one or more kinds of light transparent fine particles is preferably 0.5 μm or more and 20 μm or less, and more preferably from 0.5 μm or more and 10.0 μm or less. When the particle size is less than 0.5 μm, it is difficult to attain sufficient anti-glare properties and light diffusive effect without the addition of a very large amount of the light transparent fine particles to the anti-glare layer. When the particle size exceeds more than 20 μm, the surface shape of the anti-glare layer may be rough, disadvantageously leading to deteriorated image quality and, at the same time, increased whiteness as a result of increased surface haze. When particles contained are monodisperse particles (particles of a single shape), the average particle size of the light transparent fine particles refers to the average particle size of the monodisperse particles. When particles contained are amorphous particles having a broad particle size distribution, the average particle size of the particles is represented by the average particle size of the most common particles obtained by the measurement of particle size distribution. The particle size of the fine particles can be mainly measured by the Coulter counter method. In addition to this method, the particle size can be measured by laser diffractometry or SEM photography. Further, the light transparent fine particles may be aggregated particles, and in the case of aggregated particles, the secondary particle size is preferably within the above-defined range.

Preferably, 80% or more (preferably 90% or more) of the whole light transparent fine particles is accounted for by fine particles having an average particle size ±1.0 (preferably 0.3) μm. When the average particle size distribution of the fine particles falls within the above-defined range, the evenness of the concavo-convex shape of the anti-glare layer can be rendered good. However, in the case of using fine particles having an average particle size of less than 3.5 μm, fine particles having an average particle size outside the above distribution range may be used, such as amorphous fine particles having an average particle size of 2.5 μm or 1.5 μm.

There is no particular limitation on the light transparent fine particles, and inorganic or organic light transparent fine particles are usable. Specific examples of fine particles made from organic materials include plastic beads. Examples of materials for plastic beads include polystyrenes, melamine resins, acrylic resins, acrylic-styrene resins, benzoguanamine resins, benzoguanamine-formaldehyde condensation resins, polycarbonate resins, polyethylenes and silicon resins. The plastic beads preferably have a hydrophobic group on the surface thereof, and examples of such plastic beads include styrene beads. Examples of materials for inorganic fine particles include silica (such as amorphous silica), alumina, calcium carbonate and glass, and examples of most typical materials include polystyrenes (refractive index: 1.60), melamine resins (refractive index: 1.57), acrylic resins (refractive index: 1.50 to 1.53) and acrylic-styrene resins (refractive index: 1.54 to 1.58), each of which having an appropriate refractive index.

As for the amorphous silica, silica beads having a particle size from 0.5 to 5 μm, in which dispersibility is good, are preferably used. In order to improve the dispersibility of the amorphous silica without causing an increase in the viscosity of a coating composition for forming an anti-glare layer, which will be described below, it is preferable to use the amorphous silica hydrophobized by applying an organic treatment onto the particle surface. As the organic treatment, there are a method for chemically binding a compound to the bead surface and a physical method for impregnating voids existing in a composition composing the bead with a compound without chemically binding a compound to the bead surface, and either method is usable. In general, a chemical treatment method, in which an active group on the silica surface such as a hydroxyl group or a silanol group is utilized, is preferably used from the viewpoint of treatment efficiency. As compounds to be subjected to the treatment, silane materials, siloxane materials or silazane materials, which are highly reactive with the above-mentioned active group, are used. Examples of the compounds include straight alkyl monosubstituted silicone materials such as methyltrichlorosilane, branched alkyl monosubstituted silicone materials, or straight alkyl polysubstituted silicone compounds such as di-n-butyldichlorosilane and ethyldimethylchlorosilane, and branched alkyl polysubstituted silicone compounds. Similarly, straight or branched alkyl, monosubstituted or polysubstituted siloxane materials or silazane materials can be effectively used.

The alkyl chain having a hetero atom, an unsaturated bonding group, a cyclic bonding group, an aromatic functional group or the like may be used for an end or intermediate site in accordance with a required function.

In these compounds, it is possible to attain high affinity for a polymer material of which affinity is low in a state of being untreated since the alkyl group contained exhibits hydrophobicity and therefore the material surface to be treated can be readily converted from hydrophilicity to hydrophobicity.

In the present invention, when two or more kinds of light transparent fine particles are used and mixed, first fine particles and second fine particles preferably satisfy the following formula (I):

$$0.25R_1 \text{(preferably } 0.50R_1\text{)} \leq R_2 \leq 1.0R_1 \text{(preferably } 0.75R_1\text{)} \qquad \text{Formula I}$$

wherein $R_1$ represents the average particle size of the first fine particles (μm), and $R_2$ represents the average particle size of the second fine particles (μm).

When $R_2$ is $0.25 R_1$ or more, the dispersion of the coating solution may be easy and, consequently, the particles may be not aggregated. In the step of drying after coating, a uniform concavo-convex shape can be formed without undergoing an influence of wind during floating. This relationship is also created between the second fine particles and third fine particles. More specifically, the second fine particles and the third fine particles preferably satisfy the following formula:

$$0.25R_2 \leq R_3 \leq 1.0R_2$$

wherein $R_3$ represents the average particle size of the third fine particles.

When two or more kinds of fine particles each comprising a different component are used and mixed, as aforementioned, the two or more kinds of fine particles are preferably different from each other in average particle size. However, fine particles having the same average particle size can also be suitably used.

In another embodiment of the present invention, preferably, the total mass ratio per unit area among the binder, the first fine particles and the second fine particles satisfies the following formulae (II) and (III):

$$0.08 \leq (M_1+M_2)/M \leq 0.36 \quad \text{Formula II}$$

$$0 \leq M_2 \leq 4.0M_1$$

wherein $M_1$ represents the total mass of the first fine particles per unit area; $M_2$ represents the total mass of the second fine particles per unit area; and M represents the total mass of the binder per unit area.

Especially, the content of the second fine particles is preferably from 3 to 100% by mass based on the content of the first fine particles. In the case of using three or more kinds of fine particles, the content of the third fine particles is preferably from 3 to 100% by mass of the second fine particles. This relationship is preferably applied to the content of the forth fine particles and so on.

In the light transparent fine particles, when light transparent fine particles having two or more different kinds of refractive indexes are used and mixed together, the average corresponding to the refractive index and proportion of use of the individual light transparent fine particles can be regarded as the refractive index of the mixed light transparent fine particles. Therefore, the refractive index can be more closely regulated by varying the mixing ratio of the light transparent fine particles, and the regulation of the refractive index of the light transparent fine particles is easier than in the case where one kind of light transparent fine particles is used. By virtue of this, various designs become possible.

Therefore, in the present invention, two or more kinds of light transparent fine particles having a different refractive index may be used as the light transparent fine particles. In this case, the difference in refractive index between the first light transparent fine particles and the second light transparent fine particles is preferably 0.03 or more and 0.10 or less. The reason why the difference in refractive index between the first light transparent fine particles and the second light transparent fine particles in the light transparent fine particles is preferably 0.03 or more and 0.10 or less is that, when the refractive index difference is less than 0.03, the difference in refractive index between the two kinds of light transparent fine particles may be so small that the degree of freedom of the regulation of the refractive index by mixing the two kinds of light transparent fine particles may be small. On the other hand, when the refractive index difference is more than 0.10, the light diffusivity may be disadvantageously determined by the light transparent fine particles having a larger refractive index difference from that of the matrix. The refractive index difference is more preferably 0.04 or more and 0.09 or less, particularly preferably 0.05 or more and 0.08 or less.

Particularly preferred fine particles as first light transparent fine particles to be contained in the anti-glare layer are such that the transparency is high and the difference in refractive index between the fine particles and the binder is the above-described numerical value. For example, acrylic beads (refractive index: 1.49 to 1.53), acryl-styrene copolymer beads (refractive index 1.55), melamine beads (refractive index 1.57) and polycarbonate beads (refractive index 1.57) may be mentioned as organic fine particles usable in the first light transparent fine particles. As inorganic fine particles usable in the first light transparent fine particles, amorphous silica beads (refractive index: 1.45 to 1.50) may be mentioned.

Organic fine particles are preferred as the second light transparent fine particles. The second light transparent fine particles are preferably such that the transparency is high and the difference in refractive index between the fine particles and the light transparent resin is the above-described numerical value. The second light transparent fine particles are preferably used in combination with the first light transparent fine particles.

For example, styrene beads (refractive index 1.60), polyvinyl chloride beads (refractive index 1.60) and benzoguanamine-formaldehyde condensation beads (refractive index: 1.66) are usable as the organic fine particles used in the second transparent fine particles.

When two or more kinds of light transparent fine particles having a different refractive index are used as the light transparent fine particles, it is preferable as mentioned above to make the particle size of the first light transparent fine particles larger than the particle size of the second light transparent fine particles. However, the mixing ratio between the first light transparent fine particles and the second light transparent fine particles may be freely selected by rendering the particle size of the first light transparent fine particles and the second light transparent fine particles uniform. In order to render the particle size of the first light transparent fine particles and the second light transparent fine particles uniform, organic fine particles which can easily provide monodisperse particles are preferred. The lower the level of unevenness of the particle sizes, the smaller the variation in the anti-glare properties and internal scattering properties and advantageously the easier the optical performance design of the anti-glare layer. Means for further enhancing the monodispersibility include wind force classification and wet filtration classification using a filter.

In the concavo-convex layer, the total content of the light transparent fine particles is preferably 5% by mass or more and 40% by mass or less, more preferably 10% by mass or more and 30% by mass or less, based on the total mass of the solid content of the anti-glare layer. When the total content of the light transparent fine particles is less than 5% by mass, sufficient anti-glare properties and internal scattering properties cannot be imparted. On the other hand, when the total content exceeds 40% by mass, disadvantageously, the layer strength is lowered and, consequently, hardcoat properties cannot be imparted to the anti-glare layer.

When the amount of the light transparent fine particles added is large, the light transparent fine particles are likely to sediment in the resin composition. To prevent the sedimentation inorganic fillers such as silica may be added. The larger the amount of the inorganic filler added, the better the effect of preventing the sedimentation of the light transparent fine particles. In some particle size and addition amount, however, the inorganic filler adversely affects the transparency of the coating film. Accordingly, preferably, an inorganic filler having a particle size of 0.5 μm or less is incorporated in the binder in such an amount that the transparency of the coating film is not sacrificed.

An inorganic filler may be added to the concavo-convex layer in order to regulate the refractive index. More specifically, when the difference in refractive index between a binder and the light transparent fine particles cannot be properly increased, an inorganic filler may be appropriately added to the binder in order to regulate the refractive index of a matrix of the part excluding the light transparent fine particles of the anti-glare layer, in which the light transparent fine particles is dispersed. The inorganic filler used in this case is preferably one having a particle size which is satisfactorily smaller than the wavelength of light so that scattering does not occur and a dispersion comprising the organic filler dispersed in the binder acts as an optically homogeneous material.

The refractive index of a bulk of a mixture of a binder, light transparent fine particles and an inorganic filler in the concavo-convex layer according to the present invention, that is, the refractive index of the concavo-convex layer is preferably from 1.48 to 2.00, more preferably from 1.51 to 1.80, still more preferably from 1.54 to 1.70. The refractive index of the matrix of the anti-glare layer in its part excluding the light transparent fine particles is preferably from 1.50 to 2.00. To regulate the refractive index within the above-defined range, the type and amount ratio of the binder, light transparent fine particles and/or inorganic filler may be properly selected.

It is easy to preliminarily and experimentally find out the details of the selection.

The above construction is advantageous in that the selection of a proper difference in refractive index between the light transparent fine particles and the anti-glare layer matrix can prevent whitening of the whole film and, at the same time, can suppress glaring.

(Resin)

The concavo-convex layer may be formed from the light transparent fine particles and a curable resin. In the present invention, the term "resin" is a concept including polymers, which are narrowly defined resins, and resin components such as monomers, oligomers and prepolymers. The curable resin is preferably transparent, and specific examples thereof are classified into three kinds of resins including ionizing radiation-curable resins which are curable upon exposure to ionizing radiation such as ultraviolet light or electron beams, mixtures of ionizing radiation-curable resins with solvent-drying type resins (resins which are capable of forming a coating film just by drying, a solvent for regulating a solid matter at the time of coating, such as thermoplastic resins) or thermosetting resins. Preferred are ionizing radiation-curable resins.

Specific examples of ionizing radiation-curable resins include compounds having a radically polymerizable functional group such as a (meth)acrylate group. For example, there may be mentioned (meth)acrylate-based oligomers, prepolymers or monomers. More specifically, as (meth)acrylate-based oligomers or prepolymers, there may be listed polyester resins, polyether resins, acrylic resins, epoxy resins, urethane resins, alkyd resins, spiroacetal resins, polybutadiene resins, polythiol polyene resins, oligomers or prepolymers of (meth)acrylic ester of polyfunctional compounds, such as polyhydric alcohols, each of which having a relatively low molecular weight. Examples of (meth)acrylate-based monomers include ethyl (meth)acrylate, ethylhexyl (meth)acrylate, hexanediol (meth)acrylate, hexanediol (meth)acrylate, tripropylene glycol di(meth)acrylate, diethylene glycol di(meth)acrylate, 1,6-hexanediol di(meth)acrylate, neopentyl glycol di(meth)acrylate, trimethylolpropane tri(meth)acrylate, pentaerythritol tri(meth)acrylate and dipentaerythritol hexa(meth)acrylate. Herein, the term "(meth)acrylate" refers to acrylate or methacrylate.

Examples of compounds other than the (meth)acrylate-based compounds include monofunctional monomers such as styrene, methylstyrene and N-vinylpyrrolidone, polyfunctional monomers or compounds having a cationic polymerizable functional group such as an oligomer or prepolymer of, for example, a bisphenol type-epoxy compound, a novolac type-epoxy compound, aromatic vinyl ether or aliphatic vinyl ether.

When ionizing radiation-curable resins are used as an ultraviolet curable resin, a sensitizer may be added as a photopolymerization initiator or photopolymerization accelerator.

In the case of a radically polymerizable functional group-containing resin system, acetophenones, benzophenones, Michler's benzoyl benzoate, α-amiloxime ester, tetramethylthiuram monosulfide, benzoins, benzoin methyl ether, thioxanthones, propiophenones, benzyls, acyl phosphine oxides, 1-hydroxy-cyclohexyl-phenyl-ketone and the like are used as a photopolymerization initiator either solely or as a mixture of two or more. The 1-hydroxy-cyclohexyl-phenyl-ketone is available as, for example, Irgacure 184 (product name; manufactured by: Ciba Specialty Chemicals Inc.) Further, α-aminoalkylphenones are available as, for example, Irgacure 907 and Irgacure 369 (product names; manufactured by: Ciba Specialty Chemicals Inc.)

In the case of a cationic polymerizable functional group-containing resin system, an aromatic diazonium salt, an aromatic sulfonium salt, an aromatic iodonium salt, a metallocene compound, a benzoin sulfonate, etc. may be used as a photopolymerization initiator, either solely or as a mixture of two or more.

It is preferable to mix a photosensitizer and specific examples thereof include n-butylamine, triethylamine, poly-n-butylphosphine and so on. An amount of the photopolymerization initiator added is from 0.1 to 10 parts by weight based on 100 parts by weight of the ionizing radiation-curable composition.

The solvent drying-type resin used as a mixture with the ionizing radiation-curable resin is mainly a thermoplastic resin. Commonly exemplified thermoplastic resins are usable. Coating defects of the coated face can be effectively prevented by adding the solvent drying-type resin. Specific examples of preferred thermoplastic resins include styrenic resins, (meth)acrylic resins, organic acid vinyl ester resins, vinyl ether resins, halogen-containing resins, olefinic resins (including alicyclic olefinic resins), polycarbonate resins, polyester resins, polyamide resins, thermoplastic polyurethane resins, polysulfone resins (such as polyether sulfone and polysulfone), polyphenylene ether resins (such as a polymer of 2,6-xylenol), cellulose derivatives (such as cellulose esters, cellulose carbamates and cellulose ethers), silicone resins (such as polydimethylsiloxane and polymethylphenylsiloxane), rubbers or elastomers (such as diene-series rubbers including polybutadiene rubbers and polyisoprene rubbers, styrene-butadiene copolymers, acrylonitrile-butadiene copolymers, acrylic rubbers, urethane rubbers and silicone rubbers).

Specific examples of thermosetting resins include phenol resins, urea resins, diallyl phthalate resins, melamine resins, guanamine resins, unsaturated polyester resins, polyurethane resins, epoxy resins, aminoalkyd resins, melamine-urea co-condensation resins, silicon resins and polysiloxane resins. When the thermosetting resin is used, if necessary, curing agents such as crosslinking agents, polymerization initiators, polymerization accelerators, solvents, viscosity modifiers and the like may be further added.

(Preparation of Concavo-Convex Layer)

The concavo-convex layer may be formed by mixing the light transparent fine particles and the resin with a proper solvent to give a coating composition and coating the composition onto a substrate. Suitable solvents used in this case include alcohols such as isopropyl alcohol, methanol, ethanol, butanol and isobutyl alcohol; ketones such as methyl ethyl ketone (MEK), methyl isobutyl ketone (MIBK) and cyclohexanone; esters such as methyl acetate, ethyl acetate and butyl acetate; halogenated hydrocarbons such as chloroform, methylene chloride and tetrachloroethane; aromatic hydrocarbons such as toluene and xylene, or a mixture thereof. The light transparent fine particles preferably comprise first fine particles and second fine particles, or first fine particles, second fine particles and third fine particles.

In a preferred embodiment of the present invention, preferably, a fluoro- or silicone-type or other leveling agent is added to the coating composition. The coating composition mixed with the leveling agent can impart stable coatability, slidability and anti-fouling properties to the surface of the coating film during coating or drying and, at the same time, can impart scratch resistant effect.

Methods usable for coating the coating composition onto the substrate include, for example, roll coating, Mayer bar coating and gravure coating. After coating the composition, the coated composition is dried and cured by ultraviolet radiation. Specific examples of ultraviolet sources include ultra-high-pressure mercury lamps, high-pressure mercury lamps, low-pressure mercury lamps, carbon arc lamps, black light fluorescent lamps and metal halide lamps. Regarding the wavelength of the ultraviolet light, a wavelength range from 190 to 380 nm may be used. Specific examples of electron beam sources include various electron beam accelerators such as Cockcroft-Walton accelerators, Van de Graaff accelerators, resonance transformer accelerators, insulated core transformer accelerators, linear accelerators, Dynamitron accelerators and high-frequency accelerators. The resin is cured, and the light transparent fine particles in the resin are fixed to form a desired concavo-convex shape on the outermost surface of the anti-glare layer.

(2) Method for Forming a Concavo-Convex Layer Using a Composition for a Concavo-Convex Layer Containing Resin and the Like but not Containing Light Transparent Fine Particles Another preferred embodiment of the front filter according to the present invention is a front filter having a concavo-convex layer formed in such a manner that a composition for a concavo-convex layer containing at least one polymer, at least one curable resin precursor and a solvent, but not containing the fine particles, is coated onto a substrate, and a phase-separated structure is formed by spinodal decomposition from a liquid phase to cure the curable resin precursor.

(Polymer)

The polymer may be a plurality of polymers which can be phase separated by a spinodal decomposition, for example, a cellulose derivative and a styrenic resin, an (meth)acrylic resin, an alicyclic olefinic resin, a polycarbonate resin, a polyester resin or the like, or a combination thereof. The curable resin precursor may be compatible with at least one polymer in the plurality of polymers. At least one of the plurality of polymers may have a functional group involved in a curing reaction of the curable resin precursor, for example, a polymerizable group such as an (meth)acryloyl group. In general, a thermoplastic resin is used as the polymer component.

Specific examples of the thermoplastic resins include those described in "(1) Method for forming concavo-convex layer using composition for concavo-convex layer comprising light transparent fine particles added to a resin", and there resins may be used solely or in combination of two or more kinds.

Specific examples of preferred thermoplastic resin include styrenic resins, (meth)acrylic resins, vinyl acetate resins, vinyl ether resins, halogen-containing resins, alicyclic olefinic resins, polycarbonate resins, polyester resins, polyamide resins, cellulose derivatives, silicone resins, rubbers and elastomers. The resin is generally noncrystalline and, at the same time, is soluble in an organic solvent (particularly a common solvent which can dissolve a plurality of polymers and curable compounds). Particularly preferred are resins having good moldability or film forming properties, transparency and weathering resistance, such as styrenic resins, (meth) acrylic resins, alicyclic olefinic resins, polyester resins and cellulose derivatives (for example, cellulose esters).

Polymers containing a functional group involved in a curing reaction (or a functional group reactable with a curable compound) are also usable as the polymer component. The polymers may contain a functional group in a main chain or side chain thereof. The functional group may be introduced into the main chain, for example, by copolymerization or co-condensation. In general, however, the functional group is introduced into the side chain. Specific examples of such functional groups include condensable groups and reactive groups (for example, hydroxyl group, acid anhydride group, carboxyl group, amino group or imino group, epoxy group, glycidyl group and isocyanate group), polymerizable groups (for example, $C_{2-6}$ alkenyl groups such as vinyl, propenyl, isopropenyl, butenyl and allyl groups, $C_{2-6}$ alkynyl groups such as ethynyl, propynyl and butynyl groups, and $C_{2-6}$ alkenylidene groups such as vinylidene), or groups containing these polymerizable groups (for example, (meth)acryloyl group). Among these functional groups, polymerizable groups are preferred.

The polymerizable group may be introduced into the side chain, for example, by reacting a thermoplastic resin containing a functional group such as a reactive group or a condensable group with a polymerizable compound containing a group reactable with the functional group.

Examples of such functional group-containing thermoplastic resins include thermoplastic resins containing a carboxyl group or its acid anhydride group (for example, (meth) acrylic resins, polyester resins and polyamide resins), hydroxyl group-containing thermoplastic resins (for example, (meth)acrylic resins, polyurethane resins, cellulose derivatives and polyamide resins), amino group-containing thermoplastic resins (for example, polyamide resins), amino group-containing thermoplastic resins (for example, polyamide resins), epoxy group-containing thermoplastic resins (for example, epoxy group-containing (meth)acrylic resins and polyester resins). Resins comprising the above functional group introduced into thermoplastic resins such as styrenic resins, olefinic resins or alicyclic olefinic resins by copolymerization or graft polymerization are also usable.

Regarding the above-mentioned polymerizable compound, polymerizable compounds containing epoxy, hydroxyl, amino, or isocyanate groups can be used for thermoplastic resins containing carboxyl groups or acid anhydride groups thereof. Polymerizable compounds containing carboxyl groups or acid anhydride groups thereof or isocyanate groups can be used for hydroxyl group-containing thermoplastic resins. Polymerizable compounds containing carboxyl groups or acid anhydride groups thereof, epoxy groups and isocyanate groups can be used for amino group-containing thermoplastic resins. Polymerizable compounds containing carboxyl groups or acid anhydride groups thereof or amino groups can be used for epoxy group-containing thermoplastic resins.

Among the above polymerizable compounds, epoxy group-containing polymerizable compounds include, for example, epoxycyclo-$C_{5-8}$-alkenyl (meth)acrylates such as epoxycyclohexenyl (meth)acrylate, glycidyl (meth)acrylate and allyl glycidyl ether. Hydroxyl group-containing compounds include, for example, hydroxy-$C_{1-4}$-alkyl (meth)acrylates such as hydroxypropyl (meth)acrylate, and $C_{2-6}$ alkylene glycol (meth)acrylates such as ethylene glycol mono (meth)acrylate. Amino group-containing polymerizable compounds include, for example, (meth)acrylates such as aminoethyl (meth)acrylate, $C_{3-6}$ alkenylamines such as allylamine, and aminostyrenes such as 4-aminostyrene and diaminostyrene. Isocyanate group-containing polymerizable compounds include, for example, (poly)urethane (meth)acrylate and vinyl isocyanate. Polymerizable compounds containing carboxyl groups or acid anhydride groups thereof include, for example, unsaturated carboxylic acids or anhydrides thereof such as (meth)acrylic acid and maleic anhydride.

As a representative example, there may be mentioned a combination of a thermoplastic resin containing a carboxyl group or its acid anhydride group with an epoxy group-containing compound, particularly a combination of an (meth)acrylic resin (for example, an (meth)acrylic acid-(meth)acrylic ester copolymer) with an epoxy group-containing (meth)acrylate (for example, epoxycycloalkenyl (meth)acrylate or glycidyl (meth)acrylate). Specific examples thereof include polymers comprising an (meth)acrylic resin and a polymerizable unsaturated group introduced into a part of carboxyl groups in the (meth)acrylic resin, for example, an (meth)acrylic polymer produced by reacting a part of carboxyl groups in an (meth)acrylic acid-(meth)acrylic ester copolymer with an epoxy group in 3,4-epoxycyclohexenyl-methyl acrylate to introduce a photopolymerizable unsaturated group into the side chain (product name: CYCLOMER P; manufactured by: Daicel Chemical Industries, Ltd.)

The amount of the functional group (particularly polymerizable group) involved in a curing reaction with the thermoplastic resin introduced is from about 0.001 to 10 moles, preferably from 0.01 to 5 moles, more preferably from 0.02 to 3 moles based on 1 kg of the thermoplastic resin.

These polymers may be used in a suitable combination. Specifically, the polymer may comprise a plurality of polymers. The plurality of polymers may be phase separated by liquid phase spinodal decomposition. The plurality of polymers may be incompatible with each other. When the plurality of polymers is used in combination, the combination of a first resin with a second resin is not particularly limited. For example, a plurality of suitable polymers incompatible with each other at a temperature around a processing temperature, for example, two suitable polymers incompatible with each other may be used in combination. For example, when the first resin is a styrenic resin (for example, polystyrene or a styrene-acrylonitrile copolymer), examples of second resins usable herein include cellulose derivatives (for example, cellulose esters such as cellulose acetate propionate), (meth)acrylic resins (for example, polymethyl methacrylate), alicyclic olefinic resins (for example, polymers using norbornene as a monomer), polycarbonate resins, and polyester resins (for example, the above poly-$C_{2-4}$-alkylene arylate copolyesters). On the other hand, for example, when the first polymer is a cellulose derivative (for example, a cellulose ester such as cellulose acetate propionate), examples of second polymers usable herein include styrenic resins (for example, polystyrene or styrene-acrylonitrile copolymer), (meth)acrylic resins, alicyclic olefinic resins (for example, polymers using norbornene as a monomer), polycarbonate resins, and polyester resins (for example, the above poly-$C_{2-4}$-alkylene arylate copolyesters). In the combination of the plurality of resins, at least cellulose esters (for example, cellulose $C_{2-9}$alkyl carboxylic esters such as cellulose diacetate, cellulose triacetate, cellulose acetate propionate and cellulose acetate butyrate) may be used.

The phase separated structure produced by the spinodal decomposition is finally cured by the application of an active ray radiation (for example, ultraviolet light or electron beams), heat or the like to form a cured resin. By virtue of this, the scratch resistance can be imparted to the anti-glare layer, and the durability can be improved.

From the viewpoint of scratch resistance after curing, preferably, at least one polymer in the plurality of polymers, for example, one of mutually incompatible polymers (when the first and second resins are used in combination, particularly both the polymers) is a polymer having on its side chain a functional group reactable with a curable resin precursor.

The weight ratio between the first polymer and the second polymer may be selected, for example, from the range of first polymer/second polymer=about 1/99 to 99/1, preferably 5/95 to 95/5, more preferably 10/90 to 90/10 and is generally about 20/80 to 80/20, particularly 30/70 to 70/30.

In addition to the above two incompatible polymers, the above thermoplastic resins or other polymers may be also incorporated in the polymer for phase-separated structure formation.

The glass transition temperature of the polymer may be selected, for example, from the range of about −100° C. to 250° C., preferably about −50° C. to 230° C., more preferably about 0° C. to 200° C. (for example, about 50 to 180° C.). A glass transition temperature of 50° C. or above (for example, about 70 to 200° C.), preferably 100° C. or above (for example, about 100 to 170° C.), is advantageous from the viewpoint of the surface hardness. The weight average molecular weight of the polymer may be selected, for example, from the range of about 1,000,000 or less, preferably about 1,000 to 500,000.

(Curable Resin Precursor)

The curable resin precursor is a compound containing a functional group which can be reacted upon exposure to, for example, heat or an active ray radiation (such as ultraviolet light and electron beams), and various curable compounds which can be cured or crosslinked upon exposure to heat, an active ray radiation or the like to form a resin (particularly a cured or crosslinked resin) can be used. Examples of such resin precursors include heat curing compounds or resins [low-molecular weight compounds containing epoxy groups, polymerizable groups, isocyanate groups, alkoxysilyl groups, or silanol groups (for example, epoxy resins, unsaturated polyester resins, urethane resins, or silicone resins)] and photocuring compounds curable upon exposure to an active ray radiation (such as ultraviolet light) (for example, ultraviolet light curing compounds such as photocuring monomers and oligomers). The photocuring compound may be, for example, an EB (electron beam) curing compound. Photocuring compounds such as photocuring monomers, oligomers, photocuring resins which may have a low-molecular weight, are sometimes referred to simply as "photocuring resin."

Photocuring compounds include, for example, monomers and oligomers (or resins, particularly low-molecular weight resins). Monomers include, for example, monofunctional monomers [(meth)acrylic monomers such as (meth)acrylic esters, vinyl monomers such as vinylpyrrolidone, crosslinked cyclic hydrocarbon group-containing (meth)acrylates such as isobornyl (meth)acrylate or adamantyl (meth)acrylate)], polyfunctional monomers containing at least two polymerizable unsaturated bonds [for example, alkylene glycol di(meth)acrylates such as ethylene glycol di(meth)acrylate, propylene glycol di(meth)acrylate, butanediol di(meth)acrylate, neopentyl glycol di(meth)acrylate, and hexanediol di(meth)acrylate; (poly)oxyalkylene glycol di(meth)acrylates such as diethylene glycol di(meth)acrylate, dipropylene glycol di(meth)acrylate, and polyoxytetramethylene glycol di(meth)acrylate; crosslinked cyclic hydrocarbon group-containing di(meth)acrylates such as tricyclodecane dimethanol di(meth)acrylate and adamantane di(meth)acrylate; and polyfunctional monomers containing about three to six polymerizable unsaturated bonds such as trimethylolpropane tri (meth)acrylate, trimethylolethane tri(meth)acrylate, pentaerythritol tri(meth)acrylate, pentaerythritol tetra(meth)acrylate, and dipentaerythritol penta(meth)acrylate].

Oligomers or resins include (meth)acrylate bisphenol A-alkylene oxide adducts, epoxy (meth)acrylate (for example, bisphenol A-type epoxy (meth)acrylate and novolak-type epoxy (meth)acrylate), polyester (meth)acrylates (for example, aliphatic polyester-type (meth)acrylate and aromatic polyester-type (meth)acrylate), (poly)urethane (meth)acrylate (for example, polyester-type urethane (meth)acrylate, polyether-type urethane (meth)acrylate) and silicone (meth)acrylate. These photocuring compounds are usable either solely or in a combination of two or more.

Preferred curable resin precursors include photocuring compounds curable in a short time, for example, ultraviolet curing compounds (for example, monomers, oligomers and resins which may have a low-molecular weight) and EB curing compounds. Resin precursors which are particularly advantageous from the practical viewpoint are ultraviolet curing resins. From the viewpoint of improving resistance such as scratch resistance, preferably, the photocuring resin is a compound having in its molecule two or more (preferably about 2 to 6, more preferably about 2 to 4) polymerizable unsaturated bonds. The molecular weight of the curable resin precursor is about 5,000 or less, preferably 2,000 or less, more preferably 1,000 or less, from the viewpoint of compatibility with the polymer.

The curable resin precursor may contain a curing agent depending upon the type of the curable resin precursor. For example, in the case of thermosetting resins, curing agents such as amines or polycarboxylic acids may be contained, and in the case of photocuring resins, photopolymerization initiators may be contained. Examples of photopolymerization initiators include commonly used components, for example, acetophenones or propiophenones, benzyls, benzoins, benzophenones, thioxanthones and acylphosphine oxides. The content of the curing agent such as a photocuring agent is from about 0.1 to 20 parts by weight, preferably about 0.5 to 10 parts by weight, more preferably about 1 to 8 parts by weight (particularly about 1 to 5 parts by weight), based on 100 parts by weight of the curable resin precursor, and may be from about 3 to 8 parts by weight.

The curable resin precursor may contain a curing accelerator. For example, the photocuring resin may contain photocuring accelerators, for example, tertiary amines (for example, dialkylaminobenzoic esters) and phosphine photopolymerization accelerators.

(Specific Combination of Polymer with Curable Resin Precursor)

Preferably, at least two components in at least one polymer and at least one curable resin precursor are used in a combination of materials which are mutually phase separated at a temperature around the processing temperature. Herein, "a temperature around the processing temperature" refers to a processing temperature to dry the solvent contained in the coated composition of from around 50° C. to 120° C. Examples of such combinations include (a) a combination of a plurality of polymers which are mutually incompatible and phase separated, (b) a combination of a polymer and a curable resin precursor which are mutually incompatible and phase separated, and (c) a combination of a plurality of curable resin precursors which are mutually incompatible and phase separated. Among these combinations, (a) a combination of a plurality of polymers and (b) a combination of a polymer with a curable resin precursor are generally preferred, and particularly (a) a combination of a plurality of polymers is preferred. When the compatibility of both the materials to be phase separated is low, both the materials are effectively phase separated in the course of drying for evaporating the solvent and the function as an anti-glare layer can be improved.

The thermoplastic resin and the curable resin precursor (or curing-type resin) are generally incompatible with each other. When the polymer and the curable resin precursor are incompatible with each other and phase separated, a plurality of polymers may be used as the polymer. When a plurality of polymers are used, meeting the requirement that at least one polymer is incompatible with the resin precursor (or curing-type resin) suffices for contemplated results, and the other polymer(s) may be compatible with the resin precursor.

A combination of two mutually incompatible thermoplastic resins with a curing compound (particularly a monomer or oligomer containing a plurality of curable functional groups) may be adopted. From the viewpoint of scratch resistance after curing, at least one polymer (particularly both polymers) in the incompatible thermoplastic resins may be a thermoplastic resin containing a functional group involved in the curing reaction (a functional group involved in curing of the curable resin precursor).

When a combination of a plurality of mutually incompatible polymers is adopted for phase separation, the curable resin precursor to be used in combination with the plurality of mutually incompatible polymers is compatible with at least one polymer in the plurality of incompatible polymers at a temperature around the processing temperature. Specifically, for example, when the plurality of mutually incompatible polymers are constituted by the first resin and the second resin, the curable resin precursor may be one which is compatible with at least one of the first resin and the second resin, preferably is compatible with both the polymer components. When the curable resin precursor is compatible with both the polymer components, phase separation occurs into at least two phases, i.e., a mixture composed mainly of a first resin and a curable resin precursor and a mixture composed mainly of a second resin and a curable resin precursor.

When the compatibility of a plurality of selected polymers is low, the polymers are effectively phase separated from each other in the course of drying for evaporating the solvent and the function as an anti-glare layer is improved. The phase separability of the plurality of polymers can be simply determined by a method in which a homogeneous solution is prepared using a good solvent for both the components and the solvent is gradually evaporated to visually inspect whether or not the residual solid matter is opaque in the course of drying.

In general, the polymer and the cured or crosslinked resin produced by curing of the resin precursor are different from each other in refractive index. Further, the plurality of polymers (first and second resins) are also different from each other in refractive index. The difference in refractive index between the polymer and the cured or crosslinked resin, and the difference in refractive index between the plurality of polymers (first and second resins) may be, for example, from about 0.001 to 0.2, preferably about 0.05 to 0.15.

The ratio (weight ratio) between the polymer and the curable resin precursor is not particularly limited and may be selected, for example, from the range of polymer/curable resin precursor=about 5/95 to 95/5, and from the viewpoint of surface hardness, is preferably polymer/curable resin precursor=about 5/95 to 60/40, more preferably 10/90 to 50/50, particularly preferably 10/90 to 40/60.

(Solvent)

The solvent may be selected and used according to the type and solubility of the polymer and curable resin precursor. A solvent capable of homogeneously dissolving at least the solid matter (a plurality of polymers and a curable resin precursor, a reaction initiator and other additives) suffices for contemplated results and may be used in wet spinodal decomposition. Examples of such solvents include ketones (for example, acetone, methyl ethyl ketone, methyl isobutyl ketone, cyclohexanone and diacetone alcohol), ethers (for example, dioxane and tetrahydrofuran), aliphatic hydrocarbons (for example, hexane), alicyclic hydrocarbons (for example, cyclohexane), aromatic hydrocarbons (for example, toluene and xylene), halogenated hydrocarbons (for example, dichloromethane and dichloroethane), esters (for example, methyl formate, methyl acetate, ethyl acetate and butyl acetate), water, alcohols (for example, ethanol, isopropanol, butanol and cyclohexanol), cellosolves (for example, methylcellosolve, ethylcellosolve and butylcellosolve), cellosolve acetates, sulfoxides (for example, dimethylsulfoxide) and amides (for example, dimethylformamide and dimethylacetamide). A mixture solvent composed of two or more of these solvents may be used.

The concentration of the solute (polymer and curable resin precursor, reaction initiator and other additives) in the composition for a concavo-convex layer may be selected from such a range that causes phase separation and such a range that castability, coatability and the like are not deteriorated. The solute concentration is, for example, from about 1 to 80% by weight, preferably 5 to 60% by weight, more preferably 15 to 40% by weight (particularly 20 to 40% by weight).

(Preparation Method of Concavo-Convex Layer)

The concavo-convex layer may be formed by a process comprising the steps of: mixing at least one polymer and at least one curable resin precursor using a proper solvent to prepare a composition for a concavo-convex layer, applying the composition for a concavo-convex layer onto a substrate and then subjecting the coating to spinodal decomposition involving the evaporation of the solvent to form a phase separated structure; and curing the curable resin precursor to form at least a concavo-convex layer. The phase separation step generally comprises the step of coating or casting a mixed solution containing a polymer and a curable resin precursor and a solvent (particularly a liquid composition such as a homogeneous solution) onto the surface of a light transparent substrate and the step of evaporating the solvent from the coating layer or casting layer to form a phase separated structure having a regular or periodical average phase-to-phase distance. The concavo-convex layer can be formed by curing the curable resin precursor.

In a preferred embodiment of the present invention, the mixed liquid may be a composition for a concavo-convex layer, comprising a thermoplastic resin, a photocuring compound, a photopolymerization initiator and a solvent capable of dissolving the thermoplastic resin and photocuring compound. The concavo-convex layer is formed by applying light to photocurable components in the phase separated structure formed by the spinodal decomposition to cure the photocurable components. In another preferred embodiment of the present invention, the mixed liquid may be a composition for a concavo-convex layer, comprising a plurality of mutually incompatible polymers, a photocuring compound, a photopolymerization initiator and a solvent. In this case, the concavo-convex layer is formed by applying light to photocurable components in the phase separated structure formed by the spinodal decomposition to cure the photocurable components. In still another preferred embodiment of the present invention, the mixed liquid may be a composition for a concavo-convex layer, comprising a thermoplastic resin, a resin incompatible with the thermoplastic resin and containing a photocurable group, a photocuring compound, a photopolymerization initiator and a solvent capable of dissolving the resin and photocuring compound. The concavo-convex layer may be formed by applying light to the composition in the phase separated structure formed by the spinodal decomposition.

The spinodal decomposition involving the evaporation of the solvent can impart regularity or periodicity to the average distance between domains in the phase separated structure. The phase separated structure formed by the spinodal decomposition can be immediately fixed by curing the curable resin precursor. The curable resin precursor can be cured, for example, by heating or light irradiation or a combination of these methods, according to the type of the curable resin precursor. The heating temperature can be selected from a suitable temperature range, for example, from the range of about 50 to 150° C., so far as the phase separated structure is present, and may be selected from the same temperature range as in the phase separation step.

The concavo-convex layer constituting a part or whole of the anti-glare layer is formed to have a concavo-convex shape by forming a phase separated structure in the concavo-convex layer by spinodal decomposition (wet spinodal decomposition) from a liquid phase. Specifically, a composition for a concavo-convex layer comprising a polymer, a curable resin precursor and a solvent is provided. The solvent is evaporated or removed from the composition for a concavo-convex layer in its liquid phase (or a homogeneous solution or coating layer thereof) by drying or the like. In the course of drying or the like, an increase in concentration causes phase separation by spinodal decomposition to form a phase separated structure having a relatively regular phase-to-phase distance. More specifically, the wet spinodal decomposition is generally carried out by coating a composition for a concavo-convex layer (preferably a homogeneous solution) comprising at least one polymer, at least one curable resin precursor and a solvent onto a support (e.g. substrate) and evaporating the solvent from the coating layer.

In the present invention, in the spinodal decomposition, as the phase separation proceeds, a co-continuous phase structure is formed. As the phase separation further proceeds, the continuous phase is rendered discontinuous by the surface tension of the phase per se to form a liquid droplet phase structure (a sea-island structure of independent phases such as spherical, perfect spherical, disk-like, elliptical). Accordingly, depending upon the degree of the phase separation, a structure intermediate between a co-continuous structure and a liquid droplet phase structure (a phase structure in the course of transfer from the co-continuous phase to the liquid droplet phase) can also be formed. The phase separated structure of the concavo-convex layer according to the present invention may be a sea-island structure (a liquid droplet phase structure or a phase structure in which one of the phases is independent or isolated), a co-continuous phase structure (or a network structure), or an intermediate structure in which a co-continuous phase structure and a liquid droplet phase structure exist together. By virtue of the phase separated structure, after the removal of the solvent by drying, fine concavoconvexes can be formed on the surface of the concavo-convex layer.

In the phase separated structure, a concavo-convex shape is formed on the surface of the concavo-convex layer, and from the viewpoint of enhancing the surface hardness, a liquid droplet phase structure having at least island domains is advantageous. When the phase separated structure composed of the polymer and the precursor (or curable resin) is a sea-island structure, the polymer component may constitute a sea phase. From the viewpoint of the surface hardness, however, the polymer component preferably constitutes island domains. The formation of island domains leads to the formation of a concavo-convex shape having desired optical characteristics on the surface of the concavo-convex layer after drying.

The average distance between domains in the phase separated structure is generally substantially regular or periodical. For example, the average phase-to-phase distance of domains corresponds to "Sm" in surface roughness profile and is preferably from 60 to 250 μm, more preferably 60 to 200 μm.

The average distance between domains in the phase separated structure can be regulated according to, for example, the selection of a combination of resins (particularly selection of resins based on solubility parameter). By regulating the average distance between domains in this way, it is possible to make the distance between concavoconvexes formed on the surface of a finally-obtained film be a desired value.

(3) Method for Forming a Concavo-Convex Layer by Embossing a Coating Film with a Concavo-Convex Shape Still another embodiment of the front filter according to the present invention is a front filter having a concavo-convex layer formed by another method, in which, as in the method in (2), no fine particles are required to form a concavo-convex shape.

(3-1) A concavo-convex layer may be formed by forming a pre-layer of the concavo-convex layer having a flat surface and then performing embossing treatment to impart a concavo-convex shape to the surface of the pre-layer. For example, a pre-layer of the concavo-convex layer is formed on the substrate and a concavo-convex shape is formed on the surface of the concavo-convex layer.

In a preferred embodiment of the present invention, the concavo-convex shape is preferably formed by embossing treatment using a mold having a reversed concavo-convex shape in relation to the concavo-convex shape in the concavo-convex layer. Examples of the mold having the reversed concavo-convex shape include an embossing plate and an embossing roller, and may be the same as those that will be described in (3-2)

(3-2) A concavo-convex layer may also be formed in such a manner that a light transparent substrate is disposed to face a mold with a predetermined distance, which mold having a concavo-convex shape reverse to that to be formed on the surface of the concavo-convex layer, and the composition for a concavo-convex layer is supplied therebetween and cured at the same time to form a concavo-convex layer with a desired concavo-convex shape.

These forming methods are advantageous in that because an optical laminate provided with an anti-glare layer having a desired concavo-convex shape can be produced without adding fine particles, a wide range of resin selection is provided. More specifically, the composition for a concavo-convex layer need not be mixed with an excessive amount of light diffusive fine particles if the composition is required to have anti-glare properties, and if anti-glare properties are not required, various resin materials may be selected according to the application, without using fine particles. In a preferred embodiment of the present invention, in addition to an embossing roller, a flat embossing plate may also be used.

For obtaining an optimized concavo-convex shape, the method for forming concavoconvexes by embossing a coating film may be adopted in combination with the above method (1) or (2).

The mold surface having a concavo-convex shape formed, for example, in an embossing roller or a flat embossing plate may be formed by various known methods such as a sandblasting method or a bead shot method. The cross-section of an anti-glare layer of mono-layered structure, which is formed with an embossing plate (an embossing roller) formed by the sandblast method, shows such a concavo-convex shape that a number of concaves are distributed. On the other hand, the cross-section of an anti-glare layer of mono-layered structure, which is formed with an embossing plate (an embossing roller) formed by the bead shot method, shows such a concavo-convex shape that a number of upward-convexes are distributed.

When an anti-glare layer of mono-layered structure are identical in average roughness of concavoconvexes formed on the layer surface, the anti-glare layer of mono-layered structure, in which a number of upward-convexes are distributed, is regarded as causing a lower level of reflection of lighting equipment in a room or the like as compared with the anti-glare layer of mono-layered structure, in which a number of upward-concaves are distributed. Accordingly, in a preferred embodiment of the present invention, the concavo-convex shape of the anti-glare layer of mono-layered structure is formed by utilizing a concavo-convex mold having a shape, which is identical to the concavo-convex shape of the anti-glare layer of mono-layered structure formed by the bead shot method.

Mold materials for forming the concavo-convex mold face usable herein include metals, plastics, woods, or composites thereof. Example of preferred mold materials in the present invention are chromium as a metal from the viewpoints of strength and abrasion resistance upon repeated use, and are iron embossing plates (embossing rollers) having a surface plated with chromium, for example, from the viewpoints of cost effectiveness.

Specific examples of particles (beads) sprayed in the formation of the concavo-convex mold by the sandblast or bead shot method include inorganic particles such as metal particles, silica, alumina, or glass. The particle size (diameter) of these particles is preferably from about 50 μm to 300 μm. In spraying these particles against the mold material, a method may be adopted in which these particles, together with a high speed gas, are sprayed. In this case, a proper liquid such as water may be used in combination with the particles. In the present invention, preferably, the concavo-convex mold having a concavo-convex shape is plated with chromium or the like to improve the durability during use of the mold and is preferred from the viewpoints of film hardening and corrosion prevention.

(4) Concavo-Convex Layer Comprising a Light Diffusion Layer The concavo-convex layer may comprise a light diffusion layer. Herein, the term "light diffusion layer" generally refers to a light diffusion plate or light diffusion film used on the backlight side of an image display device, which is used for a different purpose from that of the above anti-glare layers in (1) to (3). The light diffusion plates or light diffusion film is, generally in various types of displays or lighting devices, used to spread light from a light source evenly for increased visibility. Such a light diffusion plate or light diffusion film is usually disposed between a light source and display, and is used for converting a point light source or line light source into an even surface light source. Examples of the light diffusion plate or light diffusion film for the backlight of liquid crystal displays include a film of a light transparent resin such as polymethyl methacrylate resin or polycarbonate resin, having a surface on which concavoconvexes are formed. The light diffusion plate or light diffusion film is prepared by dispersing a light diffusing agent in a light transparent resin such as polymethyl methacrylate resin or polycarbonate resin, and further by coating a composition comprising a light diffusing agent incorporated and dispersed in a light transparent resin onto a film substrate.

When the light diffusion layer is used as a concavo-convex layer, it can be brought into the form desired for the present invention by stacking a surface shape modifying layer thereon and being composed necessarily of two or more layers.

(Light Diffusing Agent)

Light diffusing agents usable herein include, for example, calcium carbonate and acrylic particles. Specific examples of acrylic particles include methacrylate polymers such as methyl methacrylate, ethyl methacrylate, propyl methacrylate and butyl methacrylate; acrylate polymers such as methyl acrylate, ethyl acrylate, n-propyl acrylate, isopropyl acrylate and butyl acrylate; aromatic vinyl monomers such as styrene, vinyl toluene, α-methylstyrene and halogenated styrene; those prepared by polymerizing crosslinkable monomers such as aryl methacrylate and triarylcyanurate. Acrylic particles may be used solely or in combination of two or more kinds. The average particle size of the acrylic particles is 1 μm or more and 50 μm or less. Preferably, the lower limit of the average particle size is 6 μm or more, and the upper limit of the average particle size is 20 μm or less.

(Resin)

Specific examples of the resin used to form the optical diffusion layer include polyester resins, acrylic resins, polystyrene resins, polyvinyl chloride resins, polyvinylidene chloride resins, polyethylene resins, polypropylene resins, polyurethane resins, polyamide resins, polyvinyl acetate resins, polyvinyl alcohol resins, epoxy resins, cellulose resins, organosiloxane resins, polyimide resins, polysulfone resins and polyarylate resins. Among them, preferred resins are polyester resins from the viewpoint of, for example, controllability of the refractive index difference with a light diffusing agent, wettability or adhesion to a transparent substrate, or scratch resistance, light resistance or transparency of resins.

(Optional Additives)

A light stabilizer, a heat stabilizer, an anti-static agent, a leveling agent or other additives may be further added to the resin composition for forming a light diffusion layer. For example, a fluoro- or silicone-type leveling agent is usable herein. The composition for a light diffusion layer mixed with the leveling agent can impart an improved coatability, slidability or anti-fouling properties to the surface of the coating film during coating or drying and, at the same time, can impart scratch resistant effect.

(Light Diffusion Layer in the Form of Plate or Film)

The "light diffusion layer" may be formed into a plate or a film formed on a polyester film. In general, the thickness of the polyester film is about 50 μm or more and 200 μm or less.

[Surface Shape Modifying Layer]

In the present invention, a surface shape modifying layer is preferably formed on a concavo-convex layer to regulate the concavo-convex shape on the surface of the anti-glare layer. Even when the concavo-convex layer has a different concavo-convex shape from that of the anti-glare layer of the present invention, such as a concavo-convex shape with increased fineness or a concavo-convex shape with concavoconvexes having a large height difference, the surface shape modifying layer offers a wide degree of freedom to modify the average distance "Sm", average inclination angle "θa", and ten-point average roughness "Rz" of the observer-side outermost surface of the anti-glare layer so that these optical property values fall within the ranges specified in the present invention. Further, the surface shape modifying layer can facilitate production and impart various functions to the front filter.

More specifically, to explain it with reference to FIG. 19, when a concavo-convex layer 11 is composed only of a layer of resin 9 which comprises light transparent fine particles 10 as shown in FIGS. 19(A) and 19(B), it is difficult to independently regulate the values "Sm", "θa" and "Rz", and it is particularly difficult to regulate "θa" independently of "Sm" and "Rz." Accordingly, it is also difficult to regulate these values in the ranges specified above.

For instance, suppose that a concavo-convex layer 11 is formed in the form as shown in FIG. 19(A) as a coating film of the resin 9 comprising light transparent fine particles, and the values "Sm", "θa" and "Rz" are determined by the light transparent fine particles. In order to decrease the value "θa" for example, which is one of the values determined by the concavo-convex layer in FIG. 19(A), it is necessary to, as shown in FIG. 19(B), increase the distance between light transparent fine particles 10 or to decrease the particle size of the light transparent fine particles. (FIG. 19(B) shows the case that both of the methods are used in combination). However, as is clear from FIG. 19(B), "Sm" becomes larger and "Rz" becomes smaller. It is difficult to change "θa" only without changing "Sm" and "Rz."

On the other hand, FIGS. 19(C) and 19(D) show the case where a surface shape modifying layer 12 is formed by coating a transparent resin further onto the surface of the concavo-convex layer in FIG. 19(A). In this case, as is clear from FIGS. 19(C) and 19(D), even after fixing the distance between light transparent fine particles 10 and adjacent light transparent fine particles 10, it is possible to increase or decrease the value "θa" with keeping other values unchanged or with keeping the change in other values as small as possible, by changing the thickness of the surface shape modifying layer, fluidity upon coating or coating conditions. Both FIGS. 19(C) and 19(D) show an example in which "θa" becomes smaller; however, in this case, "Sm" is remained the same and the change in "Rz" is relatively small. If the values of "Sm" and "Rz" are relatively large, the difference in "Sm" and in "Rz" before and after the formation of the surface shape modifying layer can be small. In the figures, for convenience of explanation, "Sm" represents the particle distance between specific particles, "Rz" represents the difference between peaks and troughs of concavoconvexes, and "θa" represents the angle between the surface of a coating film, which covers the vicinity of the light transparent fine particles, and the inner surfaces of a polyester film 2. These are enough for the explanation of physical significance is good; however, to be exact, "Sm", "θa" and "Rz" are representative values which are obtained by averaging the concavoconvexes formed with numerous particles all over the sufficient area, and these values do not always exactly correspond with those of each particle.

Moreover, in the surface shape modifying layer, fine concavoconvexes present along the concavo-convex shape on the scale of one-tenth or less of the concavo-convex scale (profile peak height of concavoconvexes and distance between profile peaks) in the surface roughness constituting the concavo-convex shape of the concavo-convex layer can be sealed for smoothing to form smooth concavoconvexes, or the distance between profile peaks of the concavoconvexes and peak profile height, and the frequency (number) of the profile peaks can be regulated. Further, various functions such as prevention of static charge, refractive index regulation, enhanced hardness and contamination prevention may be imparted to the surface shape modifying layer.

The thickness (on a cured state bases) of the surface shape modifying layer is preferably 0.6 μm or more and 15 μm or less. More preferably, the lower limit of the thickness is 3 μm or more, and the upper limit of the thickness is 8 μm or less. The thickness of the surface shape modifying layer is a value measured by the same method as that for measuring the thickness of the anti-glare layer by laser microscopy, SEM or TEM microscopy, which will be described below.

(Resin)

The resin (including a resin component such as a monomer and an oligomer) is preferably transparent, and specific examples thereof are classified into ionizing radiation curable resins which are curable upon exposure to ultraviolet light or electron beams, mixtures of ionizing radiation curing resins with solvent drying-type resins, or heat curing resins. Preferred are ionizing radiation curing resins.

Specific examples of ionizing radiation curable resins include those described above in connection with the concavo-convex layer.

A photopolymerization initiator, a photopolymerization accelerator, a photosensitizer, a solvent-drying type resin or the like, which is mixed with ionizing radiation curable resins if necessary, may be those as described above in connection with the concavo-convex layer.

The surface shape modifying layer may comprise organic or inorganic fine particles which regulate fluidity. Preferred is colloidal silica. Conventionally, an attempt to form the surface shape modifying layer to seal fine concavoconvexes for smoothing leads to an excess smoothing, thereby resulting in a significant deterioration in anti-glare properties. However, when a coating film is formed from a composition containing the colloidal silica, it is possible to achieve both of anti-glare properties and black color reproduction in combination. Although it is not clear how such an effect is obtained, it is presumed as follows. That is, by regulating the fluidity of the composition containing colloidal silica, the composition exhibits excellent followability to a concavo-convex shape on the surface. For this reason, when smoothing, the composition containing colloidal silica can impart moderate smoothness to fine concavoconvexes formed on a concavo-convex base layer, which are completely sealed in the case of using the conventional surface shape modifying layer, thus leaving the concavoconvexes without completely sealing them.

There is no particular limitation on the shape of organic or inorganic fine particles usable as the fluidity regulator. It may be of any of, for example, a spherical shape, a plate-like shape, a fibrous shape or an amorphous hollow shape. A particularly preferred fluidity regulator is colloidal silica.

In the present invention, the term "colloidal silica" refers to colloidal solution comprising colloidal silica particles dispersed in water or organic solvent. Preferably, a particle size (diameter) of colloidal silica is in the range of ultrafine particles of about 1 to 50 nm. The particle size of colloidal silica in the present invention is the average particle size measured by the BET method (average particle size calculated by measuring a surface area by the BET method and converting the same assuming that particles are perfect spherical).

Examples of the colloidal silica include known and commercially available products such as "methanol silica sol", "MA-ST-M", "IPA-ST", "EG-ST", "EG-ST-ZL", "NPC-ST", "DMAC-ST", "MEK", "XBA-ST" and "MIBK-ST" (product names; manufactured by: Nissan Chemical Industries, Ltd.), "OSCAL1132", "OSCAL1232", "OSCAL1332", "OSCAL1432", "OSCAL1532", "OSCAL1632" and "OSCAL1132" (product names; manufactured by: Catalysts & Chemicals Industries Co., Ltd.)

Preferably, the above organic fine particles or inorganic fine particles contains a fine particle mass of 5 to 300, based on 100 mass of a binder resin contained in the surface shape modifying layer (mass of fine particles/mass of binder resin=P/V ratio=5 to 300/100). This range is preferred since if less than 5, followability to a concavo-convex shape may become insufficient, possibly resulting in difficulty in obtaining both of anti-glare properties and black color reproduction such as glossy black feeling in combination. If more than 300, physical properties such as adhesion and scratch resistance may get poor. The added amount varies depending on the type of fine particles to be used. In the case of colloidal silica, the added amount is preferably from 5 to 80. The range of 80 or less is preferred since the addition of an amount of more than 80 causes no change in anti-glare properties and is thus meaningless; moreover an amount of more than 80 causes poor adhesion to the underlying layer.

(Preparation Method of Surface Shape Modifying Layer)

The surface shape modifying layer may be formed by applying a composition for a surface shape modifying layer onto the concavo-convex layer. Methods usable for coating the composition for a surface shape modifying layer include, for example, roll coating, Mayor bar coating and gravure coating. After coating the composition for a surface shape modifying layer, the coating is dried and cured by ultraviolet radiation. Specific examples of ultraviolet sources include ultra-high-pressure mercury lamps, high-pressure mercury lamps, low-pressure mercury lamps, carbon arc lamps, black light fluorescent lamps and metal halide lamps. Regarding the wavelength of the ultraviolet light, a wavelength range from 190 to 380 nm may be used. Specific examples of electron beam sources include various electron beam accelerators such as Cockcroft-Walton accelerators, Van de Graaff accelerators, resonance transformer accelerators, insulated core transformer accelerators, linear accelerators, Dynamitron accelerators and high-frequency accelerators.

[Low Refractive Index Layer]

The low refractive index layer is a layer which functions to decrease the refractive index of external light (e.g. fluorescent light, natural light) using the light interference effect in a multilayer film, when the external light is reflected on the surface of an optical laminate. In a preferred embodiment of the anti-glare layer according to the present invention, it is a low refractive index layer formed on a concavo-convex layer of mono-layered structure or on a surface of a surface shape modifying layer and concavo-convex layer comprising two or more layers. The low refractive index layer has a lower refractive index than the underlying layer.

In accordance with a preferred embodiment of the present invention, it is preferable to have a constitution in which the refractive index of the concavo-convex layer or surface shape modifying layer adjacent to the low refractive index layer is 1.5 or more, and the refractive index of the low refractive index layer is 1.45 or less and more preferably 1.42 or less.

Preferably, the low refractive index layer may be composed of any of 1) a resin containing silica or magnesium fluoride, 2) a fluorine resin which is a resin having a low refractive index, 3) a fluorine resin containing silica or magnesium fluoride and 4) a thin film of silica or magnesium fluoride. Resins other than fluorine resins usable herein may be the same as those used to form the concavo-convex layer.

As the fluorine resin, a polymerizable compound containing a fluorine atom at least in a molecule or a polymer thereof may be used. The polymerizable compound is not particularly limited; however, a polymerizable compound having a curable and reactive group such as a functional group curable with ionizing radiation and a thermosetting polar group is preferable. Further, compounds having these reactive groups simultaneously together may also be used. In contrast to this polymerizable compound, the polymer is that having no reactive group as described above.

As the polymerizable compound having an ionizing radiation-curable group, fluorine-containing monomers having an ethylenically unsaturated bond may be widely employed. More specifically, fluoroolefins (for example, fluoroethylene, vinylidene fluoride, tetra fluoroethylene, hexafluoropropylene, perfluorobutadiene, perfluoro-2,2-dimethyl-1,3-dioxole, etc.) can be exemplified. Examples of polymerizable compounds having a (meth)acryloyloxy group include (meth)acrylate compounds having a fluorine atom in a molecule, such as 2,2,2-trifluoroethyl (meth)acrylate, 2,2,3,3,3-pentafluoropropyl (meth)acrylate, 2-(perfluorobutyl)ethyl (meth)acrylate, 2-(perfluorohexyl)ethyl(meth)acrylate, 2-(perfluorooctyl)ethyl(meth)acrylate, 2-(perfluorodecyl)ethyl(meth)acrylate, α-trifluoro methyl methacrylate and α-trifluoro ethyl methacrylate; and fluorine-containing polyfunctional (meth)acrylate compounds having a C1-C14 fluoroalkyl, fluorocycloalkyl or fluoroalkylene group having at least three fluorine atoms, and at least two (meth)acryloyloxy groups in a molecule.

Preferred examples of the thermosetting polar group include hydrogen bond-forming groups such as a hydroxyl group, a carboxyl group, an amino group and an epoxy group. These groups are superior in not only the adhesion to a coating film but also the affinity for inorganic ultra-fine particles such as silica. Examples of the polymerizable compounds having a thermosetting polar group include 4-fluoroethylene-perfluoroalkyl vinyl ether copolymers; fluoroethylene-hydrocarbon vinyl ether copolymers; fluorine-modified products of various resins such as epoxy, polyurethane, cellulose, phenol and polyimide.

Examples of the polymerizable compounds having the ionizing radiation-curable group and the thermosetting polar group together include partly and fully fluorinated alkyl, alkenyl or aryl esters of acrylic acid or methacrylic acid, fully or partly fluorinated vinyl ethers, fully or partly fluorinated vinyl esters, and fully or partly fluorinated vinyl ketones and the like.

As the fluorine-containing polymer, for example, the followings can be listed.

Polymers of a monomer or a mixture of monomers, containing at least one fluorine-containing (meth)acrylate compound of the polymerizable compounds having the ionizing radiation-curable group; copolymers of at least one fluorine-containing (meth)acrylate compound and a (meth)acrylate compound containing no fluorine atom in a molecule such as methyl (meth)acrylate, ethyl (meth)acrylate, propyl (meth)acrylate, butyl (meth)acrylate and 2-ethylhexyl (meth)acrylate; homopolymers or copolymers of a fluorine-containing monomer like fluoroethylene, vinylidene fluoride, trifluoroethylene, chlorotrifluoroethylene, 3,3,3-trifluoropropylene, 1,1,2-trichloro-3,3,3-trifluoropropylene and hexafluoropropylene. Further, Silicone-containing vinylidene fluoride copolymers prepared by incorporating a silicone component into these copolymers are also usable. Examples of the silicone component in this case include (poly)dimethylsiloxane, (poly)diethylsiloxane, (poly) diphenylsiloxane, (poly)methylphenylsiloxane, alkyl-modified (poly)dimethylsiloxane, azo group-containing (poly) dimethylsiloxane, dimethylsilicone, phenyl methyl silicone, alkyl- or aralkyl-modified silicone, fluorosilicone, polyether-modified silicone, fatty acid ester-modified silicone, methyl hydrogen silicone, silanol group-containing silicone, alkoxy group-containing silicone, phenol group-containing silicone, methacryl-modified silicone, acrylic-modified silicone, amino-modified silicone, carboxylic acid-modified silicone, carbinol-modified silicone, epoxy-modified silicone, mercapto-modified silicone, fluorine-modified silicone and polyether-modified silicone. Especially, a silicone component having a dimethylsiloxane structure is preferred.

In addition, non-polymers or polymers comprising the following compounds may be used as fluorine resins. That is, there may be used compounds obtained by the reaction of a fluorine-containing compound having at least one isocyanato group in a molecule with a compound having in a molecule at least one functional group reactive with an isocyanato group such as an amino group, a hydroxyl group and a carboxyl group; compounds obtained by the reaction of a fluorine-containing polyol such as a fluorine-containing polyether polyol, a fluorine-containing alkyl polyol, a fluorine-containing polyester polyol and a fluorine-containing ∈-caprolactone-modified polyol with a compound having an isocyanato group; and the like.

The above polymerizable compounds or polymers having a fluorine atom may be used as a mixture with the resin components as disclosed above in connection with the method for forming a concavo-convex layer. Furthermore, curing agents for curing reactive groups or the like, various additives for improving coatability or imparting anti-fouling properties, or solvents may be appropriately used.

In a preferred embodiment of the present invention, the utilization of "void-containing fine particles" as a low-refractive index agent is preferred. "Void-containing fine particles" can lower the refractive index while maintaining the layer strength of the surface shape modifying layer. In the present invention, the term "void-containing fine particle" refers to a fine particle which has a structure comprising air filled into the inside of the fine particle and/or an air-containing porous structure and has such a property that the refractive index is lowered in reverse proportion to the proportion of air which occupies the fine particle as compared with the refractive index of the original fine particle. Further, such a fine particle which can form a nanoporous structure in at least a part of the inside and/or surface of the coating film by utilizing the form, structure, aggregated state, and dispersed state of the fine particle within the coating film, is also embraced in the present invention. When the fine particle is used for a low-refractive index layer, it is possible to regulate the refractive index within the range from 1.30 to 1.45.

Specific examples of preferred void-containing inorganic fine particles are silica fine particles prepared by the technique disclosed in Japanese Patent Application Laid-Open No. 2001-233611. Silica fine particles prepared by the technique disclosed in, for example, Japanese Patent Application Laid-Open Nos. H07-133105, 2002-079616 and 2006-106714 are also usable. The void-containing silica fine particles can easily produced. Further, the hardness of the void-containing silica fine particles is high. Therefore, when a low-refractive index layer is formed by using a mixture of the void-containing silica fine particles with a binder, the layer has improved strength and, at the same time, the refractive index can be regulated within the range from about 1.20 to 1.45. Hollow polymer fine particles produced by using the technique disclosed in Japanese Patent Application Laid-Open No. 2002-80503 are a specific example of preferred void-containing organic fine particles.

Fine particles which can form a nanoporous structure in at least a part of the inside and/or surface of the coating film include, in addition to the above silica fine particles, sustained release materials which have been produced for increasing the specific surface area and adsorb various chemical substances on a packing column and the porous part of the surface, porous fine particles used for catalyst fixation purposes, or dispersions or aggregates of hollow fine particles to be incorporated in heat insulating materials or low-dielectric materials. Specific examples of such fine particles include commercially available products, for example, aggregates of porous silica fine particles selected from Nipsil and Nipgel (product names; manufactured by: Nippon Silica Industrial Co., Ltd.) and colloidal silica UP series (product name; manufactured by: Nissan Chemical Industries Ltd.) having such a structure that silica fine particles are connected to one another in a chain form. Fine particles in the preferred particle size range specified in the present invention may be selected from the above fine particles.

The average particle size of the "void-containing fine particles" is from 5 nm or more and 300 nm or less. Preferably, the lower limit of the average particle size is 8 nm or more, and the upper limit of the average particle size is 100 nm or less. More preferably, the lower limit of the average particle size is 10 nm or more, and the upper limit of the average particle size is 80 nm or less. When the average size of the fine particles is in the above-defined range, excellent transparency can be imparted to the low refractive index layer.

(Preparation of Low Refractive Index Layer)

In forming the low refractive index layer, it is preferable to regulate the viscosity of the resin composition within the range from 0.5 to 5 cps (25° C.), where the resin composition can attain preferable coatability, and preferably from 0.7 to 3 cps (25° C.). By regulating the viscosity properly, an anti-reflection film excellent for visible light can be realized, an evenly applied thin film can be formed, and a low refractive index layer having particularly excellent adhesion to the substrate can be formed.

Means for curing a resin may be the same as those described above in connection with the concavo-convex layer. When a heating means is used for curing the resin, a thermal polymerization initiator, which generates, for example, radicals when heated and initiates the polymerization of a polymerizable compound, is preferably added to a fluorine resin composition.

Preferably, a thickness "$d_A$" (nm) of the low refractive index layer satisfies the following formula (V):

$$d_A = m\lambda/(4n_A) \quad \text{Formula V}$$

wherein "$n_A$" represents a refractive index of the low refractive index layer; "m" represents a positive odd number and is preferably 1; and "λ" represents a wavelength and is preferably a value in the range from 480 to 580 nm.

Further, in the present invention, it is preferable from the viewpoint of reducing the refractive index that the low refractive index layer satisfies the following formula (VI):

$$120 < n_A d_A < 145 \quad \text{Formula VI}$$

[Additives]

Each of the above layers may further have a different function and may be formed with, for example, a composition containing one or more kinds of function additional components selected from the group consisting of an anti-static agent, a refractive index modifier, an anti-fouling agent and a hardness modifier. Among the above layers, the function additional component is preferably incorporated in the surface shape modifying layer.

(I) Anti-Static Agent (Conductive Agent)

When an anti-static agent is contained in the surface shape modifying layer, especially in each of the above layers, dust adhesion to the surface of the optical laminate can be effectively prevented. Specific examples of anti-static agents include cationic group-containing various cationic compounds such as quaternary ammonium salts, pyridinium salts, primary, secondary and tertiary amino groups, anionic group-containing anionic compounds such as sulfonic acid bases, sulfuric ester bases, phosphoric ester bases and phosphoric acid bases, amphoteric compounds such as amino acid and aminosulfuric ester compounds, nonionic compounds such as amino alcohol, glycerin and polyethylene glycol compounds, organometallic compounds such as alkoxides of tin and titanium, and metal chelate compounds such as acetylacetonate salts thereof. Further, compounds produced by increasing the molecular weight of the above compounds may also be mentioned. Further, polymerizable compounds such as monomers or oligomers, which contain a tertiary amino group, a quaternary ammonium group, or a metallic chelate moiety and are polymerizable upon exposure to ionizing radiations, or organometallic compounds such as functional group-containing coupling agents may also be used as the anti-static agent.

Further, conductive ultrafine particles may be mentioned as the anti-static agent. Specific examples of conductive ultrafine particles include ultrafine particles of metal oxides. Such metal oxides include ZnO (refractive index: 1.90; the numerical values within the parentheses being refractive index; the same shall apply hereinafter), $CeO_2$ (1.95), $Sb_2O_2$ (1.71), $SnO_2$ (1.997), indium tin oxide often abbreviated to "ITO" (1.95), $In_2O_3$ (2.00), $Al_2O_3$ (1.63), antimony-doped tin oxide (abbreviated to "ATO", 2.0) and aluminum-doped zinc oxide (abbreviated to "AZO", 2.0). The term "fine particles" refers to fine particles having a size of 1 micrometer or less, that is, fine particles of submicron size, preferably fine particles having an average particle size from 0.1 nm to 0.1 μm. Ultrafine particles having an average particle size in this range is preferred since, when dispersed in a binder, such ultrafine particles can produce a composition from which a highly transparent film having almost no haze and an excellent total light transmittance can be formed. The average particle size of the conductive metal oxide ultrafine particles can be measured by dynamic light scattering method, for example.

Conductive polymers may be mentioned as the anti-static agent, and specific examples thereof include aliphatic conjugated polyacetylenes, aromatic conjugated poly(paraphenylenes), heterocyclic conjugated polypyrroles, polythiophenes, heteroatom-containing conjugated polyanilines and mixture-type conjugated poly(phenylenevinylenes). Additional examples of conductive polymers include double-chain conjugated systems which are conjugated systems having a plurality of conjugated chains in the molecule thereof, and conductive composites which are polymers prepared by grafting or block-copolymerizing the above conjugated polymer chain onto a saturated polymer.

Preferably, the amount of the anti-static agent added is from 5 to 250% by mass with respect to the amount of the binder resin (except solvent). More preferably, the upper limit of the added amount is 100 or less, and the lower limit of the added amount is 7 or more. It is preferable to regulate the added amount within the above range since such transparency that is required for the optical laminate can be maintained, and anti-static performance can be imparted without negatively affecting properties such as glossy black feeling and anti-glare properties.

In a different embodiment of the present invention, an anti-static layer (conductive layer) may be formed as an optional layer between layers comprising the anti-glare layer of the present invention.

Specific examples of methods for forming the anti-static layer includes a method for forming an evaporated film by evaporating or sputtering, for example, an conductive metal or conductive metal oxide onto the upper surface of any of the layers comprising the anti-glare layer, or a method for forming a coating film by applying a resin composition comprising conductive fine particles dispersed in a resin.

When the anti-static layer is formed by evaporation, examples of usable anti-static agents include antimony-doped indium tin oxide (hereinafter abbreviated to "ATO") and indium tin oxide (hereinafter abbreviated to "ITO"). The thickness of an evaporated film as the anti-static layer is 10 nm or more and 200 nm or less. Preferably, the upper limit of the thickness is 100 nm or less, and the lower limit of the thickness is 50 nm or less.

The anti-static layer may be formed with a coating solution containing an anti-static agent. In this case, usable anti-static agents may be the same as those disclosed in the description of anti-static agents as a function additional component. Curable resins are preferably used when using conductive fine particles to form a coating film. Curable resins may be the same as those for forming the concavo-convex layer. To form a coating film, a coating solution is prepared by incorporating conductive fine particles in a curable resin, and is coated by coating methods such as roll coating, Mayor bar coating and gravure coating. After coating the coating solution, the coating is dried and cured by ultraviolet radiation.

Applying ultraviolet light or electron beams is a method for curing ionizing radiation-curable resin compositions. When curing by electron beams, for example, electron beams having an energy from 100 KeV to 300 KeV is used. When curing by ultraviolet light, ultraviolet light emitted from light sources such as ultra-high-pressure mercury lamps, high-pressure mercury lamps, low-pressure mercury lamps, carbon arc lamps, xenon arc lamps and metal halide lamps is used.

(II) Refractive Index Modifier

The refractive index modifier may be added to the surface shape modifying layer to control the anti-reflection properties imparted to the surface of the anti-glare layer. Examples of such refractive index modifier include low refractive index agents, medium refractive index agents and high refractive index agents.

(II-a) Low Refractive Index Agent

The low refractive index agent has a lower refractive index than the anti-glare layer. In a preferred embodiment of the present invention, the anti-glare layer has a refractive index of 1.5 or more, and the low refractive index agent has a refractive index of less than 1.5, preferably 1.45 or less. Specifically, low refractive index agents as disclosed above in connection with the low refractive index layer may be preferably used.

Preferably, the surface shape modifying layer mixed with a low refractive index agent has a thickness of more than 1 μm. This is because this layer will be the outermost layer and requires scratch resistance and hardness, therefore.

(II-b) High Refractive Index Agent/Medium Refractive Index Agent

The high refractive index agent and the medium-refractive index agent may be added to the surface shape modifying layer to further improve anti-reflective properties. The refractive index of the high refractive index agent and medium refractive index agent may be set in the range from 1.46 to 2.00. The medium refractive index agent has a refractive index in the range from 1.46 to 1.80, and the refractive index of the high refractive index agent is in the range from 1.65 to 2.00.

These refractive index agents include fine particles, and specific examples thereof (the numerical value within the parentheses being a refractive index) include zinc oxide (1.90), titania (2.3 to 2.7), ceria (1.95), tin-doped indium oxide (1.95), antimony-doped tin oxide (1.80), yttria (1.87) and zirconia (2.0).

(III) Leveling Agent

A leveling agent may be added to the surface shape modifying layer. Preferred leveling agents include fluorine-type or silicone-type leveling agents. The surface shape modifying layer mixed with the leveling agent can realize a good coated face, and can impart improved coatability, slidability and anti-fouling properties to the surface of the coating film during coating or drying and, at the same time, can impart scratch resistant effect.

(IV) Anti-Fouling Agent

An anti-fouling agent may be added to the surface shape modifying layer. The anti-fouling agent is mainly used to prevent the contamination of the outermost surface of the optical laminate and can impart scratch resistance to the optical laminate. Specific examples of effective anti-fouling agents include additives which can develop water repellency, oil repellency and fingerprint wiping-off properties. More specific examples of anti-fouling agents include fluoro compounds and silicon compounds or mixtures of these compounds. More specific examples thereof include fluoroalkyl group-containing silane coupling agents such as 2-perfluorooctylethyltriaminosilane. Among them, amino group-containing compounds are particularly preferred.

(V) Hardness Modifier (Curability Enhancing Agent)

A hardness modifier (curability enhancing agent) may be added to the surface shape modifying layer in order to impart scratch resistance effect. Specific examples of hardness modifiers include ionizing radiation-curable resins, which are incorporated with any one or two or more kinds of the following polyfunctional (meth)acrylate prepolymers and tri- or more functional (meth)acrylate monomers. Examples of polyfunctional (meth)acrylate prepolymers include polyester (meth)acrylate, urethane (meth)acrylate and epoxy (meth) acrylate. Examples of tri- or more functional (meth)acrylate monomers include trimethylolpropane tri(meth)acrylate, pentaerythritol tetra(meth)acrylate and dipentaerythritol hexa(meth)acrylate.

The anti-glare layer is composed of a concavo-convex layer and, as needed, a surface shape modifying layer and a low refractive index layer. The anti-glare layer may be further provided with an optional layer containing the above additives, such as an anti-static layer and an anti-fouling layer. The anti-static layer and the anti-fouling layer may be formed by the steps of: preparing a composition comprising a resin mixed with an anti-static agent, anti-fouling agent or the like; coating the composition to form an anti-static layer or an anti-fouling layer; and drying the same for curing, if necessary.

The thickness of the whole anti-glare layer is 5 μm or more and 25 μm or less. Preferably, the lower limit of the thickness is 6 μm or more, and the upper limit of the thickness is 20 μm or less.

When the anti-glare layer is composed of a concavo-convex layer only, the thickness of the anti-glare layer refers to the thickness of the concavo-convex layer. When the anti-glare layer is a multilayer structure comprising a surface shape modifying layer and other optical function layers stacked onto the concavo-convex layer, the thickness of the anti-glare layer refers to the thickness of the whole of the layers stacked. That is, it is the thickness between the display surface-side interface of the substrate and the outermost surface of the anti-glare concavo-convex in contact with the air.

The thickness of the anti-glare layer can be obtained, for example, in such a manner that a confocal laser scanning microscope (product name: Leica TCS-NT, magnification: 100× to 1,000×; manufactured by: Leica) is used to observe the section of an optical laminate for determination of the presence of an interface; for one image plane, a thickness from the substrate to the peak of the highest convex portion and another thickness from the substrate to the valley of the lowest concave portion are measured (that is, two points in total), and this measurement is carried out for five image planes, that is, 10 points in total; and the average value is determined therefrom, thereby obtaining the thickness of the anti-glare layer. To obtain clear images having no halation, the confocal laser scanning microscope is equipped with a wet objective lens at the time of measurement; moreover, about 2 ml of oil having a refractive index of 1.518 is applied on the optical laminate to eliminate a layer of air between the objective lens and the optical laminate, followed by observation and evaluation.

In the cross section observation by TEM or SEM, an average value can be calculated through the observation of five image planes by the same method as a laser scanning microscope.

<Functional Layer>

The functional layer is a layer that is essential to the front filter of the present invention, and one or more functional layers are provided on the display device-side surface of the front filter. Various functions can be imparted to the front filter by including, in each functional layer, any one or more of functions which includes optical functions such as a near-infrared absorbing function, a neon light absorbing function, a color adjusting function and ultraviolet absorbing function, and other functions such as an electromagnetic shielding function, an adhesive function and an impact-resistant function. The functional layer may be independent layers. For example, when two functions including a near-infrared absorbing function and a neon light absorbing function are required to be imparted, a total of two layers including one near-infrared absorbing layer and one neon light absorbing layer may be provided. However, to decrease the thickness of the whole front filter, the number of required processes and the price, it is preferable that one functional layer functions as several functional layers, or that one functional layer functions as several functional layers and also as a non-functional layer. For example, if, in the case of imparting two functions of a near-infrared absorbing function and a neon light absorbing function, a near-infrared absorbing agent and a neon light absorbing agent are contained in an adhesive layer for attaching the front filter to the surface of a display device, a near-infrared absorbing layer, a neon light absorbing layer and an adhesive layer can be combined together into one single layer.

[Near-Infrared Absorbing Layer]

The near-infrared absorbing layer may be a film formed with a composition prepared by incorporating a near-infrared absorbing dye in a binder, a layer formed by coating the composition onto a transparent substrate, a transparent substrate incorporated with the near-infrared absorbing dye, or an adhesive or adhesive layer incorporated with the near-infrared absorbing dye. Usable near-infrared absorbing dyes are those which can absorb near-infrared rays derived from xenon gas discharge emitted from a plasma display panel, that is, near-infrared rays in the wavelength range from 800 nm to 1,100 nm, when an optical filter is provided on the front surface of a plasma display panel. Preferably, near-infrared rays in this wavelength range have a transmittance of 20% or less, more preferably 10% or less. At the same time, a Near-infrared absorbing filter preferably has a sufficient light transmittance in a visible light range, which is the wavelength range from 380 nm to 780 nm.

Specific Examples of near-infrared absorbing dyes include organic near-infrared absorbing dyes such as polymethine compounds, cyanine compounds, phthalocyanine compounds, naphthalocyanine compounds, immonium compounds, diimmonium compounds, dithiol metal complexes, and inorganic near-infrared absorbing dyes such as tungsten hexachloride and fine particles of composite tungsten oxides. These compounds and dyes may be used solely or in combination of two or more kinds.

The fine particles of composite tungsten oxides are particles represented by the general formula "MxWyOz", wherein element M is one or more kinds of elements selected from the group consisting of H, He, alkaline metals, alkaline-earth metals, rare-earth elements, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi and I; W is a tungsten; O is oxygen; $0.001 \leq x/y \leq 1.1$; and $2.2z/y \leq 3.0$. From the viewpoint of transparency of the near-infrared absorbing layer, fine particles of composite tungsten oxides preferably has an average dispersed particle size of 800 nm or less, more preferably 200 nm or less, particularly preferably 100 nm or less. Herein, the average dispersed particle size refers to the volume average particle size and can be measured by using a particle size distribution and particle size distribution measuring device (such as a particle size distribution analyzer "Nanotrac" (product name), manufactured by NIKKISO Co., Ltd.) As compounds represented by the general formula "MxWyOz", for example, compounds of which M element is Cs (cesium) element (cesium tungsten oxides) are preferably used. Fine particles of composite tungsten oxides are preferably used from the viewpoint that changes in spectral characteristics, which are due to the deterioration of near-infrared absorbing dyes, are unlikely to occur even after a long period of use, especially even after a long period of use at high temperature or high humidity.

Usable binder resins include resins such as polyester resins, polyurethane resins, acrylic resins and epoxy resins.

When providing a near-infrared absorbing layer, an ultraviolet absorbing agent is preferably incorporated in any of the layers which are closer to an observer than the near-infrared absorbing layer, in order to prevent a near-infrared absorbing dye from decomposition due to ultraviolet light contained in external light.

[Neon Light Absorbing Layer]

When the optical front filter is used for a plasma display, the neon light absorbing layer is provided to absorb the neon light emitted from a plasma display panel, that is, the emission spectrum of neon atoms. The emission spectrum range of neon light is the wavelength range from 550 to 640 nm. Thus, a neon light absorbing filter is preferably designed to have a spectral transmittance of 50% or less at a wavelength from 550 to 640 nm. For example, the neon light absorbing filter may be a coating film formed with a composition prepared by dispersing a dye, which is a conventionally used dye having an absorption maximum in the wavelength range from 550 to 640 nm, in such a binder resin as described above in connection with the near-infrared absorbing filter. Also, the neon light absorbing filter can be formed by incorporating the dye in a transparent substrate, or by incorporating the dye in an adhesive or adhesive layer. Specific examples of the dye include cyanine dyes, oxonol dyes, methine dyes, subphthalocyanine dyes and porphyrin dyes such as tetraazaporphyrin. Tetraazaporphyrin is especially preferred from the viewpoint of, for example, durability under various environments and compatibility with neon band absorptivity and transparency of visible light at other wavelengths.

[Color Adjusting Layer]

The color adjusting layer adjusts the color of the front filter for a plasma display to improve, for example, the color purity of light emitted from the display, the range of color reproduction, or the color of a display when the display is turned off. For example, the color adjusting layer may be a film formed with a composition prepared by dispersing a color adjusting dye in a binder resin. Also, the color adjusting layer can be formed by coating the composition onto a transparent substrate or different functional filter, by incorporating the dye in a transparent substrate, or by incorporating the dye in an adhesive or adhesive layer. Usable color adjusting dyes include publicly known dyes having a maximum absorption wavelength in the visible range from 380 to 780 nm. These dyes may be used in combination depending on the intended purpose. Publicly known dyes which are suitably usable as color adjusting dyes include, for example, dyes disclosed in Japanese Patent Application Laid-Open (JP-A) Nos. 2000-275432, 2001-188121, 2001-350013 and 2002-131530. In addition, dyes which can absorb visible light such as yellow light, red light and blue light may be used, including anthraquinone dyes, naphthalene dyes, azo dyes, phthalocyanine dyes, pyrromethene dyes, tetraazaporphyrin dyes, squarylium dyes and cyanine dyes, for example. As the binder resin, those as described above in connection with the near-infrared absorbing filter may be used.

[Ultraviolet Absorbing Layer]

The ultraviolet absorbing layer may be a coating film formed by coating a composition prepared by dispersing an ultraviolet absorbing agent in a binder resin onto a transparent substrate, for example. Also, the ultraviolet absorbing layer can be formed by incorporating the ultraviolet absorbing agent in a transparent substrate, or incorporating the ultraviolet absorbing agent in an adhesive or adhesive layer. Examples of ultraviolet absorbing agents include those comprising organic compounds such as benzotriazole compounds and benzophenone compounds, and those comprising inorganic compounds such as particulate zinc oxide and cerium oxide. As the binder resin, those as described above in connection with the near-infrared absorbing filter may be used.

[Transparent Electrical Conductor Layer]

The transparent electrical conductor layer in the front filter of the present invention refers to a layer having both of electromagnetic shielding performance and visible light transmission performance. The transparent electrical conductor layer may be a layer consisting of a continuous body of a substance and having visible light (or simply referred to as light) transparency. Also, it may be a layer which comprises a nontransparent material but is meshed and imparted with light transparency, therefore. The light transparency required is a total light transmittance of 50% or more, more preferably a total light transmittance of 80% or more.

There is no particular limitation on the material and shape of the transparent electrical conductor layer, and conventionally known, light transparent electrical conductor layers for electromagnetic shielding filters may be properly adopted. A representative example of the transparent electrical conductor layer is a mesh-shaped layer formed by etching a metal layer (metal foil) stacked on a transparent substrate with an adhesive layer or the like. Other examples of the transparent electrical conductor layer include a transparent electrical conductor layer being originally formed in mesh shape on a transparent substrate by conductive ink printing or metal plating, or a transparent electrical conductor layer formed in such a manner that first a transparent electrical conductor layer is formed all over a transparent substrate by one or more physical or chemical forming methods such as vapor deposition, sputtering and plating, and then the layer is subjected to etching to form a mesh-shaped transparent electrical conductor layer. It is also possible to form a mesh-shaped transparent electrical conductor layer by patterning a metal foil by etching before the foil is stacked on a transparent substrate sheet. Then, the thus-obtained, mesh-shaped electrical conductor layer per se is stacked on a transparent substrate sheet with an adhesive or the like.

In the case of conductive ink printing method, usable as the conductive ink are materials prepared by dispersing particles of conductive materials in binder resins of acrylic resins, polyester resins, urethane resins or the like. Examples of conductive materials include metals such as silver, copper and nickel, and graphite, each having an average particle size from about 1 to 10 μm. Preferred shapes of conductive particles include, for example, scale-like, needle-like and polyhedron-like shapes. Usable printing methods include intaglio printing, silk screen printing and the like.

Also, transparent electrical conductor layers of full coating films of light transparent substances include, for example, coating films formed by vapor deposition of silver, ITO (indium tin oxide) or the like on a transparent substrate.

There is no particular limitation on the transparent electrical conductor layer so far as materials having sufficient conductivity to develop electromagnetic shielding performance are used therefor. In general, in terms of good conductivity, preferred are metal layers. As mentioned above, metal layers can be formed by vapor deposition, plating, lamination of a metal foil, or the like. Examples of metallic materials for metal layers or metal foils include gold, platinum, silver, copper, iron, tin, nickel and chromium.

Usable metals for metal layers also include alloys. Metal layers may be either of a mono-layered structure or of a multi-layered structure. For example, in the case of iron, preferred are low-carbon steels such as low-carbon rimmed steels and low-carbon Al-killed steels, Ni—Fe alloys, invar alloys, or the like. In the case of copper, usable metal materials include copper and copper alloys, and usable copper foils include rolled copper foils and electrolytic copper foils. Preferred are electrolytic copper foils in terms of, for example, thinness, evenness and adhesion to a blackened layer.

The thickness of the mesh-shaped electrical conductor layer of metal layer is from about 1 to 50 μm, preferably 2 to 15 μm. If less than the range, electric resistance increases and it becomes difficult to obtain sufficient electromagnetic shielding performance. If more than the range, it becomes difficult to obtain a highly precise mesh shape, thereby decreasing the evenness of the mesh shape.

When the mesh-shaped electrical conductor layer is required to improve the adhesion to the adjacent layer, such as a transparent adhesive layer for adhering and stacking the electrical conductor layer to a transparent substrate, one corresponding surface of two surfaces of a metal layer which is adopted to be the mesh-shaped electrical conductor layer can be a rough surface.

The surface roughness of the corresponding surface is, when the roughness profile is adopted as the profile of the surface of a metal layer which will be the mesh-shaped electrical conductor layer, represented by the ten-point average roughness (JIS B0601 (1994)) of the profile, and is preferably from about 0.5 to 1.5 μm.

(Blackening Treatment)

In the case that the transparent electrical conductor layer is a transparent electrical conductor layer in the form of a mesh (hereinafter, it may be referred to as "mesh-shaped electrical conductor layer"), blackening treatment may be performed thereon to form a blackened surface, in order to prevent light reflection on the surface of the transparent electrical conductor layer. The blackened surface prevents a decrease in the black level of perspective images, which is caused by the external light reflection on the surface of the mesh-shaped electrical conductor layer, and contributes to glossy black feeling (prevention of whitening). It also improves bright room (or bright environment) contrast of perspective images and thus increases visibility of images on a display. Providing such a blackened surface to at least the observer-side surface of a plasma display can further enhance the effect of improving reflection prevention, glossy black feeling and bright room contrast, with the aid of the anti-glare layer of the present invention. Preferably, the blackened surface is provided onto all surfaces of the line part (linear area) of the mesh-shaped electrical conductor layer. In the present invention, however, among both the front and back surfaces, at least the surface on the observer's side is subjected to a blackening treatment to be a blackened surface. This is because the observer's side is also the external light incoming side. Further, blackening treatment may be performed on the surface opposite to the surface to which the mesh-shaped electrical conductor layer is adhered, or on the side surfaces (both or either of the side surfaces). The blackened layer is preferably formed at least on the observer's side. However, when the layer is provided on the display side, stray light emitted from a display is reduced and thus a further increase in image visibility can be achieved. When the side surfaces of the line part are also blackened, it is possible to prevent unnecessary reflection of external or image light reflected on the side surfaces and thus to achieve a further increase in visibility.

In the case that the transparent electrical conductor layer is a mesh-shaped metal layer, the metal layer is blackened by roughening the surface of metal layers, by imparting light absorptivity over all visible light spectra (blackening) or by using both methods in combination. Especially, when a light absorbing (black) layer is formed as a specific means to realize the blackened layer, the resultant layer is referred to as "blackened layer." More specifically, blackening treatment may be carried out in such a manner that a blackened layer is additionally provided by plating or the like on the mesh-shaped electrical conductor layer. It is also possible to change a layer constituting the surface into a blackened layer by etching the layer from the layer surface to the inside of the layer.

In the case that the transparent electrical conductor layer is a mesh formed by electrically conductive ink printing, suitable blackening treatment are that black conductors such as graphite is used as electrical conductor particles contained in conductive inks, or that black pigments (no electrical conductivity is essential) is further added to conductive inks containing metallic conductor particles to diminish metallic luster for blackening. Examples of usable black pigments include carbon black (India ink) and black iron oxide (iron black).

Blackened layers usable in the present invention are just required to be those which are in dark colors with a low visible light reflectance, such as black, dark gray, brown, navy and dark green, and satisfy the basic properties such as adhesion. Publicly known blackened layers may be properly adopted.

(Corrosion-Resistant Layer)

The mesh-shaped electrical conductor layer may be appropriately provided with other layer(s) or subjected to other treatment(s) as needed. For example, when durability against corrosion is not enough, a corrosion-resistant layer may be provided. In the present invention, as well as the above-mentioned blackened layer, a corrosion-resistant layer is recognized as a constituent layer included in the mesh-shaped electrical conductor layer in so far as being of mesh shape, which is a shape characteristic of the mesh-shaped electrical conductor layer of the present invention.

There is no particular limitation on, for example, inorganic materials such as metals, organic materials such as resins, and combinations thereof so far as corrosion-resistant layers which are more resistant to corrosion than mesh-shaped electrical conductor layers to be covered therewith are obtained. In some cases, covering a blackened layer with a corrosion-resistant layer can prevent the particles of the blackened layer from dropping or deformation, and can increase the blackness of the blackened layer. Therefore, in the present invention, a corrosion-resistant layer is preferably provided on the blackened layer on the side to be adhered to a transparent resin substrate, in terms of prevention of dropping or deformation of a blackened layer.

Usable corrosion-resistant layers may be publicly known corrosion-resistant layers. Example of such layers include layers of metals such as chromium, zinc, nickel, tin and copper, layers of alloys, or layers of metallic compounds such as metallic oxides. These layers may be formed by publicly known plating methods or the like. An example of corrosion-resistant layers which are preferred in terms of corrosion effect, adhesion and so on, is layers of chromium compounds, which are formed by subjecting zinc plated layers to chromate treatment. Silicone compounds such as silane-coupling agents may be incorporated in corrosion-resistant layers for improved acid resistance upon etching or acid washing.

The shape of the mesh of the mesh-shaped electrical conductor layer may be any shape, and is not particularly limited. A representative example of the shape of the openings of the mesh is square.

The bias angle (angle between the mesh part of the mesh and the outer periphery of an electromagnetic shielding filter) may be appropriately set so as not to cause moire phenomenon, in view of pixel pitch or light emitting properties of displays.

The mesh-shaped electrical conductor layer may be a layer having a mesh structure all over the front filter. Also, it may be a layer having a part, which is in need of light transparency, shaped into a mesh shape and other parts (for example, a part surrounding all four sides of the mesh part like a frame)

shaped into a non-mesh shape. A non-meshed area is a part other than the mesh-shaped area, and it is a surface area which needs no light transparency and, as described above, is normally used as a ground area. The specific size of the non-meshed area varies depending on the ways of use. When the area is in the form of a frame and used as a ground part or outer frame, the width of the frame is from about 10 to 30 mm, and is generally especially from 10 to 15 mm.

[Adhesive Layer]

An adhesive layer may be used to adhere the above layers to each other. There is no particular limitation on the kinds of materials, etc., so far as adhesive layers capable of adhering layers to be adhered to each other can be obtained.

However, the adhesive layer is preferred to have anti-etching properties when the embodiment of the mesh-shaped electrical conductor layer is such that a metal foil is adhered to a transparent substrate via an adhesive layer, and then the metal foil is shaped into a mesh shape by etching.

More specifically, preferably used are polyurethane resins such as polyester urethane, acrylic urethane and polyether urethane, acrylic resins, polyester resins, polyvinyl alcohols or partially saponified products thereof, vinyl chloride-vinyl acetate copolymers, ethylene-vinyl acetate copolymers, polyimide resins, epoxy resins, or the like. Adhesive layers used for the present invention may be of ultraviolet curing type or of thermosetting type. Especially preferred are acrylic resins or polyester resins from the viewpoint of, for example, adhesion to a transparent substrate and compatibility or dispersibility with neon light absorbing dyes or the like.

A metal foil for forming a mesh-shaped electrical conductor layer can be adhered to a transparent substrate sheet via an adhesive layer, by dry lamination or the like. The thickness of the adhesive layer is preferably in the range from 0.5 μm to 50 μm, especially preferably in the range from 1 μm to 20 μm. This is because, for example, a transparent sheet and a mesh-shaped electrical conductor layer can be firmly adhered to each other, or in the process of etching for forming a mesh-shaped electrical conductor layer, a transparent substrate sheet can be prevented from being affected by an etching solution, such as iron oxide.

The adhesive layer may contain one or more kinds of the above-mentioned near-infrared absorbing agents, neon light absorbing agents and color adjusting dyes, and/or one or more kinds of ultraviolet absorbing agents. Such addition is preferred because one layer can function as plurality of layers and this layer can be integrated with an adhesive layer; therefore, the total thickness, number of steps, and cost of the front filter can be reduced.

[Impact Resistant Layer]

The impact resistant layer may be provided on the display device-side surface of the front filter from the viewpoint of an increased impact resistant effect. Preferred impact resistant layers include those formed from, for example, acrylic resins, rubber resins, silicone resins, vinyl resins, urethane resins, epoxy resins and polyester resins. Especially preferred resins are acrylic resins or urethane resins. For example, suitably used impact resistant layers are those on which an adhesive layer having a thickness from 100 to 800 μm is formed from any of the above-mentioned adhesives used for the adhesive layer.

One or more kinds of the above-mentioned near-infrared absorbing dyes, neon light absorbing dyes and/or color adjusting dyes may be incorporated in the impact resistant layers.

[Protective Film, Release Film]

A protective film for protecting an anti-glare layer on the observer-side surface of the front filter may be temporarily stacked on the front surface of the front filter of the present invention until the front filter is disposed in the front surface of a display or stacked with a different optical laminate, etc., or in the process of production. Preferred protective films to be temporarily stacked are those provided with an adhesive layer having such a degree of adhesiveness that a protective film adhere temporarily to the front filter.

Further, a release film may be temporarily stacked on the front filter of the present invention when an adhesive layer is provided on the display device-side surface.

When the front filter of the present invention is in the form of a belt and rolled up in storage or in processing, and the display device-side surface is an adhesive layer, a protective or release film to be in contact with the adhesive layer preferably has a flat surface. If concavoconvexes are present on the surface of a protective or release film to be in contact with an adhesive layer, the adhesive layer may be embossed with the concavoconvexes when the protective or release film is rolled up in the form of a belt. Consequently, polyester films with high smoothness, such as polyethylene terephthalate (PET) films, are suitably used as a protective or release film to be in contact with an adhesive layer. In place of a release film to be in contact with an adhesive layer, lint-free paper may be used as a slip sheet. In the case of a release film that is not to be in direct contact with an adhesive layer, there is no particular limitation on the materials therefor and, for example, polyethylene films or polypropylene films may be used.

Films having a haze value of 10 or less, which conforms to JIS-K7136, are preferred since the use of such films as protective films facilitates visual inspection of small conglobulations formed on the surface of the front filter or of foreign substances on the surface.

<Applications of Front Filter>

The front filter according to the present invention can achieve glossy black feeling and, at the same time, effectively prevent reflection when it is provided on the front surface of a plasma display. Further, it can impart various functions to the display.

The front filter according to the present invention is suitably used particularly with large-screen TV displays.

The front filter of the present invention can be also used with a cathode-ray tube display device, electroluminescence display or the like, other than a plasma displays.

<Plasma Display>

The plasma display according to the present invention has the front filter for a plasma display according to the present invention on the display surface thereof.

The plasma display according to the present invention is capable of effectively preventing reflection, concurrently with achieving glossy black feeling and improving image contrast in a bright environment. Furthermore, problems characteristic of a plasma display are solved by virtue of the functional layers of the front filter and, for example, electromagnetic leakage from the front surface of a display device is prevented.

EXAMPLES

Hereinafter, the present invention will be explained in detail by way of examples. The scope of the present invention is not restricted by these examples. In the Examples, all designations of "part" or "parts" and "%" are expressed on mass basis, unless otherwise specifically noted. All the monodisperse fine particles to be incorporated in compositions were within a particle size distribution of the average particle diameter ±0.3 to ±1 μm. However, it is noted that fine particles having a particle diameter of 3.5 μm or less did not fall within this particle size distribution.

Preparation Example 1

Preparation of Composition for Concavo-Convex Layer

Compositions for each of the layers comprising an antiglare layer were respectively prepared in accordance with the below-mentioned compositions.

Preparation Example 1.1

Ultraviolet Curing Resin

Pentaerythritol triacrylate (PETA) (refractive index: 1.51): 2.18 parts by weight
Dipentaerythritol hexaacrylate (DPHA) (refractive index: 1.51): 0.98 part by weight
Polymethylmethacrylate (PMMA) (molecular weight: 75,000): 0.31 part by weight
(Photocuring Initiator)
Irgacure 184 (product name; manufactured by: Ciba Specialty Chemicals Inc.): 0.20 part by weight
Irgacure 907 (product name; manufactured by: Ciba Specialty Chemicals Inc.): 0.03 part by weight
(First Light Transparent Fine Particles)
Monodisperse acrylic beads (particle diameter: 9.5 μm, refractive index: 1.535): 0.74 part by weight
(Second Light Transparent Fine Particles)
An amorphous silica ink (average particle diameter: 1.5 μm, solid content: 60%, silica component in the total solid content: 15%): 1.46 parts by weight
(Leveling Agent)
A silicone leveling agent: 0.02 part by weight
(Solvent)
Toluene: 5.53 parts by weight
Anone: 1.55 parts by weight
The above materials were thoroughly mixed together to prepare a composition having a solid content of 40.5%. The composition was filtered through a polypropylene filter having a pore diameter of 30 μm to prepare a composition 1 for a concavo-convex layer.

Preparation Example 1.2

Ultraviolet Curing Resin

Pentaerythritol triacrylate (PETA) (refractive index: 1.51): 2.20 parts by weight
Isocyanuric acid-modified diacrylate M215 (product name; manufactured by: TOAGOSEI Co., Ltd.) (refractive index: 1.51): 1.21 parts by weight
Polymethylmethacrylate (PMMA) (molecular weight: 75,000): 0.34 part by weight
(Photocuring Initiator)
Irgacure 184 (product name; manufactured by: Ciba Specialty Chemicals Inc.): 0.22 part by weight
Irgacure 907 (product name; manufactured by: Ciba Specialty Chemicals Inc.): 0.04 part by weight
(First Light Transparent Fine Particles)
Monodisperse acrylic beads (particle diameter: 9.5 μm, refractive index: 1.535): 0.82 part by weight
(Second Light Transparent Fine Particles)
An amorphous silica ink (average particle diameter: 1.5 μm, solid content: 60%, silica component in the total solid content: 15%): 1.73 parts by weight
(Leveling Agent)
A silicone leveling agent: 0.02 part by weight
(Solvent)
Toluene: 5.88 parts by weight
Anone: 1.55 parts by weight
The above materials were thoroughly mixed together to prepare a composition having a solid content of 40.5%. The composition was filtered through a polypropylene filter having a pore diameter of 30 μm to prepare a composition 2 for a concavo-convex layer.

Preparation Example 1.3

Ultraviolet Curing Resin

Pentaerythritol triacrylate (PETA) (refractive index: 1.51): 14 parts by weight
Dipentaerythritol hexaacrylate (DPHA) (refractive index: 1.51): 6 parts by weight
Polymethylmethacrylate (PMMA) (molecular weight: 75,000): 2 parts by weight
(Photocuring Initiator)
Irgacure 184 (product name; manufactured by: Ciba Specialty Chemicals Inc.): 1.32 parts by weight
Irgacure 907 (product name; manufactured by: Ciba Specialty Chemicals Inc.): 0.22 part by weight
(First Light Transparent Fine Particles)
Monodisperse styrene beads (particle diameter: 5.0 μm, refractive index: 1.60): 0.64 part by weight
(Second Light Transparent Fine Particles)
Monodisperse melamine beads (particle diameter: 1.8 μm, refractive index: 1.68): 2.2 parts by weight
(Leveling Agent)
A silicone leveling agent: 0.0088 part by weight
A solvent of toluene and cyclohexanone (8:2) was added to the above-mentioned materials to a total solid content of 42%, and was mixed thoroughly to prepare a composition. The composition was filtered through a polypropylene filter having a pore diameter of 30 μm to prepare a composition 3 for a concavo-convex layer.

Preparation Example 1.4

Ultraviolet Curing Resin

Pentaerythritol triacrylate (PETA) (refractive index: 1.51): 19.5 parts by weight
Dipentaerythritol hexaacrylate (DPHA) (refractive index: 1.51): 10.5 parts by weight
Polymethylmethacrylate (PMMA) (molecular weight: 75,000): 3 parts by weight
(Photocuring Initiator)
Irgacure 184 (product name; manufactured by: Ciba Specialty Chemicals Inc.): 1.98 parts by weight
Irgacure 907 (product name; manufactured by: Ciba Specialty Chemicals Inc.): 0.33 part by weight
(First Light Transparent Fine Particles)
Monodisperse acrylic beads (particle diameter: 9.0 μm, refractive index: 1.535): 4.95 parts by weight
(Second Light Transparent Fine Particles)
Styrene beads (particle diameter: 3.5 μm, refractive index: 1.60): 6.6 parts by weight (Leveling Agent)

A silicone leveling agent: 0.0132 part by weight

A solvent of toluene and cyclohexanone (8:2) was added to the above-mentioned materials to a total solid content of 40.5%, and was mixed thoroughly to prepare a composition. The composition was filtered through a polypropylene filter having a pore diameter of 30 μm to prepare a composition 4 for a concavo-convex layer.

Preparation Example 1.5

Ultraviolet Curing Resin

Pentaerythritol triacrylate (PETA) (refractive index: 1.51): 19.5 parts by weight
Dipentaerythritol hexaacrylate (DPHA) (refractive index: 1.51): 10.5 parts by weight
Polymethylmethacrylate (PMMA) (molecular weight: 75,000): 3 parts by weight
(Photocuring Initiator)
Irgacure 184 (product name; manufactured by: Ciba Specialty Chemicals Inc.): 1.98 parts by weight
Irgacure 907 (product name; manufactured by: Ciba Specialty Chemicals Inc.): 0.33 part by weight
(First Light Transparent Fine Particles)
Monodisperse acrylic beads (particle diameter: 7.0 μm. refractive index: 1.535): 6.6 parts by weight
(Second Light Transparent Fine Particles)
Styrene beads (particle diameter: 3.5 μm, refractive index: 1.60): 11.55 parts by weight
(Leveling Agent)
A silicone leveling agent: 0.0132 part by weight
A solvent of toluene and cyclohexanone (8:2) was added to the above-mentioned materials to a total solid content of 40.5%, and was mixed thoroughly to prepare a composition. The composition was filtered through a polypropylene filter having a pore diameter of 30 μm to prepare a composition 5 for a concavo-convex layer.

Preparation Example 1.6

Ultraviolet Curing Resin

Pentaerythritol triacrylate (PETA) (refractive index: 1.51): 21 parts by weight
Dipentaerythritol hexaacrylate (DPHA) (refractive index: 1.51): 9 parts by weight
Polymethylmethacrylate (PMMA) (molecular weight: 75,000): 3 parts by weight
(Photocuring Initiator)
Irgacure 184 (product name; manufactured by: Ciba Specialty Chemicals Inc.): 1.98 parts by weight
Irgacure 907 (product name; manufactured by: Ciba Specialty Chemicals Inc.): 0.33 part by weight
(First Light Transparent Fine Particles)
Monodisperse acrylic beads (particle diameter: 4.6 μm, refractive index: 1.535, hydrophobically acting type beads): 4.95 parts by weight
(Second Light Transparent Fine Particles)
Styrene beads (particle diameter: 3.5 μm, refractive index: 1.60): 0.33 part by weight
(Leveling Agent)
A silicone leveling agent: 0.0132 part by weight
A solvent of toluene and cyclohexanone (8:2) was added to the above-mentioned materials to a total solid content of 42%, and was mixed thoroughly to prepare a composition. The composition was filtered through a polypropylene filter having a pore diameter of 30 μm to prepare a composition 6 for a concavo-convex layer.

Preparation Example 1.7

Ultraviolet Curing Resin

Pentaerythritol triacrylate (PETA) (refractive index: 1.51): 30 parts by weight
Polymethylmethacrylate (PMMA) (molecular weight: 75,000): 3 parts by weight
(Photocuring Initiator)
Irgacure 184 (product name; manufactured by: Ciba Specialty Chemicals Inc.): 1.98 parts by weight
Irgacure 907 (product name; manufactured by: Ciba Specialty Chemicals Inc.): 0.33 part by weight
(First Light Transparent Fine Particles)
Monodisperse acrylic beads (particle diameter: 7.0 μm, refractive index: 1.535): 4.95 parts by weight
(Second Light Transparent Fine Particles)
Styrene beads (particle diameter: 3.5 μm, refractive index: 1.60): 5.445 parts by weight
(Leveling Agent)
A silicone leveling agent: 0.0132 part by weight
A solvent of toluene and cyclohexanone (8:2) was added to the above-mentioned materials to a total solid content of 40.5%, and was mixed thoroughly to prepare a composition. The composition was filtered through a polypropylene filter having a pore diameter of 30 μm to prepare a composition 7 for a concavo-convex layer.

Preparation Example 1.8

Ultraviolet Curing Resin

Pentaerythritol triacrylate (PETA) (refractive index: 1.51): 19.5 parts by weight
Isocyanuric acid-modified diacrylate M215 (product name; manufactured by: TOAGOSEI Co., Ltd.): 10.5 parts by weight
Polymethylmethacrylate (PMMA) (molecular weight: 75,000): 3 parts by weight
(Photocuring Initiator)
Irgacure 184 (product name; manufactured by: Ciba Specialty Chemicals Inc.): 1.98 parts by weight
Irgacure 907 (product name; manufactured by: Ciba Specialty Chemicals Inc.): 0.33 part by weight
(First Light Transparent Fine Particles)
Monodisperse acrylic beads (particle diameter: 9.0 μm, refractive index: 1.535): 3.3 parts by weight
(Second Light Transparent Fine Particles)
Styrene beads (particle diameter: 3.5 μm, refractive index: 1.60): 4.62 parts by weight
(Leveling Agent)
A silicone leveling agent: 0.0132 part by weight
A solvent of toluene and cyclohexanone (8:2) was added to the above-mentioned materials to a total solid content of 60%, and was mixed thoroughly to prepare a composition. The composition was filtered through a polypropylene filter having a pore diameter of 30 μm to prepare a composition 8 for a concavo-convex layer.

Preparation Example 1.9

An amorphous silica matting agent-dispersed ink: A resin (PETA) dispersion of amorphous silica having an average particle diameter of 2.5 μm (solid content: 60%, silica component in the total solid content: 15%, solvent: toluene) and pentaerythritol triacrylate (PETA) (refractive index: 1.51), which is an ultraviolet curing resin, were used and reed so that, based on 100 parts by weight of the total amount of PETA in the total solid content, the amount of monodisperse acrylic beads (particle diameter: 7.0 μm, refractive index: 1.535) as light transparent fine particles was 20 parts by weight, the amount of monodisperse styrene beads (particle diameter: 3.5 μm, refractive index: 1.60) as light transparent fine particles was 3.0 parts by weight, and the amount of the amorphous silica as light transparent fine particles was 2.0 parts by weight. Moreover, a silicone leveling agent was added in an amount of 0.04% based on the total amount of the resin of 100 parts by weight. Toluene and cyclohexanone were appropriately added thereto and mixed thoroughly so that the resulting final composition had a solid content of 40.5 wt % and the ratio of toluene to cyclohexanone was 8:2. Thereafter, the composition was filtered through a polypropylene filter having a pore diameter of 30 μm to prepare a composition 9 for a concavo-convex layer.

Preparation Example 1.10

A composition 10 for a concavo-convex layer was prepared in the same manner as in Preparation Example 1.9 except that 16.5 parts by weight of monodisperse styrene beads (particle diameter: 3.5 μm, refractive index: 1.60) was used as light transparent fine particles.

Preparation Example 1.11

A composition 11 for a concavo-convex layer was prepared in the same manner as in Preparation Example 1.9 except that 8.5 parts by weight of monodisperse styrene beads (particle diameter: 3.5 μm, refractive index: 1.60) was used as light transparent fine particles.

Preparation Example 1.12

A composition 12 for a concavo-convex layer was prepared in the same manner as in Preparation Example 1.9 except that 2.5 parts by weight of monodisperse styrene beads (particle diameter: 3.5 μm, refractive index: 1.60) was used as light transparent fine particles.

Preparation Example 1.13

A composition 13 for a concavo-convex layer was prepared in the same manner as in Preparation Example 1.9 except that 2.5 parts by weight of monodisperse styrene beads (particle diameter: 3.5 μm, refractive index: 1.60) and 1.0 part by weight of amorphous silica (average particle diameter: 2.5 μm) were used as light transparent fine particles.

Preparation Example 1.14

A composition 14 for a concavo-convex layer was prepared in the same manner as in Preparation Example 1.9 except that 2.5 parts by weight of monodisperse styrene beads (particle diameter: 3.5 μm, refractive index: 1.60) and 3.5 parts by weight of amorphous silica (average particle diameter: 2.5 μm) were used as light transparent fine particles.

Preparation Example 1.15

Ultraviolet Curing Resin

Pentaerythritol triacrylate (PETA) (refractive index: 1.51): 13.0 parts by weight
Isocyanuric acid-modified diacrylate M215 (product name; manufactured by: TOAGOSEI Co., Ltd.): 7.0 parts by weight
Polymethylmethacrylate (PMMA) (molecular weight: 75,000): 2 parts by weight
(Photocuring Initiator)
Irgacure 184 (product name; manufactured by: Ciba Specialty Chemicals Inc.): 1.32 parts by weight
Irgacure 907 (product name; manufactured by: Ciba Specialty Chemicals Inc.): 0.22 part by weight
(First Light Transparent Fine Particles)
Monodisperse acrylic beads (particle diameter: 13.5 μm, refractive index: 1.535): 0.44 part by weight
(Second Light Transparent Fine Particles)
Monodisperse styrene beads (particle diameter: 3.5 μm, refractive index: 1.60): 0.88 part by weight
(Leveling Agent)
A silicone leveling agent: 0.0077 part by weight
A solvent of toluene and cyclohexanone (6:4) was added to the above-mentioned materials to a total solid content of 38%, and was mixed thoroughly to prepare a composition. The composition was filtered through a polypropylene filter having a pore diameter of 30 μm to prepare a composition 15 for a concavo-convex layer.

Preparation Example 1.16

Ultraviolet Curing Resin

Pentaerythritol triacrylate (PETA) (refractive index: 1.51): 50 parts by mass
(Photocuring Initiator)
Irgacure 184 (product name; manufactured by: Ciba Specialty Chemicals Inc.): 1.50 parts by mass
Irgacure 907 (product name; manufactured by: Ciba Specialty Chemicals Inc.): 50 parts by mass
PETA was heated in an oven at 40° C. for one hour and stirred with the slow addition of two kinds of photocuring initiators, followed by further heating in an oven at 40° C. for one hour. Thereafter, the mixture was stirred again to completely dissolve the photocuring initiators, and was prepared as a composition 16 for a concavo-convex layer having a solid content of 100%.

Preparation Example 1.17

Ultraviolet Curing Resin

Pentaerythritol triacrylate (PETA) (refractive index: 1.51): 19.5 parts by weight
Dipentaerythritol hexaacrylate (DPHA) (refractive index: 1.51): 10.5 parts by weight
Polymethylmethacrylate (PMMA) (molecular weight: 75,000): 3 parts by weight
(Photocuring Initiator)
Irgacure 184 (product name; manufactured by: Ciba Specialty Chemicals Inc.): 1.98 parts by weight
Irgacure 907 (product name; manufactured by: Ciba Specialty Chemicals Inc.): 0.33 part by weight
(Light Transparent Fine Particles)
Monodisperse acrylic beads (particle diameter: 3.5 μm, refractive index: 1.535): 6.6 parts by weight
(Leveling Agent)
A silicone leveling agent: 0.0132 part by weight
A solvent of toluene and cyclohexanone (8:2) was added to the above-mentioned materials to a total solid content of 40.5%, and was mixed thoroughly to prepare a composition. The composition was filtered through a polypropylene filter having a pore diameter of 30 μm to prepare a composition 17 for a concavo-convex layer.

Preparation Example 1.18

A composition 18 for a concavo-convex layer was prepared in the same manner as in Preparation Example 1.17 except that 6.6 parts by weight of acrylic beads having a particle size distribution (particle diameter: 5.0 μm±3.0, refractive index: 1.535; manufactured by Nippon Shokubai Co., Ltd.) was used as light transparent fine particles.

Preparation Example 1.19

Ultraviolet Curing Resin

Urethane acrylate monomer UV1700B (product name, refractive index: 1.52; manufactured by: The Nippon Synthetic Chemical Industry Co., Ltd.): 30 parts by weight
Polymethylmethacrylate (PMMA) (molecular weight: 75,000): 3 parts by weight
(Photocuring Initiator)
Irgacure 184 (product name; manufactured by: Ciba Specialty Chemicals Inc.): 1.98 parts by weight
Irgacure 907 (product name; manufactured by: Ciba Specialty Chemicals Inc.): 0.33 part by weight
(Light Transparent Fine Particles)
Monodisperse styrene beads (particle diameter: 3.5 μm, refractive index: 1.60): 6.6 parts by weight
(Leveling Agent)
A silicone leveling agent: 0.0132 part by weight
A solvent of toluene was added to the above-mentioned materials to a total solid content of 40.0%, and was mixed thoroughly to prepare a composition. The composition was filtered through a polypropylene filter having a pore diameter of 30 μm to prepare a composition 19 for a concavo-convex layer.

Preparation Example 1.20

Ultraviolet Curing Resin

Pentaerythritol triacrylate (PETA) (refractive index: 1.51): 18 parts by weight.
Isocyanuric acid-modified diacrylate M215 (product name; manufactured by: TOAGOSEI Co., Ltd.): 12 parts by weight
Polymethylmethacrylate (PMMA) (molecular weight: 75,000): 3 parts by weight
(Photocuring Initiator)
Irgacure 184 (product name; manufactured by: Ciba Specialty Chemicals Inc.): 1.98 parts by weight
Irgacure 907 (product name; manufactured by: Ciba Specialty Chemicals Inc.): 0.33 part by weight
(First Light Transparent Fine Particles)
Monodisperse acrylic beads (particle diameter: 5.0 μm, refractive index: 1.535): 5.28 parts by weight
(Second Light Transparent Fine Particles)
Monodisperse styrene beads (particle diameter: 3.5 μm, refractive index: 1.60): 0.53 part by weight
(Leveling Agent)
A silicone leveling agent: 0.0132 part by weight
A solvent of toluene and cyclohexanone (8:2) was added to the above-mentioned materials to a total solid content of 40.5%, and was mixed thoroughly to prepare a composition. The composition was filtered through a polypropylene filter having a pore diameter of 30 μm to prepare a composition 20 for a concavo-convex layer.

Preparation Example 1.21

Ultraviolet Curing Resin

Pentaerythritol triacrylate (PETA) (refractive index: 1.51): 13.0 parts by weight
Isocyanuric acid-modified diacrylate M215 (product name; manufactured by: TOAGOSEI Co., Ltd.): 7.0 parts by weight
Polymethylmethacrylate (PMMA) (molecular weight: 75,000): 2 parts by weight
(Photocuring Initiator)
Irgacure 184 (product name; manufactured by: Ciba Specialty Chemicals Inc.): 1.32 parts by weight
Irgacure 907 (product name; manufactured by: Ciba Specialty Chemicals Inc.): 0.22 part by weight
(First Light Transparent Fine Particles)
Monodisperse acrylic beads (particle diameter: 9.0 μm, refractive index: 1.535): 4.4 parts by weight
(Second Light Transparent Fine Particles)
Monodisperse styrene beads (particle diameter: 3.5 μm, refractive index: 1.60): 0.44 part by weight
(Leveling Agent)
A silicone leveling agent: 0.0077 part by weight
A solvent of toluene and cyclohexanone (8:2) was added to the above-mentioned materials to a total solid content of 40.5%, and was mixed thoroughly to prepare a composition. The composition was filtered through a polypropylene filter having a pore diameter of 30 μm to prepare a composition 21 for a concavo-convex layer.

Preparation Example 1.22

Ultraviolet Curing Resin

Pentaerythritol triacrylate (PETA) (refractive index: 1.51): 28.4 parts by weight
Dipentaerythritol hexaacrylate (DPHA) (refractive index: 1.51): 1.50 parts by weight
Polymethylmethacrylate (PMMA) (molecular weight: 75,000): 3.18 parts by weight
(Photocuring Initiator)
Irgacure 184 (product name; manufactured by: Ciba Specialty Chemicals Inc.): 1.96 parts by weight
Irgacure 907 (product name; manufactured by: Ciba Specialty Chemicals Inc.): 0.33 part by weight
(Light Transparent Fine Particles)
Monodisperse styrene beads (particle diameter: 3.5 μm, refractive index: 1.60): 4.55 parts by weight
(Leveling Agent)
A silicone leveling agent: 0.0105 part by weight
A solvent of toluene and cyclohexanone (7:3) was added to the above-mentioned materials to a total solid content of 38%, and was mixed thoroughly to prepare a composition. The composition was filtered through a polypropylene filter having a pore diameter of 30 μm to prepare a composition 22 for a concavo-convex layer.

Preparation Example 1.23

Ultraviolet Curing Resin

Pentaerythritol triacrylate (PETA) (refractive index: 1.51): 12.0 parts by weight
Isocyanuric acid-modified diacrylate M215 (product name; manufactured by: TOAGOSEI Co., Ltd.): 8.0 parts by weight Polymethylmethacrylate (PMMA) (molecular weight: 75,000): 2 parts by weight
(Photocuring Initiator)
Irgacure 184 (product name; manufactured by: Ciba Specialty Chemicals Inc.): 1.32 parts by weight
Irgacure 907 (product name; manufactured by: Ciba Specialty Chemicals Inc.): 0.22 part by weight
(First Light Transparent Fine Particles)
Monodisperse styrene-acrylic copolymer beads (particle diameter: 3.5 μm, refractive index: 1.555): 4.84 parts by weight
(Second Light Transparent Fine Particles)
Monodisperse styrene beads (particle diameter: 3.5 μm, refractive index: 1.60): 0.55 part by weight
(Leveling Agent)
A silicone leveling agent: 0.0077 part by weight
A solvent of toluene and cyclohexanone (6:4) was added to the above-mentioned materials to a total solid content of 38%, and was mixed thoroughly to prepare a composition. The composition was filtered through a polypropylene filter having a pore diameter of 30 μm to prepare a composition 23 for a concavo-convex layer.

Preparation Example 1.24

Ultraviolet Curing Resin

Pentaerythritol triacrylate (PETA) (refractive index: 1.51): 32 parts by weight
Cellulose acetate propionate (CAP) (molecular weight: 50,000): 0.4 part by weight
(Photocuring Initiator)
Irgacure 184 (product name; manufactured by: Ciba Specialty Chemicals Inc.): 1.92 parts by weight
Irgacure 907 (product name; manufactured by: Ciba Specialty Chemicals Inc.): 0.32 part by weight
(Leveling Agent)
A silicone leveling agent: 0.11 part by weight
(Light Transparent Fine Particles)
Monodisperse polystyrene particles (particle diameter: 3.5 μm, refractive index: 1.60): 1.94 parts by weight
A solvent of toluene and cyclohexanone (7:3) was added to the above-mentioned materials to a total solid content of 38%, and was mixed thoroughly to prepare a composition. The composition was filtered through a polypropylene filter having a pore diameter of 30 μm to prepare a composition 24 for a concavo-convex layer.

Preparation Example 1.25

Ultraviolet Curing Resin

Pentaerythritol triacrylate (PETA) (refractive index: 1.51): 30 parts by weight
Cellulose acetate propionate (CAP) (molecular weight: 50,000): 0.375 part by weight
(Photocuring Initiator)
Irgacure 184 (product name; manufactured by: Ciba Specialty Chemicals Inc.): 1.82 parts by weight
Irgacure 907 (product name; manufactured by: Ciba Specialty Chemicals Inc.): 0.30 part by weight
(Leveling Agent)
A silicone leveling agent: 0.125 part by weight
(Light Transparent Fine Particles)
Monodisperse polystyrene particles (particle diameter: 3.5 μm, refractive index: 1.60): 2.73 parts by weight A solvent of toluene and cyclohexanone (7:3) was added to the above-mentioned materials to a total solid content of 35%, and was mixed thoroughly to prepare a composition. The composition was filtered through a polypropylene filter having a pore diameter of 30 μm to prepare a composition 25 for a concavo-convex layer.

Preparation Example 1.26

Resin

Cellulose acetate propionate (product name: CA9482-20; manufactured by: Eastman Chemical Company): 0.95 part by weight
Reactive oligomer [product name: CYCLOMER P, a product of the addition of 3,4-epoxycyclohexyl methylacrylate to a part of carboxyl groups of a (meth)acrylic acid-(meth) acrylic ester copolymer; manufactured by: Daicel-UCB Co., Ltd.]: 16.25 parts by weight
Dipentaerythritol hexaacrylate (DPHA): 15.8 parts by weight
(Photopolymerization Initiator)
Irgacure 184 (product name; manufactured by: Ciba Specialty Chemicals Inc.): 1.25 parts by weight
(Solvent)
Methyl ethyl ketone: 51 parts by weight
Butanol: 17 parts by weight
The above materials were accordingly and thoroughly mixed together to form a composition. The composition was filtered through a polypropylene filter having a pore diameter of 30 μm to prepare a composition 26 for a concavo-convex layer having a solid content of 33.5%.

Preparation Example 1.27

Ultraviolet Curing Resin

Pentaerythritol triacrylate (PETA) (refractive index: 1.51): 2.18 parts by weight
Dipentaerythritol hexaacrylate (DPHA) (refractive index: 1.51): 0.98 part by weight
Polymethylmethacrylate (PMMA) (molecular weight: 75,000): 0.31 part by weight
(Photocuring Initiator)
Irgacure 184 (product name; manufactured by: Ciba Specialty Chemicals Inc.): 0.20 part by weight
Irgacure 907 (product name; manufactured by: Ciba Specialty Chemicals Inc.): 0.03 part by weight
(Leveling Agent)
A silicone leveling agent: 0.02 part by weight
(Solvent)
Toluene: 5.53 parts by weight
Anone: 1.55 parts by weight
The above materials were thoroughly mixed together to prepare a composition having a solid content of 40.5%. The composition was filtered through a polypropylene filter having a pore diameter of 30 μm to prepare a composition 27 for a concavo-convex layer.

Preparation Example 2

Preparation of Composition for Surface Shape Modifying Layer

Preparation Example 2.1

Ultraviolet Curing Resin

UV1700B (product name, refractive index: 1.51; manufactured by: The Nippon Synthetic Chemical Industry Co., Ltd.): 31.1 parts by weight Isocyanuric acid-modified triacrylate M315 (product name; manufactured by: TOAGOSEI Co., Ltd.): 10.4 parts by weight
(Photocuring Initiator)
Irgacure 184 (product name; manufactured by: Ciba Specialty Chemicals Inc.): 0.49 part by weight
Irgacure 907 (product name; manufactured by: Ciba Specialty Chemicals Inc.): 0.41 part by weight
(Anti-Fouling Agent)
UT-3971 (product name; manufactured by: The Nippon Synthetic Chemical Industry Co., Ltd.): 2.07 parts by weight
(Solvent)
Toluene: 48.76 parts by weight
Cyclohexanone: 5.59 parts by weight
The above components were thoroughly mixed together to prepare a composition having a solid content of 45%. The composition was filtered through a polypropylene filter having a pore diameter of 10 μm to prepare a composition 1 for a surface shape modifying layer.

Preparation Example 2.2

Ultraviolet Curing Resin

UV1700B (product name, refractive index: 1.51; manufactured by: The Nippon Synthetic Chemical Industry Co., Ltd.): 31.1 parts by weight
Isocyanuric acid-modified triacrylate M315 (product name; manufactured by: TOAGOSEI Co., Ltd.): 10.4 parts by weight
(Photocuring Initiator)
Irgacure 184 (product name; manufactured by: Ciba Specialty Chemicals Inc.): 0.49 part by weight
Irgacure 907 (product name; manufactured by: Ciba Specialty Chemicals Inc.): 0.41 part by weight
(Leveling Agent)
A silicone leveling agent: 0.19 part by weight
(Solvent)
Toluene: 46.7 parts by weight
Cyclohexanone: 5.45 parts by weight
The above components were thoroughly mixed together to prepare a composition. The composition was filtered through a polypropylene filter having a pore diameter of 10 μm to prepare a composition 2 for a surface shape modifying layer.

Preparation Example 2.3

A composition 3 for a surface shape modifying layer was prepared in the same manner as in Preparation Example 2.1 except that 48.0 parts by weight of toluene and 5.5 parts by weight of cyclohexanone were used as solvents.

Preparation Example 2.4

A composition 4 for a surface shape modifying layer was prepared in the same manner as in Preparation Example 2.1 except that 525.18 parts by weight of toluene and 60.28 parts by weight of cyclohexanone were used as solvents.

Preparation Example 2.5

A composition 5 for a surface shape modifying layer was prepared in the same manner as in Preparation Example 2.2 except that 48.0 parts by weight of toluene and 5.5 parts by weight of cyclohexanone were used as solvents.

Preparation Example 2.6

Anti-Static Agent

C-4456 S-7 (product name, an ATO-containing conductive ink, average particle diameter of ATO: 300 to 400 nm, solid concentration: 45%; manufactured by: Nippon Pelnox Corporation): 21.6 parts by weight
(Ultraviolet Curing Resin)
Dipentaerythritol hexaacrylate (DPHA) (refractive index: 1.51): 28.69 parts by weight
(Photocuring Initiator)
Irgacure 184 (product name; manufactured by: Ciba Specialty Chemicals Inc.): 1.56 parts by weight
MIBK (methyl isobutyl ketone): 33.7 parts by weight
Cyclohexanone: 14.4 parts by weight
The above components were mixed together to prepare a composition. The composition was filtered through a polypropylene filter having a pore diameter of 30 μm to prepare a composition 6 for a surface shape modifying layer.

Preparation Example 2.7

A zirconia-containing coating composition (product name: KZ7973, a resin matrix having a refractive index of 1.69, solid content: 50%; manufactured by: JSR Corporation) was used to prepare a composition 7 for a surface shape modifying layer of the following composition, in which a refractive index of the resin matrix was 1.60.
(Ultraviolet Curing Resin)
Pentaerythritol triacrylate (PETA) refractive index: 1.51): 18.59 parts by weight
Zirconia (zirconia contained in "KZ7973" (product name), average particle diameter: 40 to 60 nm, refractive index: 2.0; manufactured by: JSR Corporation) for incorporation in the ultraviolet curing resin to develop a resin matrix: 17.18 parts by weight
A zirconia dispersant (a zirconia dispersion stabilizer contained in "KZ7973" (product name); manufactured by: JSR Corporation): 1.22 parts by weight
Polymethylmethacrylate (PMMA) (molecular weight: 40,000): 0.94 part by weight
(Photocuring Initiator)
Irgacure 184 (product name; manufactured by: Ciba Specialty Chemicals Inc.): 0.56 part by weight
(Photocuring Initiator)
Irgacure 907 (product name; manufactured by: Ciba Specialty Chemicals Inc.): 0.26 part by weight
(Leveling Agent)
A silicone leveling agent: 0.039 part by weight
(Solvent)
Toluene: 14.34 parts by weight
Cyclohexanone: 15.76 parts by weight
MEK: 2.80 parts by weight
The above components were thoroughly mixed together to prepare a composition. The composition was filtered with a polypropylene filter having a pore diameter of 30 μm to prepare a composition 7 for a surface shape modifying layer.

Preparation Example 2.8

A colloidal silica slurry (MIBK dispersion, solid content: 40%, average particle diameter: 20 nm): 26.01 parts by weight
UV-1700B (product name, an ultraviolet curing resin; manufactured by: The Nippon Synthetic Chemical Industry Co., Ltd.): 23.20 parts by weight ARONIX M315 (product name, an ultraviolet curing resin; manufactured by: TOAGOSEI Co., Ltd.): 7.73 parts by weight Irgacure 184 (product name, a photocuring initiator; manufactured by: Ciba Specialty Chemicals Inc.): 1.86 parts by weight Irgacure 907 (product name, a photocuring initiator; manufactured by: Ciba Specialty Chemicals Inc.): 0.31 part by weight UT-3971 (product name, an anti-fouling agent; a MIBK solution having a solid content of 30%; manufactured by: The Nippon Synthetic Chemical Industry Co., Ltd.): 1.55 parts by weight (Solvent)
Toluene: 19.86 parts by weight
MIBK: 15.56 parts by weight
Cyclohexanone: 3.94 parts by weight The above components were thoroughly mixed together to prepare a composition. The composition was filtered with a polypropylene filter having a pore diameter of 30 μm to prepare a composition 8 for a surface shape modifying layer.

Preparation Example 2.9

A composition 9 for a surface shape modifying layer was prepared in the same manner as in Preparation Example 2.8 except that 0.14 part by weight of a silicone leveling agent (a toluene solution having a solid content of 10%) was used in place of 1.55 parts by weight of UT-3971 (product name, an anti-fouling agent; a MIBK solution having a solid content of 30%; manufactured by: The Nippon Synthetic Chemical Industry Co., Ltd.)

Preparation Example 3

Preparation of Composition for Low Refractive Index Layer

Preparation Example 3.1

Components listed below were mixed together, stirred and filtered through a polypropylene filter having a pore diameter of 10 μm to prepare a composition 1 for a low refractive index layer.

A hollow silica slurry (IPA and MIBK dispersion, solid content: 20%, particle diameter: 50 nm): 9.57 parts by weight Polymethylmethacrylate (PMMA) (an ultraviolet curing resin): 0.981 part by weight AR110 (product name, a fluorine polymer; a MIBK solution having a solid content of 15%; manufactured by: Daikin Industries, Ltd.): 6.53 parts by weight Irgacure 369 (product name, a photocuring initiator; manufactured by: Ciba Specialty Chemicals Inc.): 0.069 part by weight A silicone leveling agent: 0.157 part by weight Propylene glycol monomethyl ether (PGME): 28.8 parts by weight Methyl isobutyl ketone: 53.9 parts by weight Preparation Example 3.2

A fluorine-containing resin composition (product name: TM086; manufactured by: JSR Corporation): 34.14 parts by weight A photopolymerization initiator (product name: JUA701; manufactured by: JSR Corporation): 0.85 part by weight MIBK: 65 parts by weight The above components were mixed together, stirred and filtered through a polypropylene filter having a pore diameter of 10 μm to prepare a composition 2 for a low refractive index layer.

Preparation Example 3.3

Components listed below were mixed together, stirred and filtered through a polypropylene filter having a pore diameter of 10 μm to prepare composition 3 for a low refractive index layer.

Surface-treated silica sol (void containing fine particles) (20% methyl isobutyl ketone solution): 14.3 parts by weight Pentaerythritol triacrylate (PETA) (refractive index: 1.51): 1.95 parts by weight Irgacure 907 (product name; manufactured by: Ciba Specialty Chemicals Inc.): 0.1 part by weight Polyether-modified silicone oil: 0.15 part by weight Methyl isobutyl ketone: 83.5 parts by weight Preparation Example 4

Preparation of Composition for Anti-Static Layer

Components listed below were mixed together, stirred and filtered through a polypropylene filter having a pore diameter of 30 μm to prepare a composition for an anti-static layer.

C-4456 S-7 (product name, an ATO-containing conductive ink, average particle diameter of ATO: 300 to 400 nm, solid content: 45%; manufactured by: PELNOX, LTD.): 2.0 parts by weight Methyl isobutyl ketone: 2.84 parts by weight
Cyclohexanone: 1.22 parts by weight Preparation Example 5

Preparation of Anti-Glare Optical Laminate

Anti-glare optical laminates were prepared as described below, respectively.

Preparation Example 5.1

Preparation of Concavo-Convex Layer

A 100 μm-thick, biaxially oriented polyethylene terephthalate film (product name: A4300; manufactured by: Toyobo Co., Ltd.) was used as a polyester film. The composition 1 for a concavo-convex layer was coated onto the film with a #10 wire-wound rod for coating (Mayer's bar), and the coated film was heat dried in an oven at 70° C. for 30 seconds to evaporate the solvent component. Thereafter, ultraviolet light was applied at an exposure of 30 mJ to cure the coating, thereby forming a concavo-convex layer.

(Preparation of Surface Shape Modifying Layer)

The composition 1 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 80 mJ to cure the coating, thereby forming a surface shape modifying layer. Thus, an anti-glare optical laminate was obtained. (Total thickness of the anti-glare layer on the substrate: about 12 μm)

Preparation Example 5.2

Preparation of Concavo-Convex Layer

A concavo-convex layer was formed in the same manner as in Preparation Example 5.1 except that a 100 μm-thick, biaxially oriented polyethylene terephthalate film (product name: A1540; manufactured by: Toyobo Co., Ltd.) was used as a polyester film, and the composition 2 for a concavo-convex layer was coated onto the film with a #10 wire-wound rod for coating (Mayer's bar).
(Preparation of Surface Shape Modifying Layer)
An anti-glare optical laminate was obtained in the same manner as in Preparation Example 5.1 except that ultraviolet light was applied at an exposure of 70 mJ to cure the coating, thereby forming a surface shape modifying layer. (Total thickness of the anti-glare layer on the substrate: about 12 μm)

Preparation Example 5.3

Preparation of Concavo-Convex Layer

A concavo-convex layer was formed in the same manner as in Preparation Example 5.2 except that the 100 μm-thick, biaxially oriented polyethylene terephthalate film (product name: A1540; manufactured by: Toyobo Co., Ltd.) was altered to a 100 μm-thick, biaxially oriented polyethylene terephthalate film (product name: A1542; manufactured by: Toyobo Co., Ltd.)
(Preparation of Surface Shape Modifying Layer)
An anti-glare optical laminate was obtained in the same manner as in Preparation Example 5.1 except that ultraviolet light was applied at an exposure of 70 mJ to cure the coating, thereby forming a surface shape modifying layer. (Total thickness of the anti-glare layer on the substrate: about 12 μm)
(Preparation of Low Refractive Index Layer)
The composition 1 for a low refractive index layer was coated onto the surface shape modifying layer with a #4 wire-wound rod for coating (Mayer's bar), and the coating was heat dried in an oven at 50° C. for one minute to evaporate the solvent component. Thereafter, under nitrogen purge (oxygen concentration: 200 ppm or less), ultraviolet light was applied at an exposure of 100 mJ to cure the coating, thereby forming a low refractive index layer having a thickness of about 100 nm. Thus, an anti-glare, low-reflection optical laminate was obtained. (Total thickness of the anti-glare layer on the substrate: about 12.1 μm)

Preparation Example 5.4

Preparation of Concavo-Convex Layer

A 100 μm-thick, biaxially oriented polyethylene terephthalate film (product name: A4300; manufactured by: Toyobo Co., Ltd.) was used as a polyester film. The composition 3 for a concavo-convex layer was coated onto the film with a #10 wire-wound rod for coating (Mayer's bar), and the coated film was heat dried in an oven at 70° C. for one minute to evaporate the solvent component. Thereafter, under nitrogen purge (oxygen concentration: 200 ppm or less), ultraviolet light was applied at an exposure of 14 mJ to cure the coating, thereby forming a concavo-convex layer. Fine particles which have a refractive index difference with a binder resin of up to 0.17 were used in the concavo-convex layer to impart an internal diffusion effect, thereby achieving more effective glare prevention.
(Preparation of Surface Shape Modifying Layer)
The composition 4 for a surface shape modifying layer was coated onto the concavo-convex layer with a #8 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 6.5 μm)

Preparation Example 5.5

Preparation of Concavo-Convex Layer

A 100 μm-thick, biaxially oriented polyethylene terephthalate film (product name: A4300; manufactured by: Toyobo Co., Ltd.) was used as a polyester film. The composition 4 for a concavo-convex layer was coated onto the film with a #10 wire-wound rod for coating (Mayer's bar), and the coated film was heat dried in an oven at 70° C. for one minute to evaporate the solvent component. Thereafter, ultraviolet light was applied at an exposure of 30 mJ to cure the coating, thereby forming a concavo-convex layer. Fine particles which have a refractive index difference with a binder resin of up to 0.09 were used in the concavo-convex layer to impart an internal diffusion effect, thereby achieving more effective glare prevention.
(Preparation of Surface Shape Modifying Layer)
The composition 3 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 13 μm)

Preparation Example 5.6

Preparation of Concavo-Convex Layer

A concavo-convex layer was formed in the same manner as in Preparation Example 5.5.
(Preparation of Surface Shape Modifying Layer)
The composition 5 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 30 mJ to cure the coating, thereby forming a surface shape modifying layer. Thus, an anti-glare optical laminate was obtained.
(Preparation of Low Refractive Index Layer)
The composition 2 for a low refractive index layer was coated onto the surface shape modifying layer with a #4 wire-wound rod for coating (Mayer's bar), and the coating was heat dried in an oven at 50° C. for one minute to evaporate the solvent component. Thereafter, under nitrogen purge (oxygen concentration: 200 ppm or less), ultraviolet light was applied at an exposure of 150 mJ to cure the coating, thereby forming a low refractive index layer having a thickness of about 100 nm. Thus, an anti-glare, low-reflection optical laminate was obtained. (Total thickness of the anti-glare layer on the substrate: about 13 μm) (Reflectance Y value: 2.4%)

Preparation Example 5.7

Preparation of Anti-Static Layer

A 100 μm-thick, biaxially oriented polyethylene terephthalate film (product name: A4300; manufactured by: Toyobo Co., Ltd.) was used as a polyester film. The composition for anti-static layer was coated onto the film with a #7 wire-wound rod for coating (Mayer's bar), and the coated film was heat dried in an oven at 50° C. for one minute to evaporate the solvent component. Thereafter, under nitrogen purge (oxygen concentration: 200 ppm or less), ultraviolet light was applied at an exposure of 30 mJ for half curing to cure the coating, thereby forming an anti-static layer having a thickness of 1 μm.

(Preparation of Concavo-Convex Layer)

The composition 4 for a concavo-convex layer was coated onto the anti-static layer with a #10 wire-wound rod for coating (Mayer's bar), and the coating was heat dried in an oven at 70° C. for one minute to evaporate the solvent component. Thereafter, ultraviolet light was applied at an exposure of 30 mJ to cure the coating, thereby forming a concavo-convex layer. Fine particles which have a refractive index difference with a binder resin of up to 0.09 were used in the concavo-convex layer to impart an internal diffusion effect, thereby achieving more effective glare prevention.

(Preparation of Surface Shape Modifying Layer)

The composition 5 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 30 mJ to cure the coating, thereby forming a surface shape modifying layer. Thus, an anti-glare optical laminate was obtained.

(Preparation of Low Refractive Index Layer)

The composition 3 for a low refractive index layer was coated onto the surface shape modifying layer with a #4 wire-wound rod for coating (Mayer's bar), and the coating was heat dried in an oven at 50° C. for one minute to evaporate the solvent component. Thereafter, under nitrogen purge (oxygen concentration: 200 ppm or less), ultraviolet light was applied at an exposure of 150 mJ to cure the coating, thereby forming a low refractive index layer having a thickness of about 100 nm. Thus, an anti-glare, low-reflection optical laminate was obtained. This laminate had anti-static properties. (Total thickness of the anti-glare layer on the substrate: about 14 μm) (Reflectance Y value: 1.9%) (Surface resistivity value: $3.2 \times 10^{12} \Omega/\square$)

Preparation Example 5.8

Preparation of Concavo-Convex Layer

A concavo-convex layer was formed in the same manner as in Preparation Example 5.5.

(Preparation of Surface Shape Modifying Layer)

The composition 7 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less) ultraviolet light was applied at an exposure of 30 mJ to cure the coating, thereby forming a surface shape modifying layer. Thus, an anti-glare optical laminate was obtained.

(Preparation of Low Refractive Index Layer)

On the surface shape modifying layer, a low refractive index layer having a thickness of 100 nm was formed further in the same manner as in Preparation Example 5.6, thereby obtaining an anti-glare, low-reflection optical laminate. (Total thickness of the anti-glare layer on the substrate: about 13 μm) (Reflectance Y value: 0.9%)

Preparation Example 5.9

Preparation of Concavo-Convex Layer

A concavo-convex layer was formed in the same manner as in Preparation Example 5.5.

(Preparation of Surface Shape Modifying Layer)

The (anti-static) composition 6 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 13 μm) (Surface resistivity value: $2.0 \times 10^{12} \Omega/\square$)

Preparation Example 5.10

Preparation of Concavo-Convex Layer

A 100 μm-thick, biaxially oriented polyethylene terephthalate film (product name: A4300; manufactured by: Toyobo Co., Ltd.) was used as a polyester film. The composition 5 for a concavo-convex layer was coated onto the film with a #8 wire-wound rod for coating (Mayer's bar), and the coated film was heat dried in an oven at 70° C. for one minute to evaporate the solvent component. Thereafter, ultraviolet light was applied at an exposure of 30 mJ to cure the coating, thereby forming a concavo-convex layer. Fine particles which have a refractive index difference with a binder resin of up to 0.09 were used in the concavo-convex layer to impart an internal diffusion effect, thereby achieving more effective glare prevention.

(Preparation of Surface Shape Modifying Layer)

The (anti-static) composition 6 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 11 μm) (Surface resistivity value: $2.0 \times 10^{12} \Omega/\square$)

Preparation Example 5.11

Preparation of Concavo-Convex Layer

A concavo-convex layer was formed in the same manner as in Preparation Example 5.10.

(Preparation of Surface Shape Modifying Layer)

The composition 3 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 30 mJ to cure the coating, thereby forming a surface shape modifying layer. Thus, an anti-glare optical laminate was obtained.
(Preparation of Low Refractive Index Layer)

The composition 3 for a low refractive index layer was coated onto the surface shape modifying layer with a #4 wire-wound rod for coating (Mayer's bar), and the coating was heat dried in an oven at 50° C. for one minute to evaporate the solvent component. Thereafter, under nitrogen purge (oxygen concentration: 200 ppm or less), ultraviolet light was applied at an exposure of 150 mJ to cure the coating, thereby forming a low refractive index layer having a thickness of about 100 nm. Thus, an anti-glare, low-reflection optical laminate was obtained. (Total thickness of the anti-glare layer on the substrate: about 11 μm) (Reflectance Y value: 1.8%)

Preparation Example 5.12

Preparation of Anti-Glare Layer (Concavo-Convex Layer)

A 100 μm-thick, biaxially oriented polyethylene terephthalate film (product name: A4300; manufactured by: Toyobo Co., Ltd.) was used as a polyester film. The composition 6 for a concavo-convex layer was coated onto the film with a #10 wire-wound rod for coating (Mayer's bar), and the coated film was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming an anti-glare optical laminate. Fine particles which have a refractive index difference with a binder resin of up to 0.09 were used in the anti-glare layer to impart an internal diffusion effect, thereby achieving more effective glare prevention. (Total thickness of the anti-glare layer on the substrate: about 4.5 μm)

Preparation Example 5.13

Preparation of Concavo-Convex Layer

A 100 μm-thick, biaxially oriented polyethylene terephthalate film (product name: A4300; manufactured by: Toyobo Co., Ltd.) was used as a polyester film. The composition 7 for a concavo-convex layer was coated onto the film with a #8 wire-wound rod for coating (Mayer's bar), and the coated film was heat dried in an oven at 70° C. for one minute to evaporate the solvent component. Thereafter, ultraviolet light was applied at an exposure of 30 mJ to cure the coating, thereby forming a concavo-convex layer. Fine particles which have a refractive index difference with a binder resin of up to 0.09 were used in the concavo-convex layer to impart an internal diffusion effect, thereby achieving more effective glare prevention.
(Preparation of Surface Shape Modifying Layer)

The composition 3 for a surface shape modifying layer was coated on the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 12 μm)

Preparation Example 5.14

Preparation of Anti-Glare Layer (Concavo-Convex Layer)

A 100 μm-thick, biaxially oriented polyethylene terephthalate film (product name: A4300; manufactured by: Toyobo Co., Ltd.) was used as a polyester film. The composition 8 for a concavo-convex layer was coated onto the film with a #28 wire-wound rod for coating (Mayer's bar), and the coated film was heat dried in an oven at 70° C. for one minute to evaporate the solvent component. Thereafter, under nitrogen purge (oxygen concentration: 200 ppm or less), ultraviolet light was applied at an exposure of 30 mJ to cure the coating, thereby forming an anti-glare optical laminate. Fine particles having a refractive index difference with a binder resin of up to 0.09 were used in the anti-glare layer to impart an internal diffusion effect, thereby achieving more effective glare prevention. (Total thickness of the anti-glare layer on the substrate: about 27 μm) (Reflectance Y value: 1.6%)

Preparation Example 5.15

Preparation of Concavo-Convex Layer

A 100 μm-thick, biaxially oriented polyethylene terephthalate film (product name: A4300; manufactured by: Toyobo Co., Ltd.) was used as a polyester film. The composition 9 for a concavo-convex layer was coated onto the film with a #8 wire-wound rod for coating (Mayer's bar), and the coated film was heat dried in an oven at 70° C. for one minute to evaporate the solvent component. Thereafter, ultraviolet light was applied at an exposure of 30 mJ to cure the coating, thereby forming a concavo-convex layer. Fine particles which have a refractive index difference with a binder resin of up to 0.09 were used in the concavo-convex layer to impart an internal diffusion effect, thereby achieving more effective glare prevention.
(Preparation of Surface Shape Modifying Layer)

A surface shape modifying layer was further formed on the concavo-convex layer in the same manner as in Preparation Example 5.13, thereby obtaining an anti-glare optical laminate. (Total thickness of the anti-glare layer on the substrate: about 11 μm)

Preparation Example 5.16

Preparation of Concavo-Convex Layer

A 100 μm-thick, biaxially oriented polyethylene terephthalate film (product name: A4300; manufactured by: Toyobo Co., Ltd.) was used as a polyester film. The composition 10 for a concavo-convex layer was coated onto the film with a #8 wire-wound rod for coating (Mayer's bar), and the coated film was heat dried in an oven at 70° C. for one minute to evaporate the solvent component. Thereafter, ultraviolet light was applied at an exposure of 30 mJ to cure the coating, thereby forming a concavo-convex layer. Fine particles which have a refractive index difference with a binder resin of up to 0.09 were used in the concavo-convex layer to impart an internal diffusion effect, thereby achieving more effective glare prevention.

(Preparation of Surface Shape Modifying Layer)

The composition 8 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 11 μm)

Preparation Example 5.17

Preparation of Concavo-Convex Layer

A concavo-convex layer was formed in the same manner as in Preparation Example 5.16.

(Preparation of Surface Shape Modifying Layer)

The composition 9 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 30 mJ to cure the coating, thereby forming a surface shape modifying layer. Thus, an anti-glare optical laminate was obtained.

(Preparation of Low Refractive Index Layer)

The composition 1 for a low refractive index layer was coated onto the surface shape modifying layer with a #4 wire-wound rod for coating (Mayer's bar), and the coating was heat dried in an oven at 50° C. for one minute to evaporate the solvent component. Thereafter, under nitrogen purge (oxygen concentration: 200 ppm or less), ultraviolet light was applied at an exposure of 150 mJ to cure the coating, thereby forming a low refractive index layer having a thickness of about 100 nm. Thus, an anti-glare, low-reflection optical laminate was obtained. (Total thickness of the anti-glare layer on the substrate: about 11 μm) (Reflectance Y value: 1.2%)

Preparation Example 5.18

Preparation of Concavo-Convex Layer

A 100 μm-thick, biaxially oriented polyethylene terephthalate film (product name: A4300; manufactured by: Toyobo Co., Ltd.) was used as a polyester film. The composition 11 for a concavo-convex layer was coated onto the film with a #8 wire-wound rod for coating (Mayer's bar), and the coated film was heat dried in an oven at 70° C. for one minute to evaporate the solvent component. Thereafter, ultraviolet light was applied at an exposure of 30 mJ to cure the coating, thereby forming a concavo-convex layer. Fine particles having a refractive index difference with a binder resin of up to 0.09 was used in the concavo-convex layer to impart an internal diffusion effect, thereby achieving more effective glare prevention.

(Preparation of Surface Shape Modifying Layer)

A surface shape modifying layer was formed on the concavo-convex layer in the same manner as in Preparation Example 5.16, thereby obtaining an anti-glare optical laminate. (Total thickness of the anti-glare layer on the substrate: about 11 μm)

Preparation Example 5.19

Preparation of Concavo-Convex Layer

A concavo-convex layer was formed in the same manner as in Preparation Example 5.18 except that the composition 11 for a concavo-convex layer was altered to the composition 12 for a concavo-convex layer.

(Preparation of Surface Shape Modifying Layer)

A surface shape modifying layer was formed on the concavo-convex layer in the same manner as in Preparation Example 5.16, thereby obtaining an anti-glare optical laminate. (Total thickness of the anti-glare layer on the substrate: about 11 μm)

Preparation Example 5.20

Preparation of Concavo-Convex Layer

A concavo-convex layer was formed in the same manner as in Preparation Example 5.19.

(Preparation of Surface Shape Modifying Layer)

The composition 9 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 30 mJ to cure the coating, thereby forming a surface shape modifying layer. Thus, an anti-glare optical laminate was obtained.

(Preparation of Low Refractive Index Layer)

The composition 1 for a low refractive index layer was coated onto the surface shape modifying layer with a #4 wire-wound rod for coating (Mayer's bar), and the coating was heat dried in an oven at 50° C. for one minute to evaporate the solvent component. Thereafter, under nitrogen purge (oxygen concentration: 200 ppm or less), ultraviolet light was applied at an exposure of 150 mJ to cure the coating, thereby forming a low refractive index layer having a thickness of about 100 nm. Thus, an anti-glare, low-reflection optical laminate was obtained. (Total thickness of the anti-glare layer on the substrate: about 11 μm) (Reflectance Y value: 1.2%)

Preparation Example 5.21

Preparation of Concavo-Convex Layer

A concavo-convex layer was formed in the same manner as in Preparation Example 5.18 except that the composition 11 for a concavo-convex layer was altered to the composition 13 for a concavo-convex layer.

(Preparation of Surface Shape Modifying Layer)

The composition 8 for a surface shape modifying layer was coated onto the concavo-convex layer with a #12 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 11 μm)

Preparation Example 5.22

Preparation of Concavo-Convex Layer

A concavo-convex layer was formed in the same manner as in Preparation Example 5.18 except that the composition 11 for a concavo-convex layer was altered to the composition 14 for a concavo-convex layer.
(Preparation of Surface Shape Modifying Layer)

A surface shape modifying layer was disposed on the concavo-convex layer in the same manner as in Preparation Example 5.21, thereby obtaining an anti-glare optical laminate. (Total thickness of the anti-glare layer on the substrate: about 11 μm)

Preparation Example 5.23

Preparation of Embossing Roller

An iron roller was provided. Against the surface of the roller, 100 mesh glass beads (particle size distribution: 106 μm to 150 μm) were shot to form concavoconvexes. The concavo-convex surface thus obtained was plated with chromium to a thickness of 5 μm, to prepare an embossing roller. In bead shot blasting, blasting pressure, the spacing between the blasting nozzle and the roller, and the like were regulated to control an embossing roller which corresponds to optical characteristics of the concavoconvexeshape in the anti-glare layer provided in the optical laminate according to the present invention.
(Preparation of Primer Layer)

A composition prepared by mixing a polyurethane resin primer coating material (a medium main agent for chemical mat varnish, curing agent (XEL curing agent (D)); manufactured by The Inctec Inc.) in the mass ratio of main agent to curing agent to solvent of 10:1:3.3 was gravure-coated on a 100 μm-thick polyethylene terephthalate resin film (product name: A4300; manufactured by: Toyobo Co., Ltd.) The coated film was dried to form a 3 μm-thick primer layer. The solvent used was a mixed solvent composed of toluene and methyl ethyl ketone in a ratio of 1:1.
(Preparation of Concavo-Convex Layer)

The embossing roller prepared above, embossing roller 47, was mounted on an embossed film manufacturing apparatus 40 shown in FIG. 16. The above-prepared composition 16 for a concavo-convex layer was supplied into a liquid reservoir 44 in a coating head 43. The liquid reservoir 44 was continuously kept at 40° C. A 100 μm-thick, polyethylene terephthalate film 41 (product name: A4300; manufactured by: Toyobo Co., Ltd.) having the primer layer formed thereon was provided and supplied to the embossing roller 47. The composition 16 for a concavo-convex layer was ejected from a slot 49 and coated onto an embossing roller 47. The polyethylene terephthalate film was disposed on the composition and laminated with a rubber roller 45a. Subsequently, by means of an ultraviolet light source 48, ultraviolet light was applied from the film side at an exposure of 200 mJ to cure the coating. The laminate was then separated from the embossing roller 47 with a rubber roller 45b, thereby producing an anti-glare layer. (Total thickness of the anti-glare layer on the substrate: about 15 μm)

Preparation Example 5.24

Preparation of Concavo-Convex Layer

A 100 μm-thick, biaxially oriented polyethylene terephthalate film (product name: A4300; manufactured by: Toyobo Co., Ltd.) was used as a polyester film. The composition 26 for a concavo-convex layer was coated onto the film with a #24 wire-wound rod for coating (Mayer's bar). The coating was heat dried in an oven at 80° C. for two minutes to evaporate the solvent component, and a phase separation-type concavo-convex layer was formed by spinodal decomposition from a liquid phase. Thereafter, ultraviolet light was applied at an exposure of 100 mJ to cure the coating, thereby forming an anti-glare layer. (Total thickness of the anti-glare on the substrate: about 8 μm)

Preparation Example 5.25

The composition 1 for a surface shape modifying layer was coated onto a light diffusion film: a 120 μm-thick light diffusion film manufactured by: TSUJIDEN Co., Ltd. (product name: D122, the light transparent substrate was a polyethylene terephthalate film) with a #8 wire-wound rod for coating (Mayer's bar). The coated film was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 25 μm)

Preparation Example 5.26

Preparation of Anti-Glare Layer (Concavo-Convex Layer)

A 100 μm-thick, biaxially oriented polyethylene terephthalate film (product name: A4300; manufactured by: Toyobo Co., Ltd.) was used as a polyester film. The composition 17 for a concavo-convex layer was coated onto the film with a #8 wire-wound rod for coating (Mayer's bar), and the coated film was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming an anti-glare optical laminate. (Total thickness of the anti-glare layer on the substrate: about 5 μm)

Preparation Example 5.27

Preparation of Anti-Glare Layer (Concavo-Convex Layer)

An anti-glare optical laminate was formed in the same manner as in Preparation Example 5.26 except that in place of the composition 17 for a concavo-convex layer, the composition 18 for a concavo-convex layer was coated onto the film with a #10 wire-round rod for coating (Mayer's bar). The laminate prepared had a wide average particle size distribution. Consequently, owing to the influence of giant particles present irregularly, the evenness of the concavo-convex shape was lost, thereby increasing the glare. (Total thickness of the anti-glare layer on the substrate: about 5 μm).

Preparation Example 5.28

Preparation of Anti-Glare Layer (Concavo-Convex Layer)

An anti-glare optical laminate was formed in the same manner as in Preparation Example 5.26 except that in place of the composition 17 for a concavo-convex layer, the composition 19 for a concavo-convex layer was coated onto the film with a #14 wire-wound rod for coating (Mayer's bar). (Total thickness of the anti-glare layer on the substrate: about 7 μm)

Preparation Example 5.29

Preparation of Anti-Glare Layer (Concavo-Convex Layer)

An anti-glare optical laminate was formed in the same manner as in Preparation Example 5.26 except that in place of the composition 17 for a concavo-convex layer, the composition 19 for a concavo-convex layer was coated onto the film with a #12 wire-wound rod for coating (Mayer's bar). (Total thickness of the anti-glare layer on the substrate: about 6 μm)

Preparation Example 5.30

Preparation of Anti-Glare Layer (Concavo-Convex Layer)

An anti-glare optical laminate was formed in the same manner as in Preparation Example 5.26 except that in place of the composition 17 for a concavo-convex layer, the composition 19 for a concavo-convex layer was coated onto the film with a #10 wire-wound rod for coating (Mayer's bar). (Total thickness of the anti-glare layer on the substrate: about 5 μm)

Preparation Example 5.31

Preparation of Anti-Glare Layer (Concavo-Convex Layer)

An anti-glare optical laminate was formed in the same manner as in Preparation Example 5.26 except that in place of the composition 17 for a concavo-convex layer, the composition 20 for a concavo-convex layer was coated onto the film with a #10 wire-wound rod for coating (Mayer's bar). (Total thickness of the anti-glare layer on the substrate: about 4.5 μm)

Preparation Example 5.32

Preparation of Anti-Glare Layer (Concavo-Convex Layer)

An anti-glare optical laminate was formed in the same manner as in Preparation Example 5.26 except that in place of the composition 17 for a concavo-convex layer, the composition 21 for a concavo-convex layer was coated onto the film with a #10 wire-wound rod for coating (Mayer's bar). (Total thickness of the anti-glare layer on the substrate: about 7 μm)

Preparation Example 5.33

Preparation of Anti-Glare Layer (Concavo-Convex Layer)

An anti-glare optical laminate was formed in the same manner as in Preparation Example 5.26 except that in place of the composition 17 for a concavo-convex layer, the composition 22 for a concavo-convex layer was coated onto the film with a #12 wire-wound rod for coating (Mayer's bar). (Total thickness of the anti-glare layer on the substrate: about 4.5 μm)

Preparation Example 5.34

Preparation of Anti-Glare Layer (Concavo-Convex Layer)

An anti-glare optical laminate was formed in the same manner as in Preparation Example 5.26 except that in place of the composition 17 for a concavo-convex layer, the composition 23 for a concavo-convex layer was coated onto the film with a #12 wire-wound rod for coating (Mayer's bar). (Total thickness of the anti-glare layer on the substrate: about 4.5 μm)

Preparation Example 5.35

Preparation of Concavo-Convex Layer

A 100 μm-thick, biaxially oriented polyethylene terephthalate film (product name: A4300; manufactured by: Toyobo Co., Ltd.) was used as a polyester film. The composition 24 for a concavo-convex layer was coated onto the film with a #8 wire-wound rod for coating (Mayer's bar), and the coated film was heat dried in an oven at 70° C. for one minute to evaporate the solvent component. Thereafter, under nitrogen purge (oxygen concentration: 200 ppm or less), ultraviolet light was applied at an exposure of 14 mJ to cure the coating, thereby forming a concavo-convex layer.

(Preparation of Surface Shape Modifying Layer)

The composition 3 for a surface shape modifying layer was coated onto the concavo-convex layer with a #20 wire-wound rod for coating (Mayer's bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 13.5 μm)

Preparation Example 5.36

Preparation of Anti-Glare Layer (Concavo-Convex Layer)

An anti-glare optical laminate was formed in the same manner as in Preparation Example 5.26 except that in place of the composition 17 for a concavo-convex layer, the composition 25 for a concavo-convex layer was coated onto the film with a #8 wire-wound rod for coating (Mayer's bar). (Total thickness of the anti-glare layer on the substrate: about 3 μm)

Preparation Example 5.37

Preparation of Concavo-Convex Layer

A 100 μm-thick, biaxially oriented polyethylene terephthalate film (product name: A4300; manufactured by: Toyobo Co., Ltd.) was used as a polyester film. The composition 15 for a concavo-convex layer was coated onto the film with a #14 wire-wound rod for coating (Mayer's bar), and the coated film was heat dried in an oven at 70° C. for one minute to evaporate the solvent component. Thereafter, ultraviolet light was applied at an exposure of 30 mJ to cure the coating, thereby forming a concavo-convex layer. Fine particles having a refractive index difference with a binder resin of up to 0.09 was used in the concavo-convex layer to impart an internal diffusion effect, thereby achieving more effective glare prevention.
(Preparation of Surface Shape Modifying Layer)
The composition 3 for a surface shape modifying layer was coated onto the concavo-convex layer with a #12 wire-wound rod for coating (Mayer's Bar), and the coating was heat dried in an oven at 70° C. for one minute to evaporate the solvent component. Thereafter, under nitrogen purge (oxygen concentration: 200 ppm or less), ultraviolet light was applied at an exposure of 100 mJ to cure the coating, thereby forming a surface shape modifying layer. Thus, an anti-glare optical laminate was obtained. (Total thickness of the anti-glare layer on the substrate: about 16 μm)

Example 1

A front filter of the present invention shown in FIG. 6 was prepared by the following method.
(1) Preparation of Polyester Film
As a polyester film, a 100 μm-thick, colorless and transparent biaxially oriented polyethylene terephthalate (PET) film (product name: A4300; manufactured by: Toyobo Co., Ltd.) in the form of a continuous belt was taken.
(2) Preparation of Adhesive Layer (Ultraviolet Absorbing Layer)
An adhesive layer mixed with an ultraviolet absorbing agent was formed on the PET film.
A coating solution for forming the adhesive layer was prepared such that a (benzotriazole-containing) ultraviolet absorbing agent of 1 percent by mass was added to and thoroughly dispersed in an acrylic adhesive solution prepared by dissolving an acrylic adhesive (product name: LA2140; manufactured by: Kuraray Co., Ltd.) in a solvent of methyl ethyl ketone and toluene (compounding ratio=1:1 on mass basis)} to a solid content of 20% (on mass basis).
The coating solution was coated onto the polyester film with a die coater to a coated amount of 20 g/m2. The coated laminate was dried in an oven, in which dry air with a wind speed of 5 m/sec was applied, at 100° C. for one minute to form an adhesive layer, thereby obtaining a composite filter in the form of a continuous belt. A peelable release film was further adhered to the surface of the adhesive layer for protection.
Thereafter, a laminate comprising [PET film/adhesive layer (ultraviolet absorbing layer)] was obtained. The symbol "/" as used herein denotes that layers adjacent to "/" are stacked together.
(3) Preparation of Anti-Glare Layer
In the same manner as in Preparation Example 5.1, a layer which corresponds to the anti-glare layer provided to the anti-glare optical laminate obtained in Preparation Example 5.1, was formed on the PET film-side surface of the laminate obtained in (2).
Thereafter, a front filter of Example 1 was obtained comprising [anti-glare layer/PET film/adhesive layer (ultraviolet absorbing layer)].

Examples 2 to 25

Front filters of Examples 2 to 24 were respectively obtained in the same manner as in Example 1 except that in the preparation of anti-glare layer in Example 1, anti-glare layers corresponding to those of the anti-glare optical laminates obtained in Preparation Examples 5.2 to 5.25 were respectively formed on the polyester film-side surface of the laminate obtained in (2) of Example 1.

Comparative Examples 1 to 12

Front filters of Comparative Examples 1 to 12 were respectively obtained in the same manner as in Example 1 except that in the preparation of anti-glare layer in Example 1, anti-glare layers corresponding to those of the anti-glare optical laminates obtained in Preparation Examples 5.26 to 5.37 were respectively formed on the polyester film-side surface of the laminate obtained in (2) of Example 1.

Example 26

A front filter of the present invention shown in FIG. 9 was prepared by the following method.
(1) Preparation of Laminate [UV Absorbing Layer (PET Film)/Primer Layer/Transparent Electrical Conductor Layer]
At first, a 10 μm-thick electrolytic copper foil in the form of a continuous belt was taken as an electrical conductor layer, in which a blackened layer comprising copper-cobalt alloy particles was formed on one surface of the foil by electrolytic plating. Both surfaces of the copper foil were subject to zinc plating, followed by a publicly-known chromate treatment by the dipping method, thereby forming a corrosion-resistant layer on the both surfaces, respectively.
A 100 μm-thick, colorless and transparent biaxially oriented polyethylene terephthalate (PET) film (product name: A4300; manufactured by: Toyobo Co., Ltd.) in the form of a continuous belt was also taken. The PET film was a film comprising an ultraviolet (UV) absorbing agent and capable of functioning also as an ultraviolet (UV) absorbing layer.
Next, a polyester resin primer layer was respectively formed on both surfaces of the PET film.
Then, the blackened layer-side surface of the copper foil was adhered to the primer layer of the PET film by dry lamination with a transparent, two-component curable urethane resin adhesive comprising 12 parts by weight of, as a main agent, a polyester polyurethane polyol having an average molecular weight of 30,000 and 1 part by weight of, as a curing agent, a xylene diisocyanate prepolymer, followed by curing at 50° C. for three days, thereby obtaining a continuous belt-shaped laminate a having a 7 μm-thick, transparent adhesive layer formed between the copper foil (corrosion-resistant layer) and PET film thereof.
Then, etching was performed on the electrical conductor layer and blackened layer of the continuous belt-shaped laminate by the photolithography method to form a conductive mesh layer having a mesh area comprising opening parts and line parts, and a frame-shaped, non-meshed ground area on the peripheral part which surrounded all four sides of the mesh area.
In the etching, more specifically, the continuous belt-shaped laminated sheet underwent a series of processes from masking to etching thoroughly on a production line for producing shadow masks for color TV sets. That is, a photosensitive, negative-type etching resist was coated onto the whole surface of the conductor layer of the laminated sheet. Then, a mask having a negative pattern of a desired mesh pattern was placed in contact with the resist, exposed to light, developed, cured and baked to pattern a resist layer such that the resist layer remained on the area corresponding to the line parts of the mesh, and no resist layer remained on the areas corresponding to the opening parts of the mesh. Thereafter, the electrical conductor layer and the blackened layer were etched away with ferric chloride solution to form mesh openings, followed by washing with water, resist removal, cleaning and drying in sequence.

Thereafter, a continuous belt-shaped laminate comprising [UV absorbing layer (PET film)/primer layer/transparent electrical conductor layer] was obtained. The symbol "/" as used herein denotes that layers adjacent to "/" are stacked together.

(2) Preparation of Adhesive Layer (Ne Light Absorbing, NIR Absorbing and Color Adjusting Layer)

An adhesive layer mixed with various dyes was formed on the electrical conductor layer-side (metal mesh layer-side) surface of the continuous belt-shaped laminate obtained in (1).

As the adhesive for forming the adhesive layer, coating solution was prepared such that the following three NIR absorbing phthalocyanine dyes, EXCOLOR IR-10A of 0.04 part by weight, EXCOLOR 906B of 0.02 part by weight and EXCOLOR 910B of 0.04 part by weight (product names; manufactured by: Nippon Shokubai Co., Ltd.), a Ne light absorbing porphyrin dye (product name: TAP-2; manufactured by: Yamada Chemical Co., Ltd.) of 0.009 part by weight and a color adjusting dye (product name: Plast red 8320; manufactured by: Arimoto Chemical Co., Ltd.) of 0.005 part by weight were respectively added to and thoroughly dispersed in an acrylic adhesive solution prepared by dissolving an acrylic adhesive (product name: LA2140; manufactured by: Kuraray Co., Ltd.) in a solvent of methyl ethyl ketone and toluene (compounding ratio=1:1 on mass basis) to a solid content of 20% (on mass basis).

The coating solution was coated onto the electrical conductor layer of the laminate with a die coater to a coated amount of 20 g/m$^2$. The coated laminate was dried in an oven, in which dry air was applied at a wind speed of 5 m/sec, at 100° C. for one minute to form an adhesive layer, thereby obtaining a composite filter in the form of a continuous belt. A peelable release film was further adhered to the surface of the adhesive layer for protection.

Thereafter, a laminate comprising [UV absorbing Layer (PET film)/primer layer/transparent electrical conductor layer/Ne light absorbing, NIR absorbing and color adjusting layer (adhesive layer)] was obtained.

(3) Preparation of Anti-Glare Layer (Stacking of Laminates for Forming Composite Laminate)

In the same manner as in Preparation Example 5.1, a layer which corresponds to the anti-glare layer provided to the anti-glare optical laminate obtained in Preparation Example 5.1 was formed on the UV absorbing layer-side (PET film-side) surface of the laminate obtained in (1).

Thereafter, a front filter of Example 26 was obtained comprising [anti-glare layer/UV absorbing layer (PET film)/primer layer/transparent electrical conductor layer/Ne light absorbing, NIR absorbing and color adjusting layer (adhesive layer)].

Examples 27 to 50

Front filters of Examples 27 to 50 were respectively obtained in the same manner as in Example 26 except that in the preparation of anti-glare layer in Example 26, anti-glare layers corresponding to those of the anti-glare optical laminates obtained in Preparation Examples 5.2 to 5.25 were respectively formed on the UV absorbing layer-side (PET film-side) surface of the laminate obtained in (2).

Comparative Examples 13 to 24

Front filters of Comparative Examples 13 to 24 were respectively obtained in the same manner as in Example 26 except that in the preparation of anti-glare layer in Example 26, anti-glare layers corresponding to those of the anti-glare optical laminates obtained in Preparation Examples 5.26 to 5.37 were respectively formed on the UV absorbing layer-side (PET film-side) surface of the laminate obtained in (2).

Comparative Example 25

(1) Preparation of Polyester Film

As a polyester film, a 100 µm-thick, colorless and transparent biaxially oriented polyethylene terephthalate (PET) film (product name: A4300; manufactured by: Toyobo Co., Ltd.) in the form of a continuous belt was taken.

(2) Preparation of Anti-Glare Layer (i) Preparation of Concavo-Convex Mold

A metal plate comprising an iron plate covered with a copper plating layer was taken, and a matte granular chromium plating layer was provided onto a surface of the copper plating layer to prepare a concavo-convex mold having formed on a surface thereof a concavoconvex shape of Sm=151 µm, θa=0.75° and Rz=1.13 µm shown in Table 1.

(ii) Preparation of Coating with Composition for Concavo-Convex Layer

The composition 27 for a concavo-convex layer obtained in Preparation Example 1.27 was onto the surface of the PET film with a #10 wire-wound rod for coating (Mayer's bar), and the coating was heat dried in an oven at 70° C. for 30 seconds to evaporate the solvent component.

(iii) Embossing of Concavoconvexes

The concavo-convex shaped surface of the concavo-convex mold was pressed and adhered to the above-obtained coating of the composition for a concavo-convex layer. Thereafter, ultraviolet light was applied to the coating from the PET film side at an exposure of 30 mJ to cure the coating. The concavo-convex mold was then released, thereby obtaining a concavo-convex layer in which the concavo-convex shape of the concavo-convex mold was embossed on the surface of the coating. This concavo-convex layer was used as an anti-glare layer.

(3) Preparation of Adhesive Layer (Ultraviolet Absorbing Layer)

In the same manner as in Example 1, an adhesive layer mixed with an ultraviolet absorbing agent was formed on the surface of the PET film, which was opposite to the surface on which the anti-glare layer was formed.

Thereafter, a front filter of Comparative Example 25 was obtained comprising [anti-glare layer/PET film/adhesive layer (ultraviolet absorbing layer)].

Comparative Example 26

The preparation condition of a matte chromium plating layer in "(2) (i) Preparation of concavo-convex mold" in Comparative Example 25 was changed to prepare a concavo-convex mold having formed on a surface thereof a concavo-convex shape of Sm=187 µm, θa=0.10° and Rz=1.98 µm shown in Table 1.

Thereafter, a front filter of Comparative Example 26 was obtained in the same manner as in Comparative Example 25, except the above.

Comparative Example 27

A front filter of Comparative Example 27 was obtained in the same manner as in Preparation Example 25 except that a concavo-convex mold in "(2) (i) Preparation of concavo-convex mold" of Comparative Example 25 was prepared as follows by electroforming.

At first, a silicone resin was used to make a mold of a polyethylene terephthalate film, which was prepared by mixing polyethylene terephthalate with calcium carbonate particles having a particle size distribution from 1 to 10 μm, and stretching the mixture to form a film. Further, a two-component curable urethane resin was then used to make a mold of the silicone resin mold. The urethane resin mold was surface-treated to be conductive by the silver mirror reaction. Then, the surface of the silver mirror coating was electrolytically plated with copper to form a copper layer thereon. Thereafter, the copper layer was released from the urethane resin mold, thereby preparing a concavo-convex mold having formed on a surface thereof a concavo-convex shape of Sm=158 μm, θa=0.43° and Rz=0.17 μm shown in Table 1.

Comparative Examples 28 to 38

Front filters of Comparative Examples 28 to 38 were obtained in the same manner as in Comparative Example 27 except that the particle size distribution, added amount and stretching condition of calcium carbonate were changed to prepare concavo-convex molds having formed on the surface thereof a concavo-convex shape having "Sm", "θa" and "Rz" of Comparative Examples 28 to 38 shown in Table 1.

Comparative Examples 39 to 52

Front filters of Comparative Examples 39 to 52 were obtained in the same manner as in Example 26 except that the anti-glare layer disposed on the surface of the front filter having the structure disclosed in Example and FIG. 9 was changed to that disclosed in Comparative Examples 25 to 38, respectively.

[Evaluation Method]

The above-mentioned Preparation Examples 5, Examples and Comparative Examples were evaluated in terms of the following criteria. The results of Example 1 to 25, Comparative Examples 1 to 12 and Comparative Examples 25 to 38 are shown in Table 1. The results of Examples 26 to 50, Comparative Examples 13 to 24 and Comparative Examples 39 to 52 are shown in Table 2. Therefore, the measurement results of thickness, surface resistivity and reflectance Y value of the anti-glare layers obtained in Examples and Comparative Examples are found to be similar to those of the anti-glare layers that were obtained in Preparation Examples.

Evaluation 1: Surface Shape and Optical Characteristics

In accordance with the following definitions, the parameters "Sm", "θa" and "Rz" were measured for the front filters of Examples and Comparative Examples.

I) "Sm", "θa" and "Rz"

The definitions of "Sm", "θa" and "Rz" conform to JIS B0601 (1994). Measurement was conducted by means of a surface roughness measuring device (model: SE-3400; manufactured by: Kosaka Laboratory Ltd.) under the following measuring conditions.

1) Stylus in Surface Roughness Detector

Model No. SE2555N (standard: 2 μm) manufactured by Kosaka Laboratory Ltd.

(Radius of curvature in tip: 2 μm/apex angle: 90°/material: diamond)

2) Measuring Conditions for Surface Roughness Measuring Device

Reference length (cut-off value of roughness curve "λc"): 0.8 mm

Evaluation length: (reference length (Cut-off value "λc")× 5): 4.0 mm

Feed speed of stylus: 0.1 mm/sec

Evaluation 2: Glossy Black Feeling in Bright Room Environment

FIG. 17 schematically shows the method for measuring the glossy black feeling of the front filter for a plasma display according to the present invention in a bright room environment. A black acrylic plate 102 was adhered to the display device side of a front filter 101 of Examples or Comparative Examples, with the aid of an acrylic adhesive for optical films (product name: DA-1000; manufactured by: Hitachi Chemical Co., Ltd.), thus preparing an evaluation sample 100. The evaluation sample 100 was placed on a horizontal plane, and the evaluation sample 100, an evaluator 103 and a three-wavelength tube (30W) 104 were arranged in the positional relationship as shown in FIG. 17. Visual sensory evaluation was carried out while turning on the three-wavelength tube 104, and glossy black feeling was evaluated in detail according to the following criteria.

(Evaluation Criteria)

○: Wet glossy black color could be reproduced.

x: Wet glossy black color could not be reproduced.

Evaluation 3: Anti-Reflection Performance

FIG. 18 schematically shows the method for measuring the anti-reflection performance of the front filter for a plasma display according to the present invention. A jig 105 was equipped with an evaluation sample 100 in which a black acrylic plate 102 was adhered to the display device side of a front filter 101 of Examples or Comparative Examples, with the aid of an acrylic adhesive for optical films (product name: DA-1000; manufactured by: Hitachi Chemical Co., Ltd.) A black and white striped plate 106 of 20 mm in width was also taken. The evaluation sample 100, an evaluator 103 and the black and white striped plate 106 were arranged in the positional relationship as shown in FIG. 18. Moreover, adjustment of the positional relationship with a desired number of three-wavelength tubes (30W) 104 installed on a desired positions of the room's ceiling was conducted so as to provide the sample surface with an illuminance of 250 lx and a luminance of the stripe (white) of 65 cd/m². Visual sensory evaluation was carried out in such a manner that an observer looked at the sample and determined by the visibility of the reflected stripe, in accordance with the criteria defined as follows:

(Evaluation Criteria)

○: Stripe was discernible.

x: Stripe was not discernible.

Evaluation 4: Bright Room Contrast

A PDP 107, a front filter 101 and two 40-watt white fluorescent lamps 108 (product name: Neoline White FL40S-W; manufactured by: Toshiba Lighting & Technology Corporation) were arranged as shown in FIG. 20. Outside light was controlled so that the value of illuminance measured at the center of the surface of a PDP display with a luminance meter was 370 lx. In this condition, the evaluator performed the following visual evaluation at the position of a luminance meter 109 in FIG. 20.

Visual evaluation of contrast was carried out as follows. An image data was taken, showing a grid pattern in which squares in two colors comprising an achromatic image data at maximum concentration (absolute black) and another achromatic image data at minimum concentration (absolute white) were alternately arranged. This image data was displayed on a PDP (product name: PDP-435HDL (42-inch); manufactured by: Pioneer Corporation; image quality (brightness and contrast) was set at "standard" mode). All of the front filters of Examples and Comparative Examples were put in front of the PDP in sequence to perform evaluation based on whether the boundary between the black and white images in the pattern seems clearly visible or not by visual observation. The symbol "⊚" represents the case where the boundary between the black and white images was clearly visible, and it was felt that there was no difference in visibility even after the fluorescent lamps for testing were turned off. The symbol "○" represents the case where although the boundary between the black and white images was visible, it was felt that there was a slight difference in visibility after the fluorescent lamps for testing were turned off, and there was no feeling of discomfort associated with it, however. The symbol "X" represents the case where the boundary between the black and white images was not discernible or, even though it was visible, there was a large difference in visibility after the fluorescent lamps for testing were turned off, and there was a feeling of discomfort associated with it.

Evaluation 5: Others 5.1) Thickness of Anti-Glare Layer

The thickness of the anti-glare layer was obtained in such a manner that a confocal laser scanning microscope (product name: Leica TCS-NT, magnification: 300× to 800×; manufactured by: Leica) was used to observe the section of the front filter for determination of the presence of an interface. More specifically, in order to obtain clear images having no halation, the confocal laser scanning microscope was equipped with a wet objective lens. Moreover, about 2 ml of oil having a refractive index of 1.518 was applied on the front filter to eliminate a layer of air between the objective lens and the front filter, followed by observation and evaluation.

For one image plane, a thickness from the substrate to the peak of the highest convex portion and another thickness from the substrate to the valley of the lowest concave portion were measured. That is, the layer thickness was measured for two points in total for one image plane. This measurement was carried out for five image planes, that is, 10 points in total, and the average value was determined.

5.2) Pencil Hardness

Pencil hardness was measured with a pencil scratch hardness tester (manufactured by: Toyo Seiki Seisaku-sho, Ltd.) in accordance with JIS K-5400. The "pencil hardness of the optical laminate" in the present invention denotes pencil hardness measured by performing a pencil hardness test, which conforms to JIS K-5400, on the observer-side surface of the anti-glare layer formed on the polyester film. This pencil hardness test is carried out to find the hardness of the pencil that caused no trouble in appearance, such as scratch, in at least three of five pencil hardness tests performed. For example, a 3H pencil is used in five tests and no problem in appearance is found in three tests, the pencil hardness of the optical laminate is at least 3H.

In the case of conducting the test with a load of 4.9 N, it was found that all of the optical laminates obtained in Examples of the present invention had a pencil hardness of 4H.

5.3) Measurement of Surface Resistivity

In the case where an anti-static layer and/or anti-reflection layer was included in the anti-glare layer, surface resistivity (W) was measured with a surface resistivity meter (product name: Hiresta IP MCP-HT260; manufactured by: Mitsubishi Chemical Corporation) at an impressed voltage of 1,000 V.

5.4) Reflectance Y Value (Luminous Reflectance)

In the case where an anti-static layer and/or anti-reflection layer was included in the anti-glare layer, the reflectance Y value was determined by measuring five-degree regular reflectance in a wavelength range from 380 to 780 nm with a spectrophotometer (product name: MPC3100; manufactured by: Shimadzu Corporation) and then converting the reflectance value to lightness which can be perceived by the human eye with a software (incorporated in MPC3100). The five-degree regular reflectance was measured in such a state that, in order to prevent the backside reflection of the film as the optical laminate, a black tape (manufactured by: Teraoka Seisakusho Co., Ltd.) was applied to the side opposite to the film surface to be measured.

Evaluation 6: Comprehensive Evaluation

The front filter which could achieve "⊚" or "○" in all of "Glossy Black Feeling in bright Room Environment", "Anti-reflection Performance" and "Bright room Contrast" is represented by "○" under "comprehensive evaluation". The front filter which could not achieve "⊚" or "○" in at least one of the three evaluations is represented by "X" under "comprehensive evaluation."

TABLE 1

| | Corresponding Preparation Example 5 | Evaluation 1 Surface Roughness | | | Evaluation 2 Glossy Black Feeling | Evaluation 3 Anti-reflection Performance | Evaluation 4 Bright Room Contrast | Comprehensive Evaluation |
|---|---|---|---|---|---|---|---|---|
| | | Sm | θa | Rz | | | | |
| Example 1 | Preparation Example 5.1 | 155 | 0.38 | 0.51 | ○ | ○ | ○ | ○ |
| Example 2 | Preparation Example 5.2 | 127.2 | 0.56 | 0.64 | ○ | ○ | ○ | ○ |
| Example 3 | Preparation Example 5.3 | 100.8 | 0.44 | 0.58 | ○ | ○ | ○ | ○ |
| Example 4 | Preparation Example 5.4 | 165 | 0.40 | 0.54 | ○ | ○ | ○ | ○ |
| Example 5 | Preparation Example 5.5 | 161 | 0.65 | 0.72 | ○ | ○ | ○ | ○ |
| Example 6 | Preparation Example 5.6 | 185 | 0.52 | 0.51 | ○ | ○ | ○ | ○ |
| Example 7 | Preparation Example 5.7 | 187 | 0.54 | 0.39 | ○ | ○ | ○ | ○ |
| Example 8 | Preparation Example 5.8 | 150 | 0.48 | 0.58 | ○ | ○ | ○ | ○ |
| Example 9 | Preparation Example 5.9 | 143 | 0.70 | 0.77 | ○ | ○ | ○ | ○ |
| Example 10 | Preparation Example 5.10 | 104.6 | 0.91 | 0.48 | ○ | ○ | ○ | ○ |
| Example 11 | Preparation Example 5.11 | 106 | 0.96 | 0.98 | ○ | ○ | ○ | ○ |

TABLE 1-continued

| | Corresponding Preparation Example 5 | Evaluation 1 Surface Roughness | | | Evaluation 2 Glossy Black Feeling | Evaluation 3 Anti-reflection Performance | Evaluation 4 Bright Room Contrast | Comprehensive Evaluation |
|---|---|---|---|---|---|---|---|---|
| | | Sm | θa | Rz | | | | |
| Example 12 | Preparation Example 5.12 | 119 | 0.42 | 0.70 | ○ | ○ | ○ | ○ |
| Example 13 | Preparation Example 5.13 | 212 | 0.47 | 0.66 | ○ | ○ | ○ | ○ |
| Example 14 | Preparation Example 5.14 | 110 | 0.98 | 0.84 | ○ | ○ | ○ | ○ |
| Example 15 | Preparation Example 5.15 | 170 | 0.52 | 0.75 | ○ | ○ | ○ | ○ |
| Example 16 | Preparation Example 5.16 | 65 | 0.49 | 0.56 | ○ | ○ | ○ | ○ |
| Example 17 | Preparation Example 5.17 | 72 | 0.37 | 0.33 | ○ | ○ | ○ | ○ |
| Example 18 | Preparation Example 5.18 | 102 | 0.56 | 0.64 | ○ | ○ | ○ | ○ |
| Example 19 | Preparation Example 5.19 | 92 | 0.41 | 0.54 | ○ | ○ | ○ | ○ |
| Example 20 | Preparation Example 5.20 | 103 | 0.33 | 0.31 | ○ | ○ | ○ | ○ |
| Example 21 | Preparation Example 5.21 | 130 | 0.73 | 0.59 | ○ | ○ | ○ | ○ |
| Example 22 | Preparation Example 5.22 | 77 | 0.45 | 0.55 | ○ | ○ | ○ | ○ |
| Example 23 | Preparation Example 5.23 | 102.2 | 0.49 | 0.83 | ○ | ○ | ○ | ○ |
| Example 24 | Preparation Example 5.24 | 92.3 | 0.45 | 0.42 | ○ | ○ | ○ | ○ |
| Example 25 | Preparation Example 5.25 | 100 | 0.50 | 0.53 | ○ | ○ | ○ | ○ |
| Comparative Example 1 | Preparation Example 5.26 | 65.2 | 1.89 | 1.21 | X | ○ | X | X |
| Comparative Example 2 | Preparation Example 5.27 | 82.3 | 2.14 | 1.45 | X | ○ | X | X |
| Comparative Example 3 | Preparation Example 5.28 | 77 | 1.38 | 1.29 | X | ○ | X | X |
| Comparative Example 4 | Preparation Example 5.29 | 91 | 1.95 | 2.00 | X | ○ | X | X |
| Comparative Example 5 | Preparation Example 5.30 | 87 | 2.01 | 1.90 | X | ○ | X | X |
| Comparative Example 6 | Preparation Example 5.31 | 88 | 1.70 | 1.10 | X | ○ | X | X |
| Comparative Example 7 | Preparation Example 5.32 | 56 | 8.80 | 3.40 | X | ○ | X | X |
| Comparative Example 8 | Preparation Example 5.33 | 77 | 1.70 | 1.50 | X | ○ | X | X |
| Comparative Example 9 | Preparation Example 5.34 | 70 | 1.20 | 1.50 | X | ○ | X | X |
| Comparative Example 10 | Preparation Example 5.35 | 58 | 0.24 | 0.26 | ○ | X | X | X |
| Comparative Example 11 | Preparation Example 5.36 | 34 | 2.20 | 1.10 | X | ○ | X | X |
| Comparative Example 12 | Preparation Example 5.37 | 360 | 0.54 | 1.04 | ○ | X | X | X |
| Comparative Example 25 | — | 151 | 0.75 | 1.13 | X | ○ | X | X |
| Comparative Example 26 | — | 187 | 0.10 | 1.98 | X | ○ | X | X |
| Comparative Example 27 | — | 158 | 0.43 | 0.17 | ○ | X | ○ | X |
| Comparative Example 28 | — | 132 | 1.10 | 0.15 | ○ | X | ○ | X |
| Comparative Example 29 | — | 140 | 1.77 | 0.12 | ○ | X | ○ | X |
| Comparative Example 30 | — | 51 | 0.41 | 0.43 | X | ○ | X | X |
| Comparative Example 31 | — | 38 | 0.45 | 0.41 | X | ○ | X | X |
| Comparative Example 32 | — | 282 | 0.63 | 0.52 | ○ | X | ○ | X |
| Comparative Example 33 | — | 273 | 0.89 | 0.60 | ○ | X | ○ | X |
| Comparative Example 34 | — | 159 | 0.64 | 0.13 | ○ | X | ○ | X |
| Comparative Example 35 | — | 263 | 0.58 | 0.16 | ○ | X | ○ | X |

TABLE 1-continued

|  | Corresponding Preparation Example 5 | Evaluation 1 Surface Roughness | | | Evaluation 2 Glossy Black Feeling | Evaluation 3 Anti-reflection Performance | Evaluation 4 Bright Room Contrast | Comprehensive Evaluation |
| --- | --- | --- | --- | --- | --- | --- | --- | --- |
|  |  | Sm | θa | Rz |  |  |  |  |
| Comparative Example 36 | — | 67 | 0.22 | 0.84 | ○ | X | ○ | X |
| Comparative Example 37 | — | 236 | 0.62 | 0.20 | ○ | X | ○ | X |
| Comparative Example 38 | — | 88 | 1.41 | 0.87 | X | ○ | X | X |

TABLE 2

|  | Corresponding Preparation Example 5 | Evaluation 1 Surface Roughness | | | Evaluation 2 Glossy Black Feeling | Evaluation 3 Anti-reflection Performance | Evaluation 4 Bright Room Contrast | Comprehensive Evaluation |
| --- | --- | --- | --- | --- | --- | --- | --- | --- |
|  |  | Sm | θa | Rz |  |  |  |  |
| Example 26 | Preparation Example 5.1 | 155 | 0.38 | 0.51 | ○ | ○ | ◎ | ○ |
| Example 27 | Preparation Example 5.2 | 127.2 | 0.56 | 0.64 | ○ | ○ | ◎ | ○ |
| Example 28 | Preparation Example 5.3 | 100.8 | 0.44 | 0.58 | ○ | ○ | ◎ | ○ |
| Example 29 | Preparation Example 5.4 | 165 | 0.40 | 0.54 | ○ | ○ | ◎ | ○ |
| Example 30 | Preparation Example 5.5 | 161 | 0.65 | 0.72 | ○ | ○ | ◎ | ○ |
| Example 31 | Preparation Example 5.6 | 185 | 0.52 | 0.51 | ○ | ○ | ◎ | ○ |
| Example 32 | Preparation Example 5.7 | 187 | 0.54 | 0.39 | ○ | ○ | ◎ | ○ |
| Example 33 | Preparation Example 5.8 | 150 | 0.48 | 0.58 | ○ | ○ | ◎ | ○ |
| Example 34 | Preparation Example 5.9 | 143 | 0.70 | 0.77 | ○ | ○ | ◎ | ○ |
| Example 35 | Preparation Example 5.10 | 104.6 | 0.91 | 0.48 | ○ | ○ | ◎ | ○ |
| Example 36 | Preparation Example 5.11 | 106 | 0.96 | 0.98 | ○ | ○ | ◎ | ○ |
| Example 37 | Preparation Example 5.12 | 119 | 0.42 | 0.70 | ○ | ○ | ◎ | ○ |
| Example 38 | Preparation Example 5.13 | 212 | 0.47 | 0.66 | ○ | ○ | ◎ | ○ |
| Example 39 | Preparation Example 5.14 | 110 | 0.98 | 0.84 | ○ | ○ | ◎ | ○ |
| Example 40 | Preparation Example 5.15 | 170 | 0.52 | 0.75 | ○ | ○ | ◎ | ○ |
| Example 41 | Preparation Example 5.16 | 65 | 0.49 | 0.56 | ○ | ○ | ◎ | ○ |
| Example 42 | Preparation Example 5.17 | 72 | 0.37 | 0.33 | ○ | ○ | ◎ | ○ |
| Example 43 | Preparation Example 5.18 | 102 | 0.56 | 0.64 | ○ | ○ | ◎ | ○ |
| Example 44 | Preparation Example 5.19 | 92 | 0.41 | 0.54 | ○ | ○ | ◎ | ○ |
| Example 45 | Preparation Example 5.20 | 103 | 0.33 | 0.31 | ○ | ○ | ◎ | ○ |
| Example 46 | Preparation Example 5.21 | 130 | 0.73 | 0.59 | ○ | ○ | ◎ | ○ |
| Example 47 | Preparation Example 5.22 | 77 | 0.45 | 0.55 | ○ | ○ | ◎ | ○ |
| Example 48 | Preparation Example 5.23 | 102.2 | 0.49 | 0.83 | ○ | ○ | ◎ | ○ |
| Example 49 | Preparation Example 5.24 | 92.3 | 0.45 | 0.42 | ○ | ○ | ◎ | ○ |
| Example 50 | Preparation Example 5.25 | 100 | 0.50 | 0.53 | ○ | ○ | ◎ | ○ |
| Comparative Example 13 | Preparation Example 5.26 | 65.2 | 1.89 | 1.21 | X | ○ | ○ | X |
| Comparative Example 14 | Preparation Example 5.27 | 82.3 | 2.14 | 1.45 | X | ○ | ○ | X |

TABLE 2-continued

| | Corresponding Preparation Example 5 | Evaluation 1 Surface Roughness | | | Evaluation 2 Glossy Black Feeling | Evaluation 3 Anti-reflection Performance | Evaluation 4 Bright Room Contrast | Comprehensive Evaluation |
|---|---|---|---|---|---|---|---|---|
| | | Sm | θa | Rz | | | | |
| Comparative Example 15 | Preparation Example 5.28 | 77 | 1.38 | 1.29 | X | ○ | ○ | X |
| Comparative Example 16 | Preparation Example 5.29 | 91 | 1.95 | 2.00 | X | ○ | ○ | X |
| Comparative Example 17 | Preparation Example 5.30 | 87 | 2.01 | 1.90 | X | ○ | ○ | X |
| Comparative Example 18 | Preparation Example 5.31 | 88 | 1.70 | 1.10 | X | ○ | ○ | X |
| Comparative Example 19 | Preparation Example 5.32 | 56 | 8.80 | 3.40 | X | ○ | ○ | X |
| Comparative Example 20 | Preparation Example 5.33 | 77 | 1.70 | 1.50 | X | ○ | ○ | X |
| Comparative Example 21 | Preparation Example 5.34 | 70 | 1.20 | 1.50 | X | ○ | ○ | X |
| Comparative Example 22 | Preparation Example 5.35 | 58 | 0.24 | 0.26 | ○ | X | ◎ | X |
| Comparative Example 23 | Preparation Example 5.36 | 34 | 2.20 | 1.10 | X | ○ | ○ | X |
| Comparative Example 24 | Preparation Example 5.37 | 360 | 0.54 | 1.04 | ○ | X | ○ | X |
| Comparative Example 39 | — | 151 | 0.75 | 1.13 | X | ○ | ○ | X |
| Comparative Example 40 | — | 187 | 0.10 | 1.98 | X | ○ | ○ | X |
| Comparative Example 41 | — | 158 | 0.43 | 0.17 | ○ | X | ◎ | X |
| Comparative Example 42 | — | 132 | 1.10 | 0.15 | ○ | X | ◎ | X |
| Comparative Example 43 | — | 140 | 1.77 | 0.12 | ○ | X | ◎ | X |
| Comparative Example 44 | — | 51 | 0.41 | 0.43 | X | ○ | ○ | X |
| Comparative Example 45 | — | 38 | 0.45 | 0.41 | X | ○ | ○ | X |
| Comparative Example 46 | — | 282 | 0.63 | 0.52 | ○ | X | ◎ | ○ |
| Comparative Example 47 | — | 273 | 0.89 | 0.60 | ○ | X | ◎ | X |
| Comparative Example 48 | — | 159 | 0.64 | 0.13 | ○ | X | ◎ | X |
| Comparative Example 49 | — | 263 | 0.58 | 0.16 | ○ | X | ◎ | X |
| Comparative Example 50 | — | 67 | 0.22 | 0.84 | ○ | X | ◎ | X |
| Comparative Example 51 | — | 236 | 0.62 | 0.20 | ○ | X | ◎ | X |
| Comparative Example 52 | — | 88 | 1.41 | 0.87 | X | ○ | ○ | X |

FIG. 22 shows a graph of the relationship between two groups, one including "θa" and "Rz" and (versus) the other including "glossy black feeling" and "anti-reflection performance." It should be noted that the graph shows only the data of which "Sm" is within the allowable range. FIG. 23 shows a graph of the relationship between two groups, one including "Rz" and "Sm" and (versus) the other including "glossy black feeling" and "anti-reflection performance." It should be also noted that the graph shows only the data of which "θa" is within the allowable range. In FIGS. 22 and 23, "♦" represents the case where both of "glossy black feeling" and "anti-reflection performance" were good, ● represents the case where "glossy black feeling" was poor, and ▲ represents the case where "anti-reflection performance" was poor. It is clear from these graphs that the numerical ranges specified in the present invention, that is, "Sm" is from 60 μm or more and 250 μm or less, "θa" is from 0.3 degree or more and 1.0 degree or less, and "Rz" is from 0.3 μm or more and 1.0 μm or less, are ranges that are critical to achieve both of "glossy black feeling" and "anti-reflection performance."

Example 51

A front filter of the present invention shown in FIG. 8 was prepared by the following method.
(1) Preparation of Laminate (Transparent Electrical Conductor Layer/Primer Layer/PET Film)

At first, as a polyester film, a 100 μm-thick, colorless and transparent biaxially oriented polyethylene terephthalate (PET) film (product name: A4300; manufactured by: Toyobo Co., Ltd.) in the form of a continuous belt was taken.

A polyester resin primer layer was formed on one surface of the PET film. Then, a 0.1 μm-thick, nickel-chromium alloy layer and a 0.2 μm-thick copper layer (a part of an electrical conductor layer) were provided in sequence by the sputtering method to form a conductively treated layer. Next, a 2.0 µm-thick metal plating layer of copper was provided on the conductively treated layer by electrolytic plating in a copper sulfate bath.

Then, a blackened layer was formed on the electrical conductor layer (metal plating layer). More specifically, blackening treatment was carried out by, with the use of a nickel plate as an anode, immersing the laminated film in which the electrical conductor layer was formed on the polyester film in a plating bath containing a mixed aqueous solution of nickel ammonium sulfate solution, zinc sulfate solution and sodium thiocyanate solution for electrolytic plating to coat the whole exposed surface of the metal plating layer with a blackened layer comprising nickel-zinc alloy. Thus, a continuous-belt shaped laminate was obtained in which the electrical conductor layer (conductively treated layer, metal plating layer and blackened layer) was stacked on one surface of the PET film.

Then, etching was performed on the electrical conductor layer of the continuous-belt shaped laminate by the photolithography method to form a mesh area comprising opening parts and line parts, and a frame-shaped ground area on the peripheral part which surrounded all four sides of the mesh area, for every display unit to be equipped therewith.

In this etching, the continuous belt-shaped laminate underwent a series of processes from masking to etching thoroughly on a production line for producing shadow masks for color TV sets. That is, a photosensitive, negative-type etching resist was coated onto the whole surface of the electrical conductor layer of the laminate. Then, a mask having a negative pattern of a desired mesh pattern was placed in contact with the resist, exposed to light, developed, cured and baked to pattern a resist layer such that the resist layer remained on the area corresponding to the line part of the mesh, and no resist layer remained on the areas corresponding to the opening parts of the mesh. Thereafter, the electrical conductor layer (conductively treated layer and metal plating layer) was etched away with ferric chloride solution to form mesh openings, followed by washing with water, resist removal, cleaning and drying in sequence.

In the above pattern, the mesh shape of the mesh area was as follows: the openings were square; the width of the line forming the non-opening part of the mesh was µm; the pitch between the lines was 300 µm; the height of the lines was 2.3 µm; and the bias angle was 29 degrees, which is defined as an inferior angle with respect to the long side of a sheet cut into a rectangular shape. Also, said pattern was designed such that when a continuous belt-shaped composite filter was cut into a rectangular sheet for every display unit (for every single display) to be equipped with the filter, and when the rectangular sheet of the composite filter was attached to a PDP, the mesh area was allowed to have a part facing the image display area of the PDP and a 15 mm-width frame part with no opening was left as a ground area on all four sides of the peripheral part of the mesh area.

Thereafter, a continuous belt-shaped laminate constituting a transparent electrical conductor layer (laminated film in which the mesh-shaped electrical conductor layer was stacked on the PET film) was obtained.

(2) Preparation of Adhesive Layer (Ne Light Absorbing and Color Adjusting Layer)

Next, a Ne light absorbing layer and an adhesive layer mixed with a color adjusting dye were formed on the surface (PET film-side surface) of the continuous belt-shaped laminate obtained in (1), which was opposite to the surface having the mesh-shaped electrical conductor layer formed thereon.

As the adhesive for forming the adhesive layer, an acrylic adhesive (product name: LA2140; manufactured by: Kuraray Co., Ltd.) dissolved in a solvent of methyl ethyl ketone and toluene (compounding ratio=1:1 on mass basis) to a solid content of 20% (on mass basis) was used.

A Ne light absorbing porphyrin dye (product name: TAP-2; manufactured by: Yamada Chemical Co., Ltd.) of 0.009 part by weight and a color adjusting dye (product name: Plast red 8320; manufactured by: Arimoto Chemical Co., Ltd.) of 0.005 part by weight were respectively added to and thoroughly dispersed in the resultant acrylic adhesive solution, thereby preparing a coating solution.

The coating solution was coated onto the PET film-side surface, which was to be the back side of the laminate, with a die coater to a coated amount of 20 g/m². The coated laminate was dried in an oven, in which dry air with a wind speed of 5 m/sec was applied, at 100° C. for one minute to form an adhesive layer. A peelable release film was further adhered to the surface of the adhesive layer for protection.

(3) Preparation of Laminate [NIR Absorbing Layer/PET Film/Adhesive Layer]

A 38 µm-thick, colorless and transparent biaxially oriented polyethylene terephthalate (PET) film (product name: A4300; manufactured by: Toyobo Co., Ltd.) in the form of a continuous belt was taken.

Next, a polyester resin primer layer was formed on one surface of the PET film.

Then, a near-infrared absorbing coating solution was prepared such that an acrylic resin binder was dissolved in a solvent of methyl ethyl ketone and toluene (compounding ratio=1:1 on mass basis) to a solid content of 20% (on mass basis); and the following three NIR absorbing phthalocyanine dyes, EXCOLOR IR-10A of 0.04 part by weight, EXCOLOR 906B of 0.02 part by weight and EXCOLOR 910B of 0.04 part by weight (product names; manufactured by: Nippon Shokubai Co., Ltd.) were respectively added thereto and thoroughly dispersed to prepare a coating solution.

The coating solution was coated onto the polyester film-side primer layer with a die coater to a coated amount of 20 g/m². The coated laminate was dried in an oven, in which dry air with a wind speed of 5 m/sec was applied, at 100° C. for one minute to form a near-infrared absorbing layer.

Next, a colorless, transparent adhesive layer was formed on the surface of the polyester film, which was opposite to the surface on which the near-infrared absorbing layer was formed. As an adhesive, an acrylic adhesive (product name: LA2140; manufactured by: Kuraray Co., Ltd.) dissolved in a solvent of methyl ethyl ketone and toluene (compounding ratio=1:1 on mass basis) to a solid content of 20% (on mass basis) was used.

The adhesive coating solution was coated onto the film-side coated surface with a die coater to a coated amount of 20 g/m². The coated laminate was dried in an oven, in which dry air with a wind speed of 5 m/sec was applied, at 100° C. for one minute to form an adhesive layer. A peelable release film was further adhered to the surface of the adhesive layer for protection.

Thereafter, a laminate [NIR absorbing layer/PET film/adhesive layer] was obtained.

(4) Preparation of Laminate [Anti-Glare Layer/PET Film/Adhesive Layer (Ultraviolet Absorbing Layer)]

A colorless, transparent adhesive layer was formed on the polyester film side of the anti-glare optical laminate obtained in Preparation Example 5.1. As an adhesive coating solution, a mixture of an acrylic adhesive (product name: LA2140; manufactured by: Kuraray Co., Ltd.) dissolved in a solvent of methyl ethyl ketone and toluene (compounding ratio=1:1 on mass basis) to a solid content of 20% (on mass basis) with a (benzotriazole-based) ultraviolet absorbing agent of 1 percent by mass was used.

The adhesive coating solution was coated onto the polyester film-side coated surface of the anti-glare laminate with a die coater to a coated amount of 20 g/m². The coated laminate was dried in an oven, in which dry air with a wind speed of 5 m/sec was applied, at 100° C. for one minute to form an adhesive layer (ultraviolet absorbing layer). A peelable release film was further adhered to the surface of the adhesive layer for protection.

Thereafter, a laminate [anti-glare layer/PET film/adhesive layer (ultraviolet absorbing layer)] was obtained.

(5) Stacking of Laminates for Forming Composite Laminate

The laminates prepared above were stacked to form a composite laminate.

At first, the release film was removed from the back side of the laminate prepared in (4). The adhesive layer (ultraviolet absorbing layer) thus exposed was adhered to the near-infrared absorbing layer of the laminate prepared in (3) and pressed between a pair of rollers to form a laminate comprising [anti-glare layer/PET film/adhesive layer (ultraviolet absorbing layer)/NIR absorbing layer/PET film/adhesive layer].

Then, the release film was removed from the surface of the adhesive layer of the resultant laminate. The adhesive layer thus exposed was adhered to the transparent electrical conductor layer of the laminate prepared in (1) and pressed between a pair of rollers to form a laminate comprising [anti-glare layer/PET film/adhesive layer (ultraviolet absorbing layer)/NIR absorbing layer/PET film/adhesive layer/transparent electrical conductor layer/primer layer/PET film/adhesive layer (Ne light absorbing and color adjusting layer)], thereby obtaining a front filter of Example 51.

Example 52

A front filter of the present invention shown in FIG. 10 was prepared by the following method.
(1) Preparation of Polyester Film As a transparent resin substrate film, a 100 μm-thick, colorless and transparent biaxially oriented polyethylene terephthalate (PET) film (product name: A4300; manufactured by: Toyobo Co., Ltd.) in the form of a continuous belt was taken. The substrate film was a film comprising an ultraviolet absorbing agent and capable of functioning also as an ultraviolet absorbing layer.
(2) Preparation of Ne Light Absorbing and NIR Absorbing Layer A coating solution was prepared such that the following three NIR absorbing phthalocyanine dyes, EXCOLOR IR-10A of 0.04 part by weight, EXCOLOR 906B of 0.02 part by weight and EXCOLOR 910B of 0.04 part by weight (product names; manufactured by: Nippon Shokubai Co., Ltd.) and a Ne light absorbing porphyrin dye (product name: TAP-2; manufactured by: Yamada Chemical Co., Ltd.) of 0.009 part by weight were respectively added to and thoroughly dispersed in an acrylic resin solution prepared by dissolving an acrylic resin binder (glass transition temperature: 130° C., hydroxyl value: 0) in a solvent of methyl ethyl ketone and toluene (compounding ratio=1:1 on mass basis) to a solid content of 20% (on mass basis).

The coating solution was coated onto the PET film obtained in (1) with a die coater to a coated amount of 20 g/m². The coated film was dried in an oven, in which dry air with a wind speed of 5 m/sec was applied, at 100° C. for one minute to cure, thereby forming a layer capable of functioning not only as a Ne light absorbing layer but also as a NIR absorbing layer.

Thereafter, a laminate comprising [UV absorbing layer (PET film)/Ne light absorbing and NIR absorbing layer] was obtained.
(3) Preparation of Anti-Glare Layer In the same manner as in Preparation Example 5.1, a layer corresponding to the anti-glare layer of the anti-glare optical laminate obtained in Preparation Example 5.1 was formed on the PET film-side surface of the laminate obtained in (2).

Thereafter, a front filter of Example 52 was obtained, comprising [anti-glare layer/UV absorbing layer (PET film)/Ne light absorbing and NIR absorbing layer].

Example 53

A front filter of the present invention shown in FIG. 11 was prepared by the following method.
(1) Preparation of Laminate [UV Absorbing Layer (PET Film)/Primer Layer/Transparent Electrical Conductor Layer]

A continuous belt-shaped laminate constituting a transparent electrical conductor layer (laminated film in which the mesh-shaped electrical conductor layer was stacked on the PET film) was obtained in the same manner as in "(1) Preparation of transparent electrical conductor layer" in Example 51, except that as a transparent resin substrate film, a 100 μm-thick, colorless and transparent biaxially oriented polyethylene terephthalate (PET) film (product name: A4300; manufactured by: Toyobo Co., Ltd.) in the form of a continuous belt was taken in place of a 100 μm-thick, colorless and transparent PET film (product name: A4300; manufactured by: Toyobo Co., Ltd.) in the form of a continuous belt. The substrate film was a film comprising an ultraviolet absorbing agent and capable of functioning also as an ultraviolet absorbing layer.
(2) Preparation of Ne Light Absorbing, NIR Absorbing and Color Adjusting Layer A coating solution was prepared such that the following three NIR absorbing phthalocyanine dyes, EXCOLOR IR-10A of 0.04 part by weight, EXCOLOR 906B of 0.02 part by weight and EXCOLOR 910B of 0.04 part by weight (product names; manufactured by: Nippon Shokubai Co., Ltd.), a Ne light absorbing porphyrin dye (product name: TAP-2; manufactured by: Yamada Chemical Co., Ltd.) of 0.009 part by weight and a color adjusting dye (product name: Plast red 8320; manufactured by: Arimoto Chemical Co., Ltd.) of 0.005 part by weight were respectively added to and thoroughly dispersed in an acrylic resin solution prepared by dissolving an acrylic resin binder (glass transition temperature: 130° C., hydroxyl value: 0) in a solvent of methyl ethyl ketone and toluene (compounding ratio=1:1 on mass basis) to a solid content of 20% (on mass basis).

The coating solution was coated onto the transparent electrical conductor layer of the laminate with a die coater to a coated amount of 20 g/m². The coated laminate was dried in an oven, in which dry air with a wind speed of 5 m/sec was applied, at 100° C. for one minute to cure, thereby forming a layer capable of functioning also as a Ne light absorbing, NIR absorbing and color adjusting layer.

Thereafter, a laminate comprising [UV absorbing layer (PET film)/primer layer/transparent electrical conductor layer/Ne light absorbing, NIR absorbing and color adjusting layer] was obtained.

(3) Laminate [Anti-Glare Layer/Pet Film/Adhesive Layer]

A laminate comprising [anti-glare layer/PET film/adhesive layer] was obtained in the same manner as in (4) in Example 51, except that no ultraviolet absorbing agent was added to the adhesive layer.

(4) Stacking of Laminates for Forming Composite Laminate

The laminates prepared above were stacked to form a composite laminate.

At first, a 5 mm-thick, colorless and transparent glass plate was taken.

Then, the release film was removed from the back side of the laminate prepared in (3). The adhesive layer thus exposed was adhered to one surface of the glass plate and pressed between a pair of rollers to form a laminate.

Next, via an adhesive layer having a coated amount of 20 g/m$^2$, the laminate prepared in (2) was adhered to the other surface of the glass plate (having no anti-glare layer thereon) of the resultant laminate so that the polyester film of the laminate obtained in (2) was faced to the glass plate, and was pressed between a pair of rollers to form a laminate.

Thereafter, a laminate comprising [anti-glare layer/PET film/adhesive layer/glass plate/adhesive layer/UV absorbing layer (polyester film)/primer layer/transparent electrical conductor layer/Ne light absorbing, NIR absorbing and color adjusting layer] was formed, thereby obtaining a front filter of Example 53.

Example 54

A front filter of the present invention as shown in FIG. 12 was prepared by the following method.

(1) Preparation of Anti-Glare Layer

An anti-glare layer was formed on a 100 μm-thick, colorless and transparent biaxially oriented polyethylene terephthalate (PET) film (product name: A4300; manufactured by: Toyobo Co., Ltd.) in the form of a continuous belt. More specifically, at first, 70 parts by mass of pentaerythritol triacrylate (manufactured by: Nippon Kayaku Co., Ltd., refractive index: 1.51) as an ultraviolet curing resin, 30 parts by mass of isocyanuric acid EO-modified diacrylate (manufactured by: TOAGOSEI Co., Ltd., refractive index: 1.51) as an ultraviolet curing resin, 10.0 parts by mass of an acrylic polymer (manufactured by: Mitsubishi Rayon Co., Ltd., molecular weight: 75,000), and 5.0 parts by mass of Irgacure 184 (product name; manufactured by: Ciba-Geigy Ltd.) as a photocuring initiator, were mixed thoroughly to prepare an ultraviolet curing resin. Further, 15.0 parts by mass of styrene beads (manufactured by: Soken Chemical & Engineering Co., Ltd., particle diameter: 3.5 μm, refractive index: 1.60) as light transparent fine particles, 0.01 part by mass of a leveling agent "10-28" (product name; manufactured by: The Inctec Inc), 127.5 parts by mass of toluene and 54.6 parts by mass of cyclohexanone were added to the ultraviolet curing resin and thoroughly mixed to prepare a coating solution. The coating solution was filtered through a polypropylene filter having a pore diameter of 30 μm to prepare a coating solution for forming an anti-glare layer. Next, the coating solution for forming an anti-glare layer was coated onto a surface of the PET film to a thickness of 7 μm and heat dried in an oven at 50° C. Thereafter, under a N$_2$ atmosphere, ultraviolet light was applied to the coated film from a light source (H-bulb of an UV irradiation apparatus manufactured by: Fusion UV Systems Japan KK). (total applied light: 200 mJ) to cure the coating, thereby forming an anti-glare layer.

(2) Preparation of Electromagnetic Shielding Sheet

As a transparent resin substrate, a 100 μm-thick, colorless and transparent biaxially oriented polyethylene terephthalate (PET) film (product name: A4300; manufactured by: Toyobo Co., Ltd.) in the form of a continuous belt was taken. Next, a blackened layer comprising a nickel, copper and oxygen-containing alloy (Ni—Cu—O blackened layer) was formed on a surface of the PET film by the vacuum sputtering method. Copper was vapor-deposited thereon to form an electrical conductor layer. The sheet had a surface resistivity of 0.01Ω/☐.

Then, etching was performed on the electrical conductor layer and blackened layer of the laminate by the photolithography method to form a conductive mesh layer having a transparent electrical conductor layer comprising a mesh area comprising opening parts and line parts, which were formed in accordance with the image display area of a PDP to be used, and a frame-shaped, non-meshed ground area on the peripheral part which surrounded all four sides of the mesh area. The mesh shape had square openings forming a square grid. The line width was 10 μm, and the opening width of the openings (the length of the side of the square) was 290 μm. One rectangular area containing the mesh shape corresponded to one screen of a PDP. Plurality of such rectangular mesh areas were continuously aligned 30 mm apart in a row. A 15 mm-width margin was formed on the both sides of the line of the mesh areas. The width of the ground area on the peripheral part was 15 mm.

In the etching, more specifically, the laminate underwent a series of processes from resist formation, masking to etching thoroughly on a production line for producing shadow masks for color TV sets. That is, a photosensitive etching resist was coated onto the whole surface of the transparent electrical conductor layer of the laminate. Then, a mask having a desired mesh pattern was placed in contact with the resist, exposed to light, developed, cured and baked to pattern a resist layer such that the resist layer remained on the area corresponding to the line parts of the mesh, and no resist layer remained on the areas corresponding to the opening parts. Thereafter, the electrical conductor layer and blackened layer on the areas where no resist layer was formed were etched away with ferric chloride solution to form mesh openings, followed by washing with water, resist removal, cleaning and drying in sequence.

(3) Preparation of Laminate [Anti-Glare Layer/PET Film/Adhesive Layer Comprising Neon Light Absorbing Agent and Color Correction Dye/Electromagnetic Shielding Sheet]

The sheet comprising the anti-glare layer obtained in (1) was adhered to the electromagnetic shielding sheet obtained in (2) with an adhesive comprising the neon light absorbing agent and color adjusting dye (color correction dye).

A curing agent (product name: E-5XM; manufactured by: Soken Chemical & Engineering Co., Ltd.) of 0.25 part by weight, a neon light absorbing agent (product name: TAP-2, a tetraazaporphyrin dye; manufactured by: Yamada Chemical Co., Ltd.) of 0.045 part by weight and a color correction dye (product name: KAYASET RED A2G; manufactured by: Nippon Kayaku Co., Ltd.) of 0.3 part by weight were respectively added to and thoroughly dispersed in an acrylic adhesive (product name: SK-Dyne 2094; manufactured by: Soken Chemical & Engineering Co., Ltd.) of 100 parts by weight to prepare a composition for an adhesive layer.

The adhesive composition was coated onto the PET film surface of the anti-glare layer with a die coater so as to have a thickness of 25 μm when dried. The coated film was dried in an oven, in which dry air with a wind speed of 5 m/sec was applied, at 100° C. for one minute to form an adhesive layer. The PET film surface of the electromagnetic shielding sheet was adhered to the adhesive layer, thereby preparing a laminate.

(4) Preparation of Laminate [Anti-Glare Layer/PET Film/Adhesive Layer Comprising Neon Light Absorbing Agent and Color Correction Dye/Electromagnetic Shielding Sheet/Adhesive Layer Comprising Near-Infrared Absorbing Agent/Glass Plate]

The laminate obtained in (3) was adhered to a glass plate with an adhesive comprising a near-infrared absorbing agent.

A curing agent (product name: E-5XM; manufactured by: Soken Chemical & Engineering Co., Ltd.) of 0.25 part by weight and a suspension containing 18.5% by weight of cesium-containing tungsten oxide ($Cs_{0.33}WO_3$) (product name: YMF-02, average dispersed particle diameter: 800 nm or less; manufactured by: Sumitomo Metal Mining Co., Ltd.) of 11.32 parts by weight were respectively added to and thoroughly dispersed in an acrylic adhesive (product name: SK-Dyne 2094; manufactured by: Soken Chemical & Engineering Co., Ltd.) of 100 parts by weight to prepare a composition for an adhesive layer.

Next, the composition for an adhesive layer was coated onto the mesh surface of the laminate obtained in (3), which was the transparent electrical conductor layer of the electromagnetic shielding sheet of the laminate obtained in (3), with a die coater so as to have a thickness of 25 µm when dried. The coated laminate was dried in an oven, in which dry air with a wind speed of 5 m/sec was applied, at 100° C. for one minute to form an adhesive layer. The laminate was cut to the same size as a soda glass plate and adhered to the glass plate with a sheet-fed laminator, thereby preparing a glass front filter for PDPs.

Example 55

A front filter of the present invention shown in FIG. 13 was prepared by the following method.
(1) Preparation of Electromagnetic Shielding Sheet An electromagnetic shielding sheet was prepared in the same manner as in Example 54.
(2) Preparation of Laminate [Anti-Glare Layer/PET Film/Transparent Electrical Conductor Layer]

An anti-glare layer was formed on the surface of the PET film in the electromagnetic shielding sheet obtained in (1), which was opposite to the surface on which the transparent electrical conductor layer was stacked. The conditions for preparing the anti-glare layer were the same as in Example 54.
(3) Laminate [Anti-Glare Layer/PET Film/Transparent Electrical Conductor Layer/Adhesive Layer Comprising Near-Infrared Absorbing Agent, Neon Light Absorbing Agent and Color Correction Dye]

Next, an adhesive layer comprising various photo absorbers was formed on the conductive mesh layer-side surface of the electromagnetic shielding sheet having the anti-glare layer formed thereon. A curing agent (product name: E-5XM; manufactured by: Soken Chemical & Engineering Co., Ltd.) of 0.25 part by weight, a suspension containing 18.5% by weight of cesium-containing tungsten oxide ($Cs_{0.33}WO_3$) (product name: YMF-02, average dispersed particle diameter: 800 nm or less; manufactured by: Sumitomo Metal Mining Co., Ltd.) of 11.32 parts by weight, a neon light absorbing agent (product name: TAP-2, a tetraazaporphyrin dye; manufactured by: Yamada Chemical Co., Ltd.) of 0.045 part by weight and a color correction dye (product name: KAYASET RED A2G; manufactured by: Nippon Kayaku Co., Ltd.) of 0.3 part by weight were respectively added to and thoroughly dispersed in an acrylic adhesive (product name: SK-Dyne 2094; manufactured by: Soken Chemical & Engineering Co., Ltd.) of 100 parts by weight to prepare a composition for an adhesive layer.

Then, the composition for an adhesive layer was coated onto the conductive mesh layer-side surface of the laminate with a die coater so as to have a thickness of 25 µm when dried. The coated laminate was dried in an oven, in which dry air with a wind speed of 5 m/sec was applied, at 100° C. for one minute to form an adhesive layer, thereby obtaining a composite filter in the form of a continuous belt. A peelable release film was further adhered to the surface of the adhesive layer for protection.
(4) Laminate [Anti-Glare Layer/PET Film/Transparent Electrical Conductor Layer/Adhesive Layer Comprising Near-Infrared Absorbing Agent, Neon Light Absorbing Agent and Color Correction Dye/Glass Plate]

The laminate obtained in (3) was cut to the same size as a soda glass plate. The release film on the surface of the adhesive layer was removed, and the laminate was adhered to a surface of the glass plate, thereby preparing a glass front filter for PDPs.

Example 56

A front filter of the present invention shown in FIG. 7 was prepared by the following method.
(1) Preparation of Anti-Glare Layer In the same manner as in Example 54, an anti-glare layer was formed on a 100 µm-thick, colorless and transparent biaxially oriented polyethylene terephthalate (PET) film (product name: A4300; manufactured by: Toyobo Co., Ltd.) in the form of continuous belt.
(2) Preparation of Laminate [Anti-Glare Layer/PET Film/Adhesive Layer Comprising Near-Infrared Absorbing Agent]

A curing agent (product name: E-5XM; manufactured by: Soken Chemical & Engineering Co., Ltd.) of 0.25 part by weight and a suspension containing 18.5% by weight of cesium-containing tungsten oxide ($Cs_{0.33}WO_3$) (product name: YMF-02, average dispersed particle diameter: 800 nm or less; manufactured by: Sumitomo Metal Mining Co., Ltd.) of 11.32 parts by weight were respectively added to and thoroughly dispersed in an acrylic adhesive (product name: SK-Dyne 2094; manufactured by: Soken Chemical & Engineering Co., Ltd.) of 100 parts by weight to prepare a composition for an adhesive layer.

Next, the composition for an adhesive layer was coated onto the surface of the PET film, which was opposite to the surface on which the anti-glare layer was stacked, with a die coater so as to have a thickness of 25 µm when dried. The coated film was dried in an oven, in which dry air with a wind speed of 5 m/sec was applied, at 100° C. for one minute to form an adhesive layer. A peelable release film was further adhered to the surface of the adhesive layer for protection.

Example 57

A front filter of the present invention shown in FIG. 15 was prepared by the following method.
(1) Preparation of Anti-Glare Layer In the same manner as in Example 54, an anti-glare layer was formed on a 100 µm-thick, colorless and transparent biaxially oriented polyethylene terephthalate (PET) film (product name: A4300; manufactured by: Toyobo Co., Ltd.) in the form of a continuous belt.

(2) Preparation of Laminate [Anti-Glare Layer/PET Film/ Neon Light Absorbing and Color Adjusting Layer]

First, a resin having an acid value of 1 was prepared by mixing a binder resin containing an alicyclic hydrocarbon group (product name: OPTOREZ OZ-1100, acid value: 0; manufactured by: Hitachi Chemical Co., Ltd.) with an acrylic resin (product name: DIANAL BR-83, acid value: 2; manufactured by: Mitsubishi Rayon Co., Ltd.) at a ratio of 1:1. The resin was dissolved in a solvent of methyl ethyl ketone and toluene (compounding ratio=1:1) to a solid content of 20% (on mass basis) to prepare a resin solution. A cyanine dye having an absorption maximum wavelength in the range from 550 to 64.0 nm (product name: TY102; manufactured by: Asahi Denka Co., Ltd.) and a color correction dye (product name: KAYASET RED A2G; manufactured by: Nippon Kayaku Co., Ltd.) were added to the resin solution to prepare an ink. The resin was coated onto the surface of transparent resin substrate by die coating so as to have a thickness of 10 µm when dried. The coating was dried in an oven, in which dry air with a wind speed of 5 m/sec was applied, at 100° C. for one minute to form a neon light absorbing and color adjusting layer.

(3) Preparation of Electromagnetic Shielding Sheet

As a transparent resin substrate, a 100 µm-thick, colorless and transparent biaxially oriented polyethylene terephthalate (PET) film (product name: A4300; manufactured by: Toyobo Co., Ltd.) in the form of a continuous belt was taken. An electromagnetic shielding sheet was prepared in the same manner as in Example 56 except that a 10 µm-thick copper foil (product name: B2X-WS; manufactured by: Furukawa Circuit Foil Co., Ltd.) having one blackened surface was prepared and continuously dry laminated to the substrate with a two-component curing type polyurethane resin adhesive (comprising Takelac A310 (main agent, Tg: 20° C.), Takenate A10 (curing agent) and ethyl acetate at a compounding ratio of 12:1:21 on mass basis; manufactured by Takeda Pharmaceutical Company Limited; even in the following examples, parts and compounding ratios are by mass) so as to make the blackened surface outside.

(4) Preparation of Laminate [Transparent Electrical Conductor Layer/PET Film/Adhesive Layer Comprising Near-Infrared Absorbing Agent]

Next, an adhesive layer comprising a near-infrared absorbing agent was formed on a the PET film surface of the electromagnetic shielding sheet obtained in (3). A curing agent (product name: E-5XM; manufactured by: Soken Chemical & Engineering Co., Ltd.) of 0.25 part by weight and a suspension containing 18.5% by weight of cesium-containing tungsten oxide ($Cs_{0.33}WO_3$) (product name: YMF-02, average dispersed particle diameter: 800 nm or less; manufactured by: Sumitomo Metal Mining Co., Ltd.) of 11.32 parts by weight were respectively added to and thoroughly dispersed in an acrylic adhesive (product name: SK-Dyne 2094; manufactured by: Soken Chemical & Engineering Co., Ltd.) of 100 parts by weight to prepare a composition for an adhesive layer.

Then, the composition for an adhesive layer was coated onto the PET film-side surface of the laminate with a die coater so as to have a thickness of 25 µm when dried. The coated laminate was dried in an oven, in which dry air with a wind speed of 5 m/sec was applied, at 100° C. for one minute to form an adhesive layer, thereby obtaining a composite filter in the form of a continuous belt. A peelable release film was further adhered to the surface of the adhesive layer for protection.

(5) Laminate [Transparent Electrical Conductor Layer/PET Film/Adhesive Layer Comprising Near-Infrared Absorbing Agent/Glass Plate]

The laminate obtained in (4) was cut to the same size as a soda glass plate. The release film on the surface of the adhesive layer was removed, and the laminate was adhered to a surface of the glass plate.

(6) Laminate [Anti-Glare Layer/PET Film/Neon Light Absorbing and Color Adjusting Layer/Adhesive Layer/ Transparent Electrical Conductor Layer/PET Film/Adhesive Layer Comprising Near-Infrared Absorbing Agent/Glass Plate]

An adhesive (product name: TU-41A; manufactured by: Tomoegawa Co., Ltd.) was laminated onto the surface of the laminate obtained in (2), on which the neon light absorbing and color adjusting layer was provided, and adhered to the conductive mesh surface of the electromagnetic shielding sheet on the glass plate. Air bubbles trapped in concavoconvexes of the conductive mesh layer were eliminated by a heat and pressure treatment (at 70° C. for 30 minutes under a pressure of 0.5 MPa), thereby preparing a glass front filter for PDPs.

Example 58

A front filter of the present invention as shown in FIG. 14 was prepared by the following method.

A glass front filter for PDPs was prepared in the same manner as in Example 57 except that the following three NIR absorbing phthalocyanine dyes, EXCOLOR EXCOLOR IR-14 and EXCOLOR 910B (product names; manufactured by: Nippon Shokubai Co., Ltd.) were used for the composition for an adhesive layer of Example 55 instead of using cesium-containing tungsten oxide as a near-infrared absorbing agent, and 0.01 part by weight of a benzotriazole ultraviolet absorbing agent was further added. The amount of the NIR absorbing phthalocyanine dyes were 0.157 part by weight (EXCOLOR IR-12), 0.112 part by weight (EXCOLOR IR-14) and 0.220 part by weight (EXCOLOR 910B). The dyes were respectively added and thoroughly dispersed to prepare the composition for an adhesive layer.

Example 59

A front filter of the present invention shown in FIG. 12 was prepared by the following method.

A glass front filter for PDPs was prepared in the same manner as in Example 54 except that the electromagnetic shielding sheet of Example 54(2) was prepared as follows.

(2) Preparation of Electromagnetic Shielding Sheet

As a transparent resin substrate, a 100 µm-thick, colorless and transparent biaxially oriented polyethylene terephthalate (PET) film (product name: A4300; manufactured by: Toyobo Co., Ltd.) in the form of a continuous belt was taken. A silver paste (product name: FA-333; manufactured by: Fujikura Kasei Co., Ltd.) was used as a conductive ink to form a mesh (line width: 30 µm, pitch: 300 µm) on the transparent resin substrate by silk printing. The mesh was dried in an oven, in which dry air with a wind speed of 5 m/sec was applied, at 100° C. for one minute to prepare an electromagnetic shielding sheet.

The invention claimed is:
1. A front filter for a plasma display comprising:
an anti-glare layer having a concavo-convex shape on an outermost surface thereof;
a polyester film; and
a functional layer,
wherein the anti-glare layer is disposed on an observer-side surface of the front filter;

wherein the concavo-convex shape satisfies the following requirements:

"Sm" is from 60 μm or more and 250 μm or less;
"θa" is from 0.3 degree or more and 1.0 degree or less; and
"Rz" is from 0.3 μm or more and 1.0 μm or less,
wherein "Sm" represents an average distance between concavoconvexes in the anti-glare layer; "θa" represents an average inclination angle of the concavoconvexes; and "Rz" represents a ten-point average roughness of the concavoconvexes.

2. The front filter for a plasma display according to claim 1, wherein the anti-glare layer comprises a concavo-convex layer comprising a resin mixed with light transparent fine particles.

3. The front filter for a plasma display according to claim 1, wherein the anti-glare layer comprises a single layer of concavo-convex layer or has a laminated structure comprising two or more layers including a concavo-convex layer and a surface shape modifying layer disposed on the observer's side of the concavo-convex layer.

4. The front filter for a plasma display according to claim 1, wherein the anti-glare layer has a laminated structure comprising two or more layers including a concavo-convex layer which comprises a resin mixed with light transparent fine particles and a surface shape modifying layer disposed on the observer's side of the concavo-convex layer, and
wherein the surface shape modifying layer decreases "θa" and/or "Rz" of concavoconvexes on the surface of the concavo-convex layer, without changing "Sm" of the concavoconvexes.

5. The front filter for a plasma display according to claim 1, wherein the anti-glare layer has a laminated structure comprising two or more layers including a concavo-convex layer and a low refractive index layer disposed on an observer-side outermost surface of the concavo-convex layer.

6. The front filter for a plasma display according to claim 3, wherein the surface shape modifying layer comprises one or more kinds of function additional components selected from the group consisting of an anti-static agent, a reflective index modifier, an anti-fouling agent and a hardness modifier.

7. The front filter for a plasma display according to claim 1, wherein a thickness of the anti-glare layer is from 5 μm or more and 25 μm or less.

8. The front filter for a plasma display according to claim 1, wherein a thickness of the polyester film is from 20 to 250 μm.

9. The front filter for a plasma display according to claim 1, comprising at least a transparent electrical conductor layer as the functional layer.

10. The front filter for a plasma display according to claim 9, wherein the transparent electrical conductor layer comprises a mesh-shaped metal electrical conductor layer and a blackened layer formed on the observer's side thereof.

11. The front filter for a plasma display according to claim 9, wherein the transparent electrical conductor layer comprises a mesh-shaped electrical conductor layer formed with a conductive black ink comprising a resin binder having dispersed therein electrical conductor particles and a black pigment.

12. A plasma display having disposed on a display surface thereof the front filter for a plasma display according to claim 1.

* * * * *